(12) United States Patent
Eguchi et al.

(10) Patent No.: US 6,917,076 B2
(45) Date of Patent: Jul. 12, 2005

(54) SEMICONDUCTOR DEVICE, A METHOD OF MANUFACTURING THE SEMICONDUCTOR DEVICE AND A METHOD OF DELETING INFORMATION FROM THE SEMICONDUCTOR DEVICE

(75) Inventors: Kohei Eguchi, Tokyo (JP); Yuichi Egawa, Tokyo (JP); Shoichi Iwasa, Tokyo (JP); Hideki Fujikake, Tokyo (JP); Wataru Yokozeki, Tokyo (JP); Tatsuya Kawamata, Tokyo (JP)

(73) Assignee: United Microelectronics Corporation (TW)

( * ) Notice: Subject to any disclaimer, the term of this patent is extended or adjusted under 35 U.S.C. 154(b) by 0 days.

(21) Appl. No.: 10/630,833

(22) Filed: Jul. 31, 2003

(65) Prior Publication Data

US 2004/0021160 A1 Feb. 5, 2004

Related U.S. Application Data

(62) Division of application No. 09/379,802, filed on Aug. 24, 1999, now Pat. No. 6,657,229, which is a division of application No. 08/864,796, filed on May 28, 1997, now abandoned.

(30) Foreign Application Priority Data

| May 28, 1996 | (JP) | ............................................. 8-156266 |
| Jul. 5, 1996 | (JP) | ............................................. 8-195437 |
| Oct. 15, 1996 | (JP) | ............................................. 8-293369 |
| Jan. 17, 1997 | (JP) | ............................................. 9-19860 |
| May 9, 1997 | (JP) | ............................................. 9-119884 |

(51) Int. Cl.[7] ........................ H01L 29/76; H01L 29/94; H01L 31/062; H01L 31/113; H01L 31/119
(52) U.S. Cl. ....................... 257/340; 257/394; 257/409; 257/488; 257/630
(58) Field of Search ............................... 257/340, 394, 257/409, 488, 630

(56) References Cited

U.S. PATENT DOCUMENTS 5,094,965 A    3/1992  Ozaki et al.
5,292,683 A    3/1994  Dennison et al.
5,397,908 A    3/1995  Dennison et al.
5,420,462 A    5/1995  Sudo
5,422,289 A    6/1995  Pierce
5,593,919 A    1/1997  Lee et al.
5,733,812 A    3/1998  Ueda et al.

FOREIGN PATENT DOCUMENTS

| JP | 62-102543 | 5/1987 |
| JP | 01-114041 | 5/1989 |
| JP | 04-062874 | 2/1992 |
| JP | 05-129621 | 5/1993 |
| JP | 05-335586 | 12/1993 |
| JP | 06-013606 | 1/1994 |
| JP | 06/021054 | 1/1994 |
| JP | 06-021473 | 1/1994 |
| JP | 06-069352 | 3/1994 |
| JP | 06-349826 | 12/1994 |
| JP | 08-017831 | 1/1996 |
| JP | 08-070120 | 3/1996 |

*Primary Examiner*—Thien F Tran
(74) *Attorney, Agent, or Firm*—Connolly Bove Lodge & Hutz LLP; Larry J. Hume

(57) ABSTRACT

A semiconductor device and a method for manufacturing the same and method for deleting information in use of the semiconductor device, in which field shield isolation or a trench type isolation between elements is used with suppression of penetration of field oxide into element active region of the device, that is, a defect involved in conventional LOCOS type process, are disclosed. A non-LOCOS insulating device isolation block is formed in a semiconductor substrate. The non-LOCOS insulating device isolation block uses a field shield element isolation structure or trench type element isolation structure. After gate electrode wiring layers are formed in a field region and an active region to the same level, a pad polysilicon film formed on the entire surface to cover the patterns of these gate electrode wiring layers is polished by chemical mechanical polishing (CMP) using the cap insulating films of the gate electrode wiring layers as stoppers, thereby forming the gate electrode wiring layers into separated patterns. With this arrangement, even when the width of the gate electrode wiring layer is reduced to the exposure limit in photolithography, the pad polysilicon film can be separated and patterned.

16 Claims, 49 Drawing Sheets

F I G. 2C
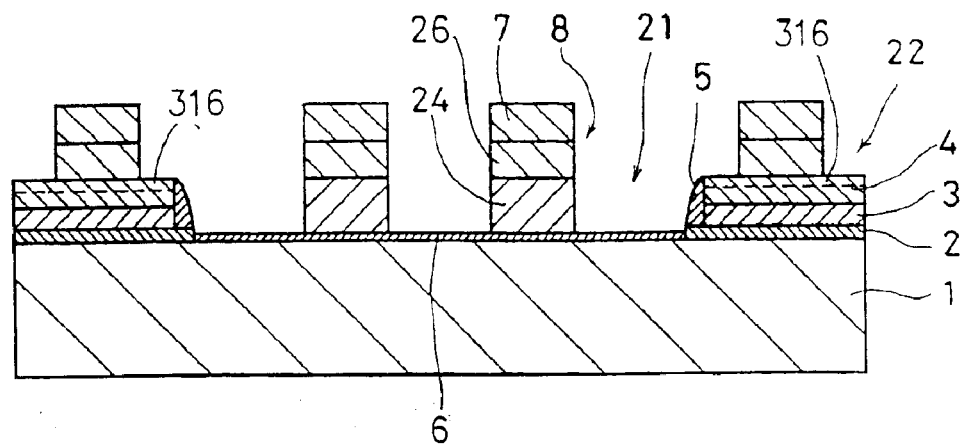
F I G. 2D
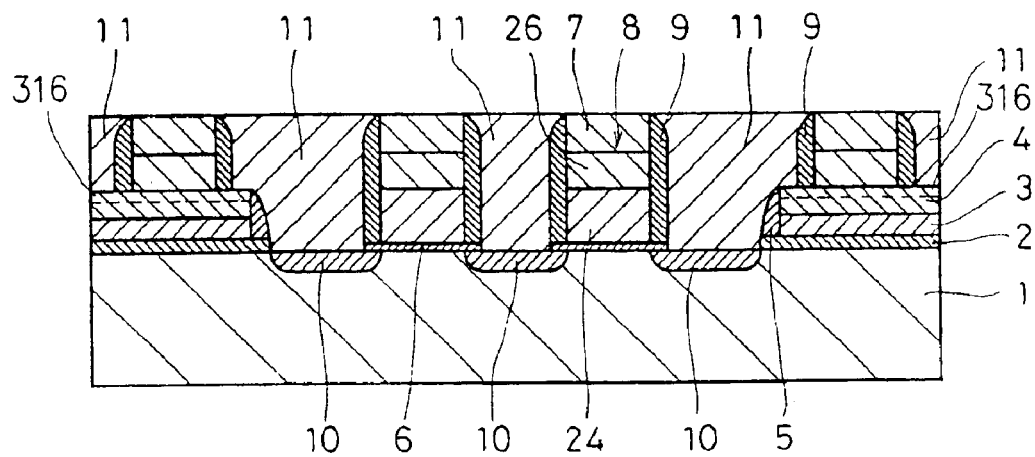
F I G. 3
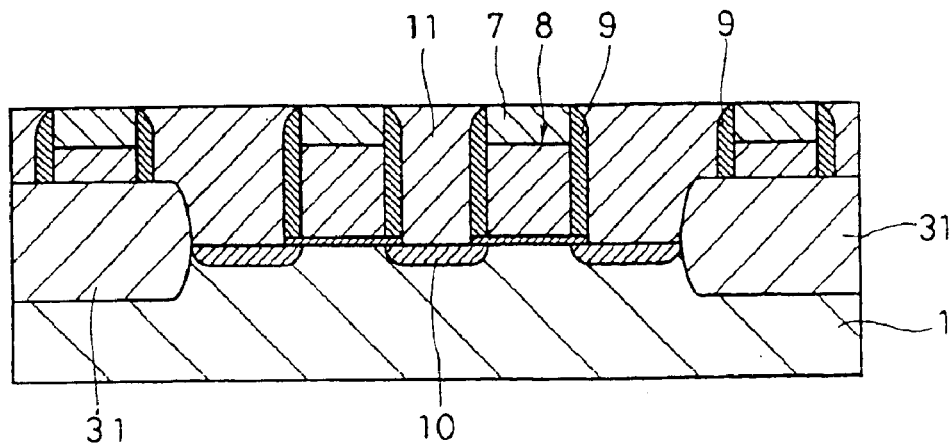

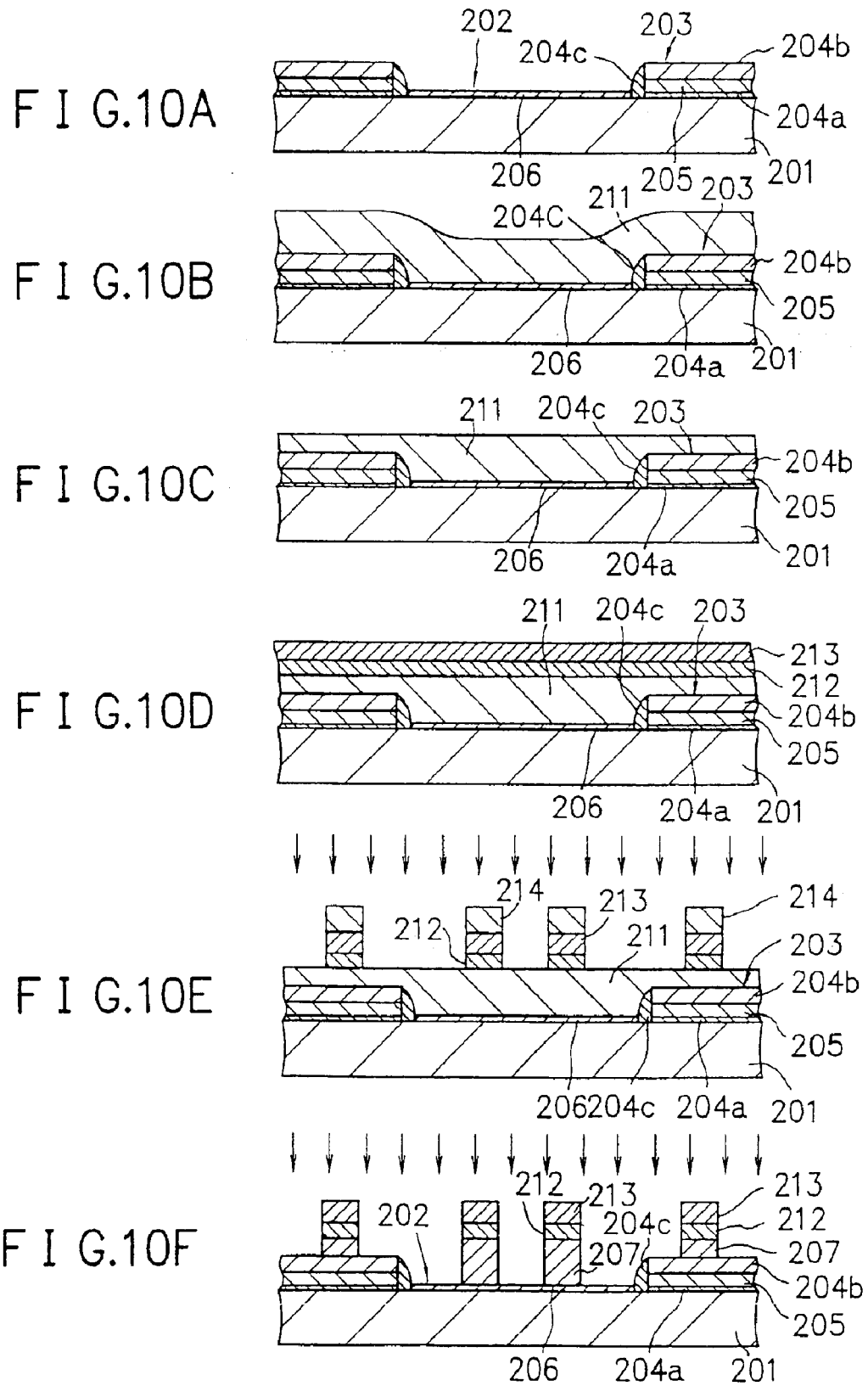

F I G. 12
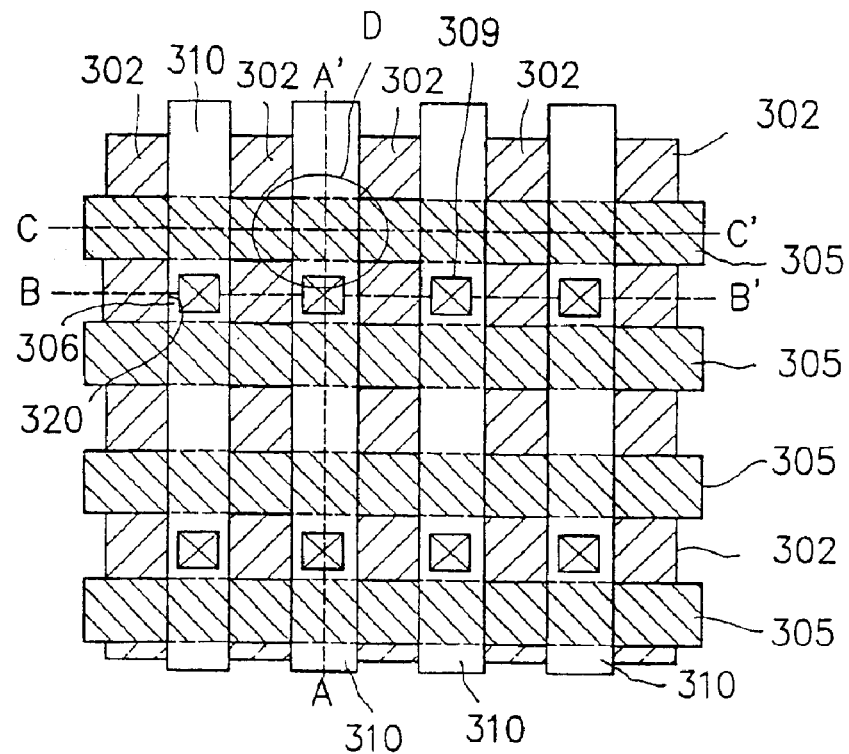
F I G. 13
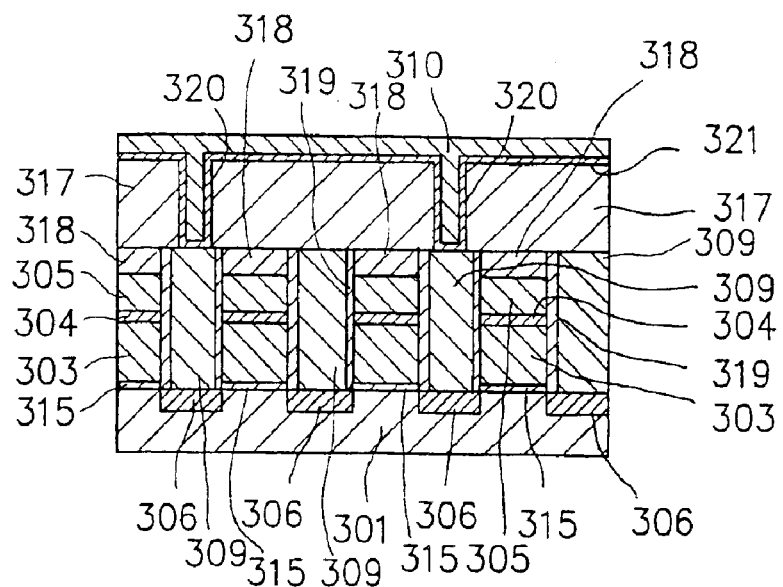

F I G. 17A
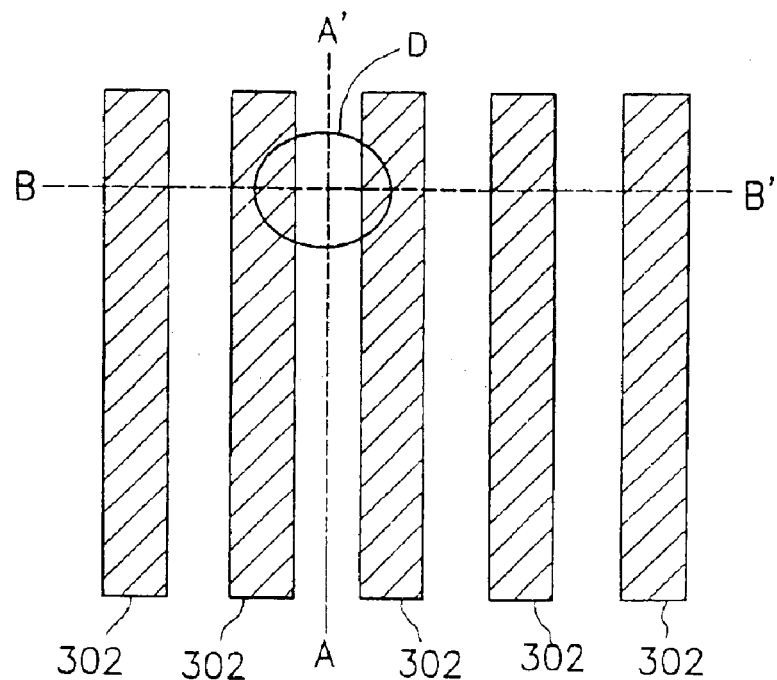
F I G. 17B
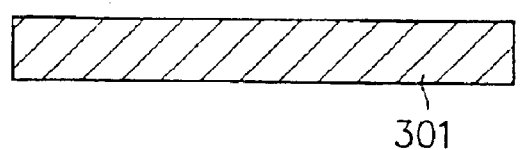
F I G. 17C
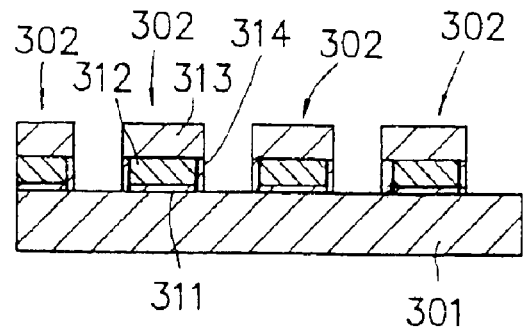

F I G.18A
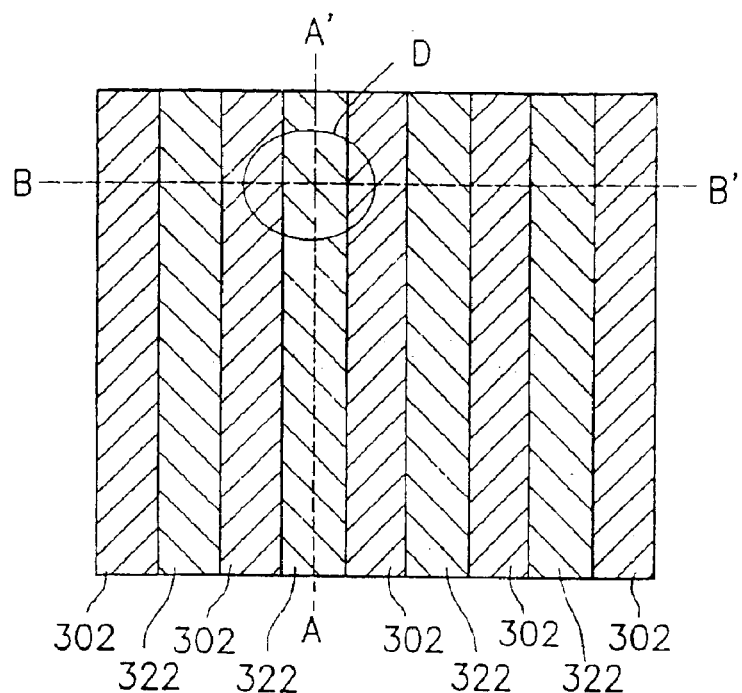
F I G.18B
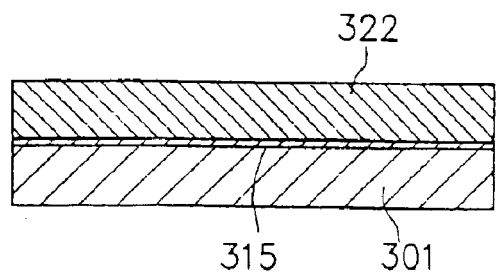
F I G.18C
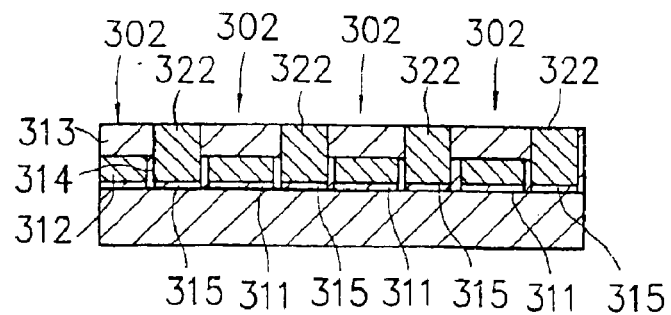

F I G.22M
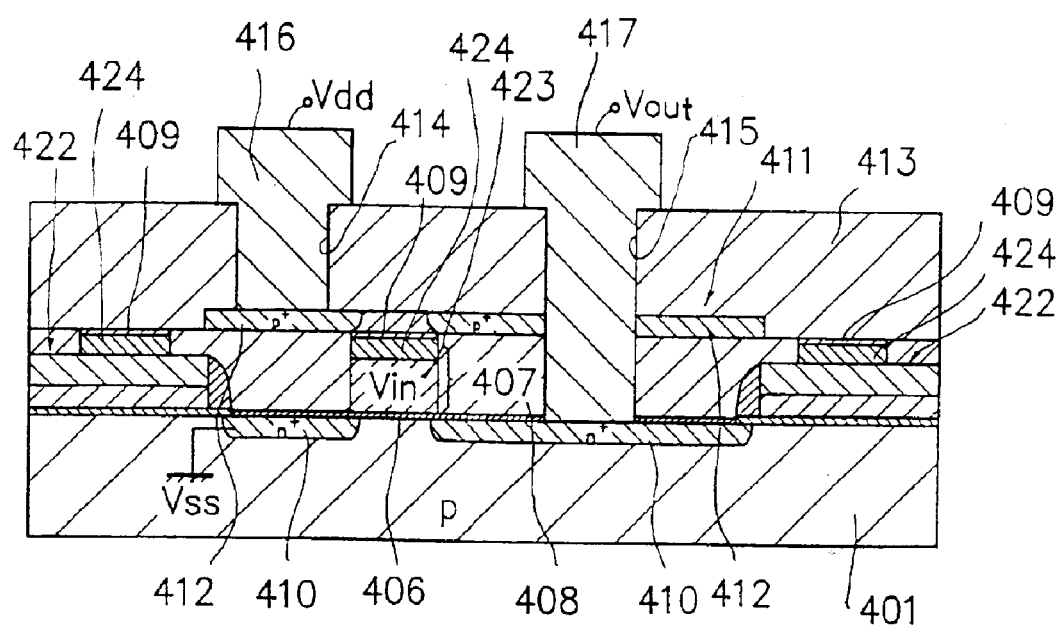

F I G. 37H
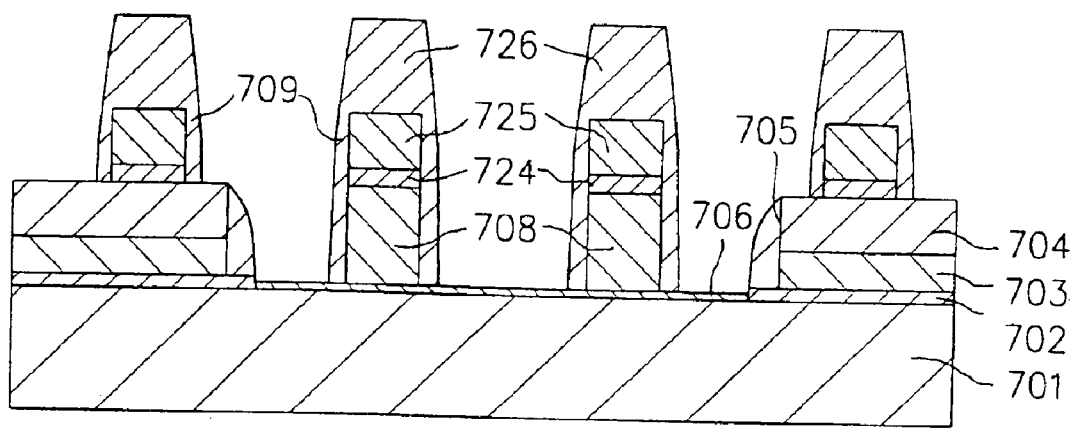

SEMICONDUCTOR DEVICE, A METHOD OF MANUFACTURING THE SEMICONDUCTOR DEVICE AND A METHOD OF DELETING INFORMATION FROM THE SEMICONDUCTOR DEVICE

CROSS-REFERENCE TO RELATED APPLICATIONS

This application is a Division of U.S. patent application Ser. No. 09/379,802 filed on Aug. 24, 1999 now U.S. Pat. No. 6,657,229 by Eguchi, et al. entitled SEMICONDUCTOR DEVICE, A METHOD OF MANUFACTURING THE SEMICONDUCTOR DEVICE AND A METHOD OF DELETING INFORMATION FROM THE SEMICONDUCTOR DEVICE which was a Division of U.S. patent application Ser. No. 08/864,796 filed on May 28, 1997 by Eguchi, et al entitled SEMICONDUCTOR DEVICE, A METHOD OF MANUFACTURING THE SEMICONDUCTOR DEVICE AND A METHOD OF DELETING INFORMATION FROM THE SEMICONDUCTOR DEVICE, now abandoned, the entire contents of each of which are incorporated by reference, and for which priority is claimed under 35 U.S.C. §120. As in parent U.S. patent application Ser. No. 08/864,796, priority is also claimed under 35 U.S.C. §119 to JP 8-156266 filed on May 28, 1996; JP8-195437 filed on Jul. 5, 1996; JP8-293369 filed on Oct. 15, 1996; 9-19860 filed on Jan. 17, 1997; and JP9-119884 filed on May 9, 1997.

BACKGROUND OF THE INVENTION

1. Field of the Invention

The present invention relates to a semiconductor device and a method of manufacturing the same and, more particularly, to a semiconductor device having a pad polysilicon film for extracting source and drain electrodes or a nonvolatile semiconductor memory such as an EEPROM and a method of manufacturing the same.

2. Description of the Related Art

A technique of preventing an extraordinary resist pattern exposure due to the step between an element isolation region (field region) and an element formation region on forming a gate electrode wiring layer of a MOS transistor is disclosed in Japanese Patent Laid-Open No. 6-21054.

In the technique disclosed in Japanese Patent Laid-Open No. 6-21054, a first polysilicon film is formed on the entire surface of a silicon substrate having a field oxide film formed thereon. Thereafter, the first polysilicon film is polished to expose the field oxide film or leave the first polysilicon film having a predetermined thickness on the field oxide film, thereby planarizing the entire structure. When the first polysilicon film is polished to expose the field oxide film, a second polysilicon film is formed on the resultant structure, and a resist pattern is formed on the second polysilicon film. When the first polysilicon film having a predetermined thickness is left on the field oxide film, a resist pattern is formed on the planarize first polysilicon film. In any case, the resist pattern is formed across a field region and an active region (element formation region) surrounded by the field region. With this structure, an extraordinary resist pattern formation due to variations of the exposure focal position is prevented. Consequently, the width of the gate electrode wiring can be small-sized to almost the lowest exposure limit.

Japanese Patent Laid-Open No. 6-349826 discloses use of almost the same technique as that of Japanese Patent Laid-Open No. 6-21054, to flush gate electrode layer in the element formation region and gate wiring layer in the field region are formed to the same level, thereby preventing etching into the substrate upon etching the gate electrode wiring layer.

Japanese Patent Laid-Open No. 4-62874 discloses a technique of preventing a mask displacement in gate electrode formation process, in which a gate electrode is deposited on the entire surface of a semiconductor substrate including an element isolation oxide film with a gate oxide film intervened there between. The surface of the gate electrode is planarized to the surface of the element isolation oxide film, so that the gate electrode is buried between adjacent element isolation oxide films.

Japanese Patent Laid-Open Nos. 5-335586 and 5-129621 disclose a technique to improve information storage capability of a nonvolatile semiconductor device, in which a polysilicon film serving as a floating gate is deposited on the entire surface of a semiconductor substrate having a filed oxide film. The polysilicon film is surface-polished patterned into a floating gate having a predetermined shape.

Chemical mechanical polishing (CMP) as a polishing method is disclosed in Japanese Patent Laid-Open No. 62-102543 or 8-17831.

Japanese Patent Laid-Open No. 6-69352 discloses a technique in which gate electrodes formed on a gate oxide film are covered with an insulating film, a thick polysilicon film is formed to bury each gate electrode, and the surface of the polysilicon film is etched back to expose the upper surface of the insulating film which covers the gate electrodes. In this case, the polysilicon film is separated at a separation width equal to the width of the gate electrode upon etching back the polysilicon film, so that polysilicon pads (pad polysilicon films) are formed. More specifically, the polysilicon pads are formed such that the separation width between adjacent polysilicon pads equals the width of the gate electrode. For this reason, the width of the gate electrode can be small-sized to the lowest exposure limit.

A mask formation technique of forming a pattern having a width equal to or smaller than the exposure limit is disclosed in, e.g., Japanese Patent Laid-Open No. 1-114041. More specifically, a silicon oxide film is formed on a silicon substrate to be patterned, and a photoresist having a pattern with a width as small as the exposure limit is formed on the silicon oxide film. Subsequently, the silicon oxide film is anisotropically etched using the photoresist as a mask to form a silicon oxide film having the same width as that of the photoresist pattern. The silicon substrate is dipped in dilute hydrofluoric acid to make the width of the silicon oxide film smaller than the exposure limit, and the photoresist is removed. Thereafter, a new photoresist is formed to bury the silicon oxide film. Etching is performed to expose the upper surface of the silicon oxide film. The silicon substrate is dipped again in dilute hydrofluoric acid to remove the silicon oxide film. With these processes, a mask having a pattern with a separation width smaller than the exposure limit is complete.

Japanese Patent Laid-Open No. 8-70120 discloses a technique in which a stopper portion consisting of an oxide film which covers the upper and side surfaces of a gate electrode is formed, and an impurity diffusion region consisting of polysilicon is formed between the gate electrode and the element isolation region through the stopper portion serving as a stopper.

Japanese Patent Laid-Open No. 6-13606 discloses a CMOS transistor having an SOI structure with two or more silicon layers, in which a common gate whose conductivity type changes from the first conductivity type to the second conductivity type is formed, and this gate is sandwiched between silicon layers having sources/drains with gate oxide films intervened.

Japanese Patent Laid-Open No. 6-21473 discloses a technique of attaining high integration of SRAM memory cells. In this technique, a polysilicon film is deposited on an element active region including a LOCOS region (field oxide film) with a first gate oxide film intervened. The polysilicon film is polished using the LOCOS region as a stopper to planarize the polysilicon film, thereby forming a lower gate. Next, a second gate oxide film and an upper gate are sequentially formed on the planarized LOCOS region and polysilicon film.

U.S. Pat. No. 5,422,289 discloses an art in which a field oxide film is formed through LOCOS process to fix an element active region, thereafter a gate electrode with its top face planarized and leading-out wirings from the gate and source/drain are formed.

U.S. Pat. No. 5,292,683 and No. 5,397,908 disclose an art in which isolation trench formed in a semiconductor substrate is filled, thereafter an element isolation structure with its upper portion projected on the surface of the substrate is formed by chemical mechanical polishing (CMP) process.

However, the following problems are posed in gate electrode formation.

In the technique disclosed in Japanese Patent Laid-Open No. 6-21054, the first polysilicon film can hardly be left to have a predetermined thickness on the field oxide film by polishing the first polysilicon film. In addition, when the first polysilicon film is polished using the field oxide film as a stopper, and thereafter, the second polysilicon film is formed on the resultant structure, two layers of polysilicon films constituting the gate electrode are formed. Projections are generated on the surface of the first polysilicon film due to a spontaneous oxide film or a transmutative substance generated upon polishing and left between the first and second polysilicon films. In addition, this technique requires an extra polishing process to the manufacturing processes and therefore cannot meet one of important requirements associated with manufacturing of the semiconductor device, i.e., reduction of the number of processes.

Along with progresses in micropatterning and high integration of semiconductor devices, pad polysilicon films for contact extraction are formed on the source/drain of a MOS transistor to mainly modify the positional accuracy of contact holes on the source/drain of the MOS transistor. This pad polysilicon films are electrically disconnected between the source and the drain, as a matter of course, and therefore must be separated on the gate electrode.

However, when the width of the gate electrode wiring layer is reduced to the exposure limit, the resist pattern used to separate the pad polysilicon films on the gate electrode has a width equal to or smaller than the exposure limit, so the pad polysilicon films are hard to be patterned by photolithography processes. For this reason, conventionally, the width of the gate electrode wiring pattern cannot be reduced to the exposure limit, thus impeding micropatterning of a semiconductor device.

The technique disclosed in Japanese Patent Laid-Open No. 1-114041 can be used to form the mask on the polysilicon film formed on the gate electrode wiring layer and form the pad polysilicon film having a width equal to or smaller than the exposure limit on the basis of the mask pattern. However, the cumbersome processes as described above are required to form the mask. Additionally, after formation of the pad polysilicon film, the process of removing the mask is also needed. In this case, addition of the mask formation and removing processes largely increases the number of manufacturing processes, resulting in a serious problem.

The technique disclosed in Japanese Patent Laid-Open No. 8-70120 can be used to fill the polysilicon film in a self-aligned manner between the gate on the element active region and the element isolation region. Actually, the gate is formed across the element active region and the element isolation region, so this technique cannot sufficiently cope with this situation.

The technique disclosed in Japanese Patent Laid-Open No. 8-70120 can be applied to only a semiconductor device having an SOI structure and therefore cannot be used for wide application purposes. In addition, the SOI structure does not allow use of gates of the same conductivity type.

Deep problems such as development of so called bird's beak and penetration of field oxide into the element active region of the device occur in the process of the U.S. Pat. No. 5,422,289, in which an element isolation structure is constructed by a field oxide film formed by LOCOS process.

A complex step to form a sacrificial layer and then to remove-the layer can not be omitted in the process disclosed in the U.S. Pat. No. 5,292,683 and No. 5,397,908 due to structural feature of the element isolation structure.

SUMMARY OF THE INVENTION

It is an object of the present invention to provide a semiconductor device which increases the process margin without being affected by close location of element isolation structures or any other underlying step and allows easy and proper formation of a desired gate electrode or various wiring layers, and a method of manufacturing the same.

It is another object of the present invention to provide a semiconductor device manufacturing method which can achieve further micropatterning of a gate electrode and realize high integration by properly patterning a pad polysilicon film even when the width of the gate electrode wiring layer of, e.g., a MOS transistor is reduced to the exposure limit.

It is still another object of the present invention to provide a semiconductor device manufacturing method which can achieve further micropatterning of a semiconductor device and realize high integration by patterning pad polysilicon films to have a separation width equal to or smaller than the exposure limit regardless of the width of the gate electrode wiring pattern of, e.g., a MOS transistor without any cumbersome processes or photolithography.

It is still another object of the present invention to provide a semiconductor device, i.e., a nonvolatile semiconductor memory which enables a storage deletion operation using a field shield element isolation structure in addition to a conventional storage deletion operation.

It is still another object of the present invention to provide a semiconductor device, i.e., a nonvolatile semiconductor memory in which an element isolation structure and a floating gate electrode are formed in a self-aligned manner to allow a large cell size reduction, and a method of manufacturing the same.

It is still another object of the present invention to provide a semiconductor device having a CMOS structure which uses no special semiconductor substrate such as an SOI structure to allow further integration on a flat structure with a small occupied area, and a method of manufacturing the same.

According to the present invention, there is provided a semiconductor device having a transistor with a gate, a source, and a drain formed in an element active region demarcated by non-LOCOS insulating device isolation blocks (non-LOCOS element isolation structures) on a semiconductor substrate, comprising at least two gates covered with insulating films and formed on the element active region to extend over the non-LOCOS insulating device isolation blocks, and a leading-out electrode filled between adjacent ones of the gates with the insulating films intervened, wherein upper surfaces of the gates are planarized at substantially the same level over the non-LOCOS insulating device isolation blocks and the element active region, and upper surfaces of the insulating films and an upper surface of the leading-out electrode are planarized at substantially the same level.

According to another aspect of the present invention, there is provided a semiconductor device, comprising a first step structure portion formed at a predetermined level from a surface of a reference layer, second step structure portions respectively formed on the first step structure portion and the reference layer and functioning as non-LOCOS insulating device isolation blocks for demarcating an element active region on the reference layer, and a first conductive film patterned on the element active region across at least the second step structure portion on the reference layer, wherein an upper surface of the first conductive film is planarized such that the upper surface of the first conductive film and an upper surface of the second step structure portion to formed on said first step structure portion are formed at substantially the same level.

According to still another aspect of the present invention, there is provided a semiconductor device comprising partially formed step structures, at least two first conductive films patterned on a step structure nonformation region and bestriding over the step structures, first insulating films covering the first conductive films, and a second conductive film filling between adjacent ones of the first conductive films with the first insulating films intervened, wherein upper surfaces of the first conductive films are planarized at substantially the same level over the step structures and the step structure nonformation region, and upper surfaces of the first insulating films and an upper surface of the second conductive film are planarized at substantially the same level.

According to still another aspect of the present invention, there is provided a semiconductor device comprising non-LOCOS insulating device isolation blocks for demarcating an element formation region on a semiconductor substrate, the non-LOCOS insulating device isolation block being formed by burying a first conductive film in a first insulating film, second conductive films filled, with intermediary of second insulating films, between adjacent ones of the non-LOCOS insulating device isolation blocks on the semiconductor substrate, capacitively coupled to the first conductive film through a side surface portion of the first insulating film, and separated into an island shape in the element formation region, and a third conductive film patterned into a strip shape on the second conductive film through a third insulating film and capacitively coupled to the second conductive film.

According to still another aspect of the present invention, there is provided a semiconductor device comprising non-LOCOS insulating device isolation blocks for demarcating an element formation region on a semiconductor substrate, the non-LOCOS insulating device isolation block being formed by burying a first conductive film in a first insulating film, a second conductive film filled, with intermediary of second insulating films, between adjacent ones of the non-LOCOS insulating device isolation blocks on the semiconductor substrate, and capacitively coupled to the first conductive film through a side surface portion of the first insulating film.

According to still another aspect of the present invention, there is provided a semiconductor device comprising a semiconductor region where a pair of first diffusion layers of a predetermined conductivity type are formed on surface regions, a first layer having a conductive film patterned on the semiconductor region with a first insulating film intervened, the first diffusion layers being formed on left and right sides of the conductive film, a second insulating film formed on an upper surface of the conductive film, a third insulating film covering side surfaces of the conductive film and the second insulating film and planarized such that an upper surface of the third insulating film and an upper surface of the second insulating film are formed on substantially the same plane, and a second layer patterned on the third insulating film including the upper surface of the second insulating film, in which a pair of second diffusion layers of a predetermined conductivity type are formed in regions on both sides of the second insulating film such that a region between the second diffusion layers opposes the conductive film through the second insulating film.

According to still another aspect of the present invention, there is provided a semiconductor device having first and second transistors which have a common gate, wherein the first transistor comprises the gate patterned on a semiconductor substrate with intermediary of a first gate insulating film, and first source and drain formed in surface regions of the semiconductor substrate on both sides of the gate, the second transistor comprises the gate, and second source and drain formed, on both sides of the gate, on a conductive film patterned on the gate with intermediary of a second gate insulating film formed on an upper surface of the gate, and an insulating interlayer is formed to cover side surfaces of the gate and the second gate insulating film and planarized such that an upper surface of the insulating interlayer and the upper surface of the second gate insulating film are on substantially the same plane, the conductive film being formed on the insulating interlayer including the upper surface of the second gate insulating film.

According to still another aspect of the present invention, there is provided a semiconductor device comprising a first insulating film filled in a groove formed in a semiconductor substrate, first conductive films patterned, with intermediary of a second insulating film, on at least a first insulating film nonformation region of the semiconductor substrate over the first insulating film nonformation region and the first insulating film, a third insulating film covering the first conductive film, a pair of diffusion layers formed in surface regions of the semiconductor substrate on both sides of the first conductive film, and a second conductive film filled, with intermediary of the third insulating film, between adjacent ones of the first conductive films and connected to the diffusion layer, wherein upper surfaces of the first conductive films are planarized across the nonformation region and the first insulating film on substantially the same plane, and an upper surface of the third insulating film and an upper surface of the second conductive film are planarized on substantially the same plane.

According to still another aspect of the present invention, there is provided a semiconductor device in which a transistor having a gate, a source, and a drain is formed in an element active region on a semiconductor substrate, comprising a non-LOCOS insulating device isolation block formed by filling a first insulating film in a groove formed in the semiconductor substrate to demarcate the element active region on the semiconductor substrate, a second insulating film covering the gate, and a leading-out electrode filled, with intermediary of the second insulating film, between adjacent ones of the gates, having an upper surface which is planarized to be on substantially the same plane as that of an upper surface of the second insulating film, and connected to the source or drain.

According to still another aspect of the present invention, there is provided a semiconductor device in which first and second transistors are stacked, wherein the first transistor has a first gate patterned on a semiconductor substrate with intermediary of a first gate insulating film, and first source and drain formed in surface regions of the semiconductor substrate on both sides of the first gate, an insulating interlayer having an upper surface is formed to cover the first gate, and the second transistor includes a conductive film patterned on the insulating interlayer, and has a second gate patterned on the conductive film through a second gate insulating film and second source and drain formed in the conductive film on both sides of the second gate.

According to still another aspect of the present invention, there is provided a semiconductor device comprising a semiconductor substrate, an insulating film formed on the semiconductor substrate and having an opening for exposing a part of a surface of the semiconductor substrate, a lower electrode patterned on the insulating film to bury the opening and having a planarized upper surface, an upper electrode patterned on the lower electrode with intermediary of a dielectric film and capacitively coupled to the lower electrode, wherein another insulating film is formed to bury sides of the lower electrode, the dielectric film and the upper electrode, the another insulating film being planarized to have a top surface flushed with the top surface of the upper electrode.

According to the present invention, there is provided a method of manufacturing a semiconductor device, comprising a first step for patterning a first insulating film on a reference layer, a second step for forming step structure portions respectively on the first insulating film and the reference layer, a third step for depositing a first conductive film on an entire surface of the reference layer including the step structure portions on the first insulating film to bury the step structure portions in the first conductive film, a fourth step for polishing the first conductive film using the step structure portions on the first insulating film as stoppers until surfaces of the step structure portions on the first insulating film are exposed, and the fifth step of patterning the first conductive film to form a predetermined pattern consisting of the first conductive film on the reference layer and the step structure portions.

According to another aspect of the present invention, there is provided a method of manufacturing a semiconductor device, comprising a first step for forming a groove portion in a semiconductor substrate serving as a reference layer, a second step for forming a step structure portion having a height smaller than a depth of the groove portion on a bottom surface in the groove portion, a third step for depositing a first conductive film on an entire surface of the semiconductor substrate including the groove portion to bury the step structure portion in the first conductive film, a fourth step for polishing the first conductive film using the semiconductor substrate around the groove portion as a stopper until a surface of the semiconductor substrate is exposed, and a fifth step for patterning the first conductive film to form a predetermined pattern of the first conductive film on the bottom surface in the groove portion and on the step structure portion.

According to still another aspect of the present invention, there is provided a method of manufacturing a semiconductor device, comprising the steps of forming non-LOCOS insulating device isolation blocks in element isolation regions on a semiconductor substrate, forming a first insulating film on a surface of the semiconductor substrate in an element formation region surrounded and demarcated by the non-LOCOS insulating device isolation blocks, forming a first conductive film on an entire surface of the semiconductor substrate including the first insulating film to a thickness for burying the non-LOCOS insulating device isolation blocks, polishing the first conductive film to leave the first conductive film having a predetermined thickness on the non-LOCOS insulating device isolation block and planarize a surface of the first conductive film, forming a second insulating film on the planarized first conductive film, patterning the second insulating film and the first conductive film to form patterns each consisting of the second insulating film and the first conductive film on the element formation region and the non-LOCOS insulating device isolation blocks, forming a third insulating film on a side surface of at least the first conductive film of the pattern and removing the first insulating film between the patterns, forming a second conductive film on an entire surface of the semiconductor substrate including a space between the patterns from which the first insulating film is removed to a thickness for burying the space between the patterns, and polishing the second conductive film until the second insulating film of the pattern is exposed.

According to still another aspect of the present invention, there is provided a method of manufacturing a semiconductor device, comprising the steps of forming non-LOCOS insulating device isolation blocks in element isolation regions on a semiconductor substrate, forming a first insulating film oh a surface of the semiconductor substrate in an element formation region surrounded and demarcated by the non-LOCOS insulating device isolation blocks, forming a first conductive film on an entire surface of the semiconductor substrate including the first insulating film to a thickness for burying the non-LOCOS insulating device isolation blocks, polishing the first conductive film to planarize a surface of the first conductive film using the non-LOCOS insulating device isolation blocks as stoppers, forming a second conductive film on an entire surface of the semiconductor substrate including the non-LOCOS insulating device isolation blocks, forming a second insulating film on the second conductive film, patterning the second insulating film and the first and second conductive films to form patterns each consisting of the second insulating film and the first and second conductive films on the element formation region and the non-LOCOS insulating device isolation blocks, forming a third insulating film on side surfaces of at least the first and second conductive films of the pattern and removing the first insulating film between the patterns, forming a third conductive film on an entire surface of the semiconductor substrate including a space between the patterns from which the first insulating film is removed, to a thickness to fill the space between the patterns, and polishing the third conductive film until the second insulating film of the pattern is exposed.

According to still another aspect of the present invention, there is provided a method of manufacturing a semiconductor device having a transistor with a gate, a source, and a drain, comprising steps of covering the gate with an insulating film, forming a conductive film constituting a part of a leading-out electrode of the source or drain to cover an upper portion of the insulating film, and polishing the conductive film until the upper portion of the insulating film is exposed.

According to still another aspect of the present invention, there is provided a method of manufacturing a semiconductor device, comprising steps of forming a first insulating film on a surface of a semiconductor substrate in an element formation region surrounded and demarcated by non-LOCOS insulating device isolation blocks formed in element isolation regions on the semiconductor substrate, forming a first conductive film on an entire surface of the semiconductor substrate including the first insulating film to a thickness for burying the non-LOCOS insulating device isolation blocks, removing a part of the first conductive film to leave the first conductive film having a predetermined thickness on the non-LOCOS insulating device isolation block and planarize a surface of the first conductive film, forming a second insulating film having an acid resistance on the planarized first conductive film, forming a third insulating film on the second insulating film, patterning the second and third insulating films and the first conductive film to form patterns each consisting of the second and third insulating films and the first conductive film on the element formation region and the non-LOCOS insulating device isolation blocks, forming a fourth insulating film having an acid resistance on a side surface of at least the first conductive film of the pattern and removing the first insulating film between the patterns, cleaning the third insulating film of the pattern to reduce a width of the third insulating film, forming a second conductive film on an entire surface of the semiconductor substrate including a space between the patterns from which the first insulating film is removed, to a thickness to bury the patterns, and polishing the second conductive film until the third insulating film of the pattern is exposed.

According to still another aspect of the present invention, there is provided a method of manufacturing a semiconductor device, comprising the steps of forming a first insulating film on a surface of a semiconductor substrate in an element formation region surrounded and demarcated by non-LOCOS insulating device isolation blocks formed in element isolation regions on the semiconductor substrate, forming a first conductive film on an entire surface of the semiconductor substrate including the first insulating film to a thickness for burying the non-LOCOS insulating device isolation blocks, polishing the first conductive film using the non-LOCOS insulating device isolation blocks as stoppers to planarize a surface of the first conductive film, forming a second conductive film on an entire surface of the semiconductor substrate including the non-LOCOS insulating device isolation blocks, forming a second insulating film having an acid resistance on the second conductive film, forming a third insulating film on the second insulating film, patterning the second and third insulating films and the first and second conductive films to form patterns each consisting of the second and third insulating films and the first and second conductive films on the element formation region and the non-LOCOS insulating device isolation blocks, forming a fourth insulating film having an acid resistance on side surfaces of at least the first and second conductive films of the pattern and removing the first insulating film between the patterns, cleaning the third insulating film of the pattern using an acid solution to reduce a width of the third insulating film, forming a third conductive film on an entire surface of the semiconductor substrate including a space between the patterns from which the first insulating film is removed, to a thickness for burying the patterns, and polishing the third conductive film until the third insulating film of the pattern is exposed.

According to still another aspect of the present invention, there is provided a method of manufacturing a semiconductor device, comprising a first step for patterning a first conductive film on a semiconductor substrate with intermediary of a first insulating film and forming the first insulating film to cover the first conductive film to bury the first conductive film in the first insulating film, thereby forming non-LOCOS insulating device isolation blocks on the semiconductor substrate to demarcate an element formation region, a second step for forming a second insulating film on the semiconductor substrate in the element formation region, a third step for filling a second conductive film, with intermediary of the second insulating film, between adjacent ones of the non-LOCOS insulating device isolation blocks on the semiconductor substrate, a fourth step for sequentially depositing a third insulating film and a third conductive film on an entire surface of the non-LOCOS insulating device isolation blocks and the second conductive film, and a fifth step for patterning the third conductive film, the third insulating film, the second conductive film, and the second insulating film to form the third conductive film and the third insulating film into a strip shape and remove the second conductive film and the second insulating film between adjacent ones of the third conductive films.

According to still another aspect of the present invention, there is provided a method of manufacturing a semiconductor device, comprising steps of forming a first insulating film on a step structure nonformation region on a semiconductor substrate having a step structure, forming a first conductive film on an entire surface including the step structure, polishing the first conductive film using an upper surface of the step structure as a stopper to planarize a surface of the first conductive film, patterning the planarized first conductive film to leave the first conductive film into a predetermined shape in the nonformation region, doping a first impurity in surface regions of the semiconductor substrate on both sides of the first conductive film to form a pair of first diffusion layers, forming a second insulating film on an entire surface including the step structure and the first conductive film, polishing the second insulating film using the upper surface of the first conductive film as a stopper to planarize a surface of the second insulating film, thermally oxidizing the upper surface of the first conductive film to form a third insulating film, patterning a second conductive film on the second insulating film including the third insulating film, and doping a second impurity in the second conductive film on both sides of a predetermined portion to form a pair of second diffusion layers except the predetermined portion on the second conductive film positioned on the third insulating film.

According to still another aspect of the present invention, there is provided a method of manufacturing a semiconductor device, comprising steps of forming a first insulating film in a step structure nonformation region on a semiconductor substrate having a step structure, forming first conductive film on an entire surface including the step structure, polishing the first conductive film using an upper surface of the step structure as a stopper to planarize a surface of the first conductive film, forming a second conductive film on the planarized first conductive film, patterning the first and second conductive films into a predetermined shape to leave the first and second conductive films in the step structure nonformation region and leave only the second conductive film on the step structure, doping a first impurity in surface regions of the semiconductor substrate on both sides of the first and second conductive films to form a pair of diffusion layers, forming a second insulating film on an entire surface including the step structure and the second conductive film, polishing the second insulating film using an upper surface of the second conductive film to planarize a surface of the second insulating film, thermally oxidizing the upper surface of the second conductive film to form a third insulating film, patterning a third conductive film on the second insulating film including the third insulating film, and doping a second impurity in the third conductive film on both sides of a predetermined portion to form a pair of second diffusion layers except the predetermined portion on the third conductive film positioned above the third insulating film.

According to still another aspect of the present invention, there is provided a method of manufacturing a semiconductor device having a first transistor and a second transistor having a second source and a second drain, the first and second transistors having a common gate, comprising steps of patterning the gate on a semiconductor substrate with intermediary of a first gate insulating film and doping a first impurity in surface regions of the semiconductor substrate on both sides of the gate to form a first source and a first drain, for constituting the first transistor, forming an insulating interlayer to cover the first transistor and polishing the insulating interlayer using the gate as a stopper to planarize a surface of the insulating interlayer, thermally oxidizing an exposed upper surface of the gate to form a second gate insulating film, and patterning a conductive film on the insulating interlayer including the second gate insulating film and doping a second impurity in the conductive film while masking a portion of the conductive film positioned above the second gate insulating film to form the second source and the second drain, thereby constituting the second transistor.

According to still another aspect of the present invention, there is provided a method of manufacturing a semiconductor device having a first transistor and a second transistor having a second source and a second drain, the first and second transistors having a common gate, comprising the steps of forming non-LOCOS insulating device isolation blocks for demarcating an element active region on a semiconductor substrate, forming a first gate oxide film on a surface of the element active region, forming a first conductive film on an entire surface including the non-LOCOS insulating device isolation blocks, patterning the first conductive film to form the first conductive film into a predetermined shape in the element active region and to leave an upper portion of the first conductive film on the non-LOCOS insulating device isolation block, for forming the gate, doping a first impurity in surface regions of the semiconductor substrate on both sides of the gate in the element active region to form a first source and a first drain, for constituting the first transistor, forming an insulating interlayer to cover the first transistor and polishing the insulating interlayer using the gate as a stopper to planarize a surface of the insulating interlayer, thermally oxidizing an exposed upper surface of the gate to form a second gate insulating film, and patterning a second conductive film on the insulating interlayer including the second gate insulating film and doping a second impurity in the conductive film while masking a portion of the second conductive film positioned above the second gate insulating film to form the second source and the second drain, for constituting the second transistor.

According to still another aspect of the present invention, there is provided a method of manufacturing a semiconductor device comprising a first step for sequentially forming a first insulating film and a first conductive film on a semiconductor substrate, a second step for patterning the first conductive film, the first insulating film, and the semiconductor substrate to form a groove from the first conductive film to a predetermined depth of the semiconductor substrate, a third step for forming a second insulating film on an entire surface to cover an inner wall of the groove, a fourth step for forming a third insulating film on an entire surface including the groove, a fifth step for polishing the third insulating film to planarize the third insulating film until the first conductive film is exposed and filling the third insulating film in the groove, a sixth step for sequentially forming a second conductive film and a fourth insulating film on an entire surface including the planarized third insulating film, a seventh step for patterning the fourth insulating film, the second conductive film, the first conductive film, and the first insulating film to form a pattern consisting of the first insulating film, the first conductive film, the second conductive film, and the fourth insulating film into a predetermined shape in at least a groove nonformation region on the semiconductor substrate, an eighth step for forming a fifth insulating film on side surfaces of at least the first and second conductive films, a ninth step for forming a third conductive film on an entire surface including a space between the first and second conductive films adjacent to each other with intermediary of the fifth insulating film, and a tenth step for polishing the third conductive film to planarize the third conductive film until the fourth insulating film is exposed and filling the third conductive film, with intermediary of the fifth insulating film, between the first and second conductive films adjacent to each other.

According to still another aspect of the present invention, there is provided a method of manufacturing a semiconductor device comprising a first step for forming a first gate insulating film on a surface of a semiconductor substrate, a second step for patterning a first gate on the first gate insulating film, a third step for doping a first impurity in surface regions of the semiconductor substrate on both sides of the first gate to form a pair of first impurity diffusion layers, a fourth step for forming an insulating interlayer to cover the first gate and polishing the insulating interlayer to planarize a surface of the insulating interlayer, a fifth step for patterning a conductive film on the insulating interlayer, a sixth step for forming a second gate insulating film on a surface of the conductive film, a seventh step for patterning a second gate on the second gate insulating film, and an eighth step for doping a second impurity in surface regions of the conductive film on both sides of the second gate to form a pair of second impurity diffusion layers.

According to still another aspect of the present invention, there is provided a method of manufacturing a semiconductor device, comprising a first step for forming non-LOCOS insulating device isolation blocks for demarcating an element active region on a semiconductor substrate, a second step for forming a first gate insulating film on a surface of the element active region, a third step for forming a first conductive film on an entre surface including the non-LOCOS insulating device isolation blocks, a fourth step for patterning the first conductive film to form the first conductive film into a predetermined shape in the element active region with intermediary of the first gate insulating film and leave an upper portion of the first conductive film on the non-LOCOS insulating device isolation block, for forming a first gate, a fifth step for doping a first impurity in surface regions of the semiconductor substrate on both sides of the first gate in the element active region to form a pair of first impurity diffusion layers, a sixth step for forming an insulating interlayer to cover the first gate and polishing the insulating interlayer to planarize a surface of the insulating interlayer, a seventh step for pattering a second conductive film on the insulating interlayer including the second gate insulating film, an eighth step for forming a second gate insulating film on a surface of the second conductive film, a ninth step for forming a third conductive film on the second gate insulating film and patterning the third conductive film to form a second gate, and a tenth step for doping a second impurity in surface regions of the conductive film on both sides of the second gate to form a pair of second impurity diffusion layers.

According to still another aspect of the present invention, there is provided a method of manufacturing a semiconductor device comprising steps of forming an insulating film on a semiconductor substrate, forming an opening in the insulating film to expose a part of a surface of the semiconductor substrate, forming a first conductive film on the insulating film to fill the opening, polishing a surface of the first conductive film to planarize the first conductive film, sequentially forming a dielectric film and a second conductive film on the planarized first conductive film, simultaneously patterning the second conductive film, the dielectric film, and the first conductive film into a capacitor shape, forming an insulating film to cover the second conductive film, the dielectric film and the first conductive film, respectively patterned into the capacitor shape, and polishing the insulating film using the second conductive film as a stopper to planarizi, until the surface of the second conductive film is exposed.

According to still another aspect of the present invention, there is provided a method of manufacturing a semiconductor device, comprising steps of forming non-LOCOS insulating device isolation blocks in an element isolation region on a semiconductor substrate, forming a first insulating film on a surface of the semiconductor substrate in an element formation region surrounded and demarcated by the non-LOCOS insulating device isolation blocks, forming a first conductive film on an entire surface of the semiconductor substrate including the first insulating film to a thickness to bury the non-LOCOS insulating device isolation blocks, polishing the first conductive film using the non-LOCOS insulating device isolation blocks as stoppers to planarize a surface of the first conductive film, forming an underlayer consisting of a refractory metal on an entire surface of the semiconductor substrate including the non-LOCOS insulating device isolation blocks, forming a silicide film on the underlayer, forming a second insulating film on the silicide film, and patterning the second insulating film, the silicide film, the underlayer, and the first conductive film to form a pattern consisting of the first conductive film, the underlayer, the silicide film, and the second insulating film on the element formation region and the non-LOCOS insulating device isolation blocks.

According to the present invention, there is provided a method of deleting information from a semiconductor device, in use of the semiconductor device comprising non-LOCOS insulating device isolation blocks for demarcating element active regions on a semiconductor substrate, wherein said device comprising a first conductive film buried in a first insulating film, a second conductive film formed into an island shape in the element active region and filled with intermediary of second insulating films, in the region between the non-LOCOS insulating device isolation blocks in the element active region between adjacent ones of the non-LOCOS insulating device isolation blocks, and a third conductive film formed on the second conductive film to oppose the second conductive film with intermediary of a third insulating film, wherein the second conductive film is capacitively coupled to the third conductive film through the third insulating film, and capacitively coupled to the first conductive film through a side surface portion of the first insulating film, the method comprising a step of applying a first voltage having a negative value to the first conductive film and a second voltage higher than the first voltage to the third conductive film to accumulate predetermined charges in the second conductive film, to shift a threshold value viewed from the third conductive film in a positive direction for deleting information.

According to still another aspect of the present invention, there is provided a semiconductor device having a transistor with a gate, a source, and a drain formed in an element active region demarcated by element isolation structures on a semiconductor substrate, comprising at least two gate structures each including said gate covered with insulating film and formed on the element active region to extend over the element isolation structures, and a leading-out electrode filled between adjacent ones of the gate structures, wherein upper surfaces of the gate structures are planarized at substantially the same level over the element isolation structures and the element active region, and upper surfaces of the insulating films and an upper surface of the leading-out electrode are planarized at substantially the same level.

According to still another aspect of the present invention, there is provided a semiconductor device comprising a first step structure portion made of a silicon film formed at a predetermined level from a surface of a semiconductor substrate, a second step structure portions respectively formed on the first step structure portion and on the semiconductor substrate, the second step structure portion on the semiconductor substrate serving as a field oxide film for demarcating element active regions, and conductive films patterned in the element active region to span over at least the second step structure portion on the semiconductor substrate, wherein upper surfaces of the conductive films are planarized at substantially the same level.

According to still another aspect of the present invention, there is provided a method of manufacturing a semiconductor device comprising a first step for patterning a silicon film on a semiconductor substrate, a second step for applying field oxidation on the silicon film and the semiconductor substrate to form a field oxide film, a third step for depositing a conductive film on entire surface of the semiconductor substrate including the field oxide film on the silicon film, to bury the field oxide film within the conductive film, a fourth step for polishing the conductive film with using the field oxide film on the silicon film as a stopper until the surface of the field oxide film is exposed, and a fifth step for patterning the conductive film to form a predetermined pattern of the conductive film on the semiconductor substrate and on the field oxide film formed on the semiconductor substrate.

In the method of manufacturing the semiconductor device of the present invention, the first insulating film is patterned on the reference layer (e.g., a semiconductor substrate) in the first step. When a semiconductor substrate is used as the reference layer, an insulating layer patterned on the semiconductor substrate in formation of wells in surface regions of the semiconductor substrate may be commonly used as the first insulating film. In this case, the first insulating film is formed in a region including the scribing line of the semiconductor substrate. In the second step, using formation of the step structure portions (e.g., element isolation structures) on the reference layer, the step structure portions are formed not only on the reference layer but also on the first insulating film. In the third step, the first conductive film is deposited to bury the step structure portions. In the fourth step, the first conductive film is polished using the step structure portion on the first insulating film as a stopper until the surface of the step structure portion is exposed such that the upper surface of the first conductive film is flush with the upper surface of the step structure portion on the first insulating film. At this time, the conductive film which covers each step structure portion consists of a single layer of the first conductive film. In the fifth step, the first conductive film is patterned using a resist by photolithography. Since no step portions are present around the first conductive film, the resist can be prevented from being thinned due to step portions. In addition, since the first conductive film consists of a single layer of the conductive film, the conductive film can be easily and properly patterned into a desired shape.

In the method of manufacturing the semiconductor device of the present invention, a semiconductor substrate is used as the reference layer, and the first insulating film is formed on the scribing line region of the semiconductor substrate. When the scribing line region which does not contribute to formation of a semiconductor element in a normal state is used to planarize the polysilicon film, and the planarized polysilicon film is patterned. Since no steps are present in the periphery in patterning, the resist can be prevented from being thinned, and the gate electrode can be easily and properly patterned into a desired shape.

In the method of manufacturing the semiconductor device of the present invention, using the same technique disclosed in the above-described Japanese Patent Laid-Open No. 6-21054 or 8-349826, the pattern of the second insulating film and the first conductive film (or the first and second conductive films) in the element formation region, which is flush with that in the element isolation region and serves as, e.g., the gate electrode wiring layer, is formed. Next, the second conductive film (or the third conductive film) serving as, e.g., a pad polysilicon film formed on the entire surface to bury the pattern is polished using the second insulating film as the cap insulating film of the pattern as a stopper until the second insulating film is exposed. With these processes, the pattern of the second conductive film (or the third conductive film), i.e., the pad polysilicon film properly separated on the pattern of, e.g., the gate electrode wiring layer can be formed.

As described above, in the method of manufacturing the semiconductor device of the present invention, photolithography is not used to separate the second conductive film (or the third conductive film) serving as, e.g., a pad polysilicon film on the pattern of the second insulating film and the first conductive film (or the first and second conductive films) as, e.g., the gate electrode wiring layer. For this reason, the width of the pattern of the second insulating film and the first conductive film (or the first and second conductive films) as, e.g., the gate electrode wiring layer can be reduced to the substantial exposure limit in photolithography.

In the method of manufacturing the semiconductor device of the present invention, after a pattern consisting of the second and third insulating films and the first conductive film (or the second and third insulating films and the first and second conductive films) and serving as, e.g., a gate electrode pattern is formed, the fourth insulating film is formed on a side wall corresponding to at least the first conductive film (or the first and second conductive films) of the pattern.

At this time, the portion of the first conductive film (or the first and second conductive films) is surrounded by the second and fourth insulating films. Next, the third insulating film on the second insulating film of this pattern is cleaned with an acid solution to make the width of the third insulating film smaller than that of the second insulating film and the first conductive film (or the second insulating film and the first and second conductive films). Thereafter, the second conductive film (or the third conductive film) serving as, e.g., a pad polysilicon film is formed on the entire surface of the semiconductor substrate including the space between the patterns from which the first insulating film is removed to a thickness for burying the pattern. The second conductive film (or the third conductive film) is polished until the third insulating film of this pattern is exposed. With these processes, the pattern of the second conductive film (or the third conductive film) serving as, e.g., a pad polysilicon film properly separated by the third insulating film can be formed.

More specifically, when the pattern consisting of the second and third insulating films and the first conductive film (or the second and third insulating films and the first and second conductive films) is formed such that the width of the pattern almost equals the exposure limit value, the width of the third insulating film cleaned with the acid solution is smaller than the exposure limit value. Therefore, the second conductive film (or the third conductive film) separated by the third insulating film and formed into a predetermined pattern has a separation width smaller than the exposure limit value.

As described above, according to the method of manufacturing the semiconductor device of the present invention, even when the width of the pattern serving as, e.g., the gate electrode wiring layer is reduced to the substantial exposure limit in photolithography, the second conductive film (or the third conductive film) can be separated without using photolithography to form, e.g., a pad polysilicon film having a separation width smaller than the exposure limit value.

In the semiconductor device of the present invention, the second conductive film filled between the adjacent element isolation structures is arranged to oppose the first conductive film, buried in the element isolation structure and functioning as a shield plate electrode, with intermediary of the side surface portion of the first insulating film which covers the first conductive film. In addition, the third conductive film is formed on the second conductive film with intermediary of the third insulating film. When the first conductive film is to be function as the shield plate electrode, the potential of the first conductive film is set at 0 (V), and the semiconductor substrate corresponding to the element isolation structure is fixed at 0 (V). With this arrangement, element isolation is attained. However, a voltage of 0 V or less can be applied to the first conductive film. When the second conductive film is to function as a floating gate electrode, and the third conductive film is to function as a control gate electrode (word line), a predetermined negative voltage is applied to the first conductive film to flow a tunnel current between the first conductive film and the second conductive film through the side surface portion of the first insulating film. With this arrangement, the first conductive film can be used not only as the shield plate electrode but also as a write/erase electrode.

In the method of manufacturing the semiconductor device of the present invention, in the first step and subsequent second step, the second insulating films serving as, e.g., tunnel insulating films are respectively formed on the (field shield) element isolation structures and the semiconductor substrate between the element isolation structures. Thereafter, in the third step, the second conductive film serving as, e.g., a floating gate electrode is filled, with intermediary of the second insulating film, on the semiconductor substrate between the adjacent element isolation structures. In the fourth step, the third insulating film serving as, e.g., a dielectric film and the third conductive film serving as, e.g., a control gate electrode (word line) are sequentially deposited on the entire surface of the element isolation structures and the second conductive film. In the fifth step, the third conductive film, the third insulating film, the second conductive film, and the second insulating film are patterned. At this time, the second conductive film opposes the third conductive film through the third insulating film and also opposes the first conductive film through the side surface portion of the first insulating film.

In the method of manufacturing the semiconductor device of the present invention, in the third step, the deposited second conductive film is surface-polished using the first insulating film of the element isolation structure as a stopper. Therefore, e.g., a floating gate electrode which is properly separated by the first insulating film of the element isolation structure can be formed in a self-aligned manner.

As described above, according to the method of manufacturing the semiconductor device of the present invention, photolithography is not used to separate the second conductive film serving as, e.g., a floating gate electrode on the pattern of the element isolation structure. For this reason, the width of the pattern of the first conductive film as the shield plate electrode of the element isolation structure can be reduced to the substantial exposure limit in photolithography.

BRIEF DESCRIPTION OF THE DRAWINGS

FIGS. 2A to 2D are schematic sectional views showing steps in manufacturing a MOS transistor according to the second embodiment;

FIG. 3 is a schematic sectional view showing a case wherein an element isolation structure is formed as a field oxide film by LOCOS;

FIGS. 10A to 10K are schematic sectional views showing steps in manufacturing a MOS transistor according to the fifth embodiment;

FIG. 12 is a schematic plan view showing the structure of an EEPROM according to the sixth embodiment;

FIG. 13 is a schematic sectional view taken along a line A–A' in FIG. 12;

FIGS. 17A to 17C are schematic plan and sectional views showing a step subsequent to the step in manufacturing the EEPROM according to the sixth embodiment in FIGS. 16A to 16C;

FIGS. 18A to 18C are schematic plan and sectional views showing a step subsequent to the step in manufacturing the EEPROM according to the sixth embodiment in FIGS. 17A to 17C;

FIGS. 22A to 22M are schematic sectional views showing steps in manufacturing a CMOS transistor according to the seventh embodiment;

FIGS. 37A to 37H are schematic sectional views showing steps in manufacturing a MOS transistor according to the 10th embodiment.

DETAILED DESCRIPTION OF THE PREFERRED EMBODIMENTS

-First Embodiment-

The first embodiment will be described first. In the first embodiment, an example in which the present invention is applied to a MOS transistor will be described. In the first embodiment, the structure of the MOS transistor and a manufacturing method therefor will be described together. FIGS. 1A to 1J are schematic sectional views showing steps in manufacturing the MOS transistor.

An element isolation structure is formed in an element isolation region on a p-type silicon semiconductor substrate by a so-called field shield element isolation method, thereby demarcating an element formation region.

Figure 1A:
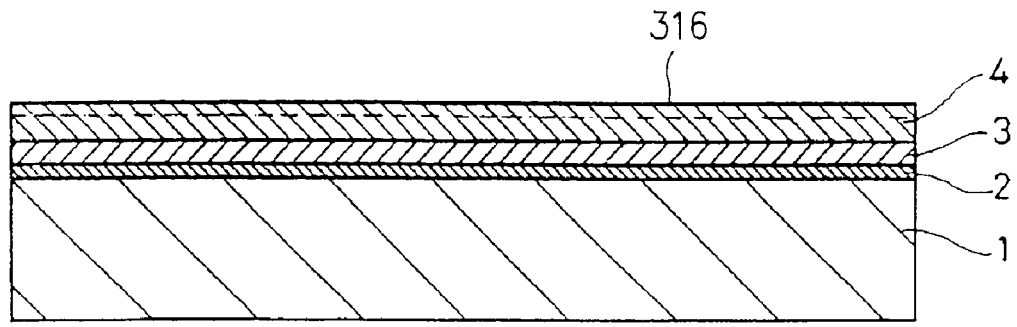
FIGS. 1A to 1K are schematic sectional and plan views showing steps in manufacturing a MOS transistor according to the first embodiment.

More specifically, as shown in FIG. 1A, a silicon oxide film 2, a polysilicon film 3, and a silicon oxide film 4 are formed on a p-type silicon semiconductor substrate 1 to thicknesses of, e.g., about 50 nm, 200 nm, and 200 nm, respectively. A silicon nitride film 316 having a thickness of about 200 nm may be formed on the entire surface of the silicon oxide film 4 by CVD process.

Figure 1B:
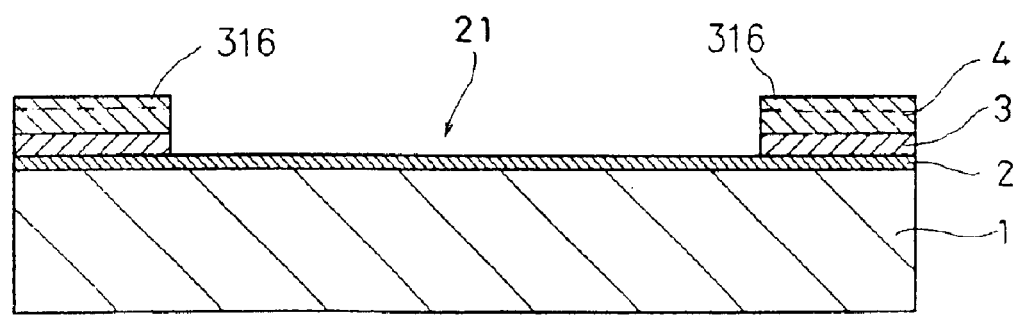

As shown in FIG. 1B, the polysilicon film 3 and the silicon oxide film 4 (and the silicon nitride film 316) are patterned by photolithography and dry etching to selectively remove these films, thereby demarcating an element formation region 21.

Figure 1C:
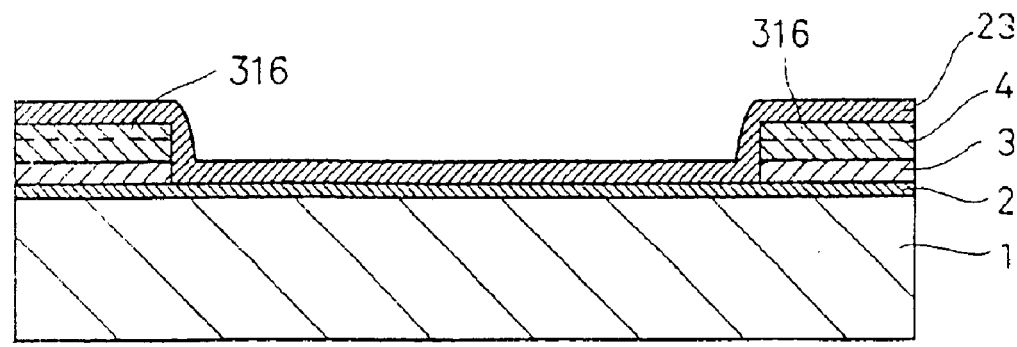
Figure 1D:
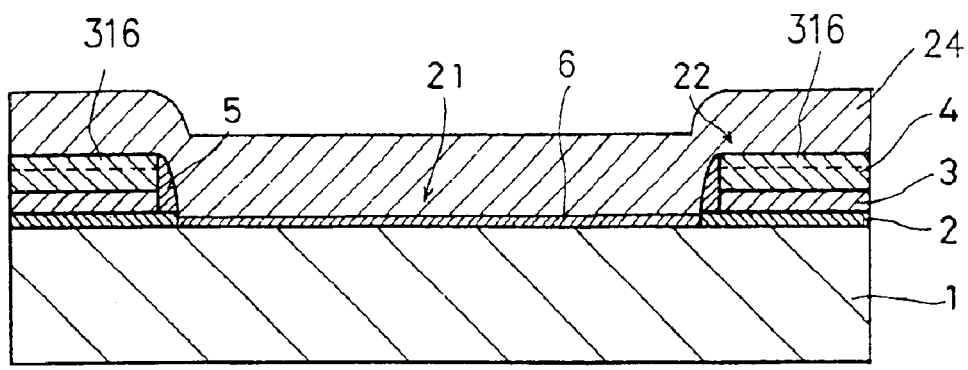

As shown in FIG. 1C, a silicon oxide film 23 is formed on the entire surface to cover the silicon oxide film 2, the left polysilicon film 3 and silicon oxide film 4 (and silicon nitride film 316). Thereafter, as shown in FIG. 1D, the entire surface of the silicon oxide film 23 is anisotropically dry-etched by, e.g., RIE to leave the silicon oxide only on the side walls of the silicon oxide film 2, the polysilicon film 3, and the silicon oxide film 4 (and the silicon nitride film 316), thereby forming side wall protective films 5. With these processes, field shield element isolation structures 22 each having a shield plate electrode consisting of a polysilicon film surrounded by the silicon oxide film are formed in field regions.

The surface of the silicon semiconductor substrate 1 on each of the element formation regions 21 separated from each other by the field shield element isolation structures 22 and demarcated relative to the field shield element isolation structures 22 is thermally oxidized to form a gate oxide film 6 having a thickness of about 15 nm. A polysilicon film 24 is formed on the entire surface including the field shield element isolation structures 22 by CVD. The polysilicon film 24 must be deposited to a thickness for burying the field shield element isolation structures 22 in the polysilicon film 24. Considering that the height of the field shield element isolation structure 22 is about 450 nm, the polysilicon film 24 is formed to a thickness of 500 to 1,000 nm.

Figure 1E:
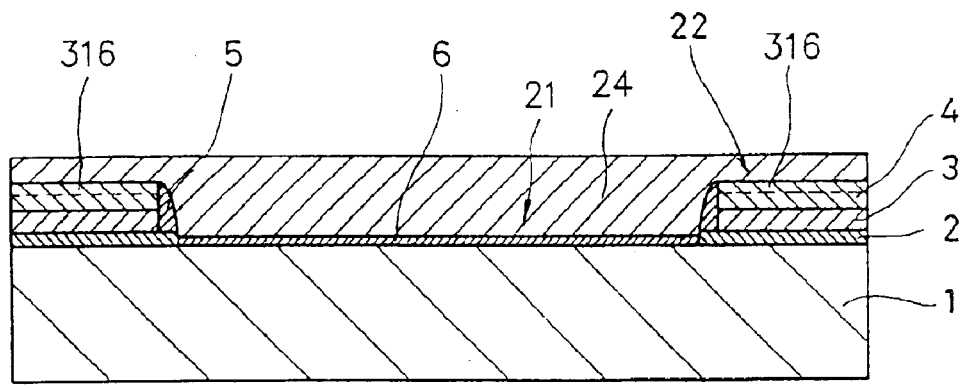

As shown in FIG. 1E, the polysilicon film 24 is subjected to surface polishing, e.g., chemical mechanical polishing (CMP) to planarize the surface. As illustrated, planarization is performed while leaving the polysilicon film 24 having a predetermined thickness on the field shield element isolation structures 22. CMP is a polishing method using a slurry of a predetermined chemical fluid and abrasive. As long as the initial thickness of the film to be polished is larger than the step, CMP allows highly precise planarization by canceling even a step on the millimeter order to suppress, e.g., the surface step to about 0.05 μm.

Figure 1F:
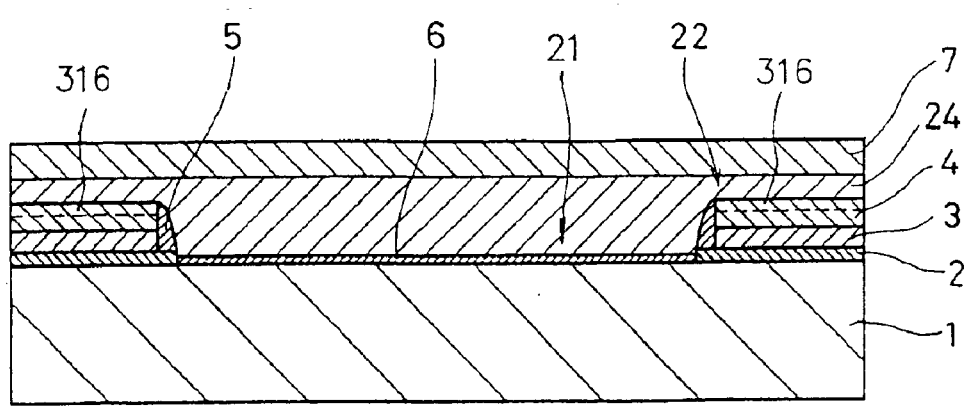

As shown in FIG. 1F, a silicon oxide film 7 is deposited on the planarized surface of the polysilicon film 24 to a thickness of 100 to 300 nm. Before formation of the silicon oxide film 7, a silicide layer of a refractory metal such as tungsten (W) may be formed on the planarized polysilicon film 24 to form a polycide layer consisting of the polysilicon film 24 and the silicide layer.

Figure 1G:
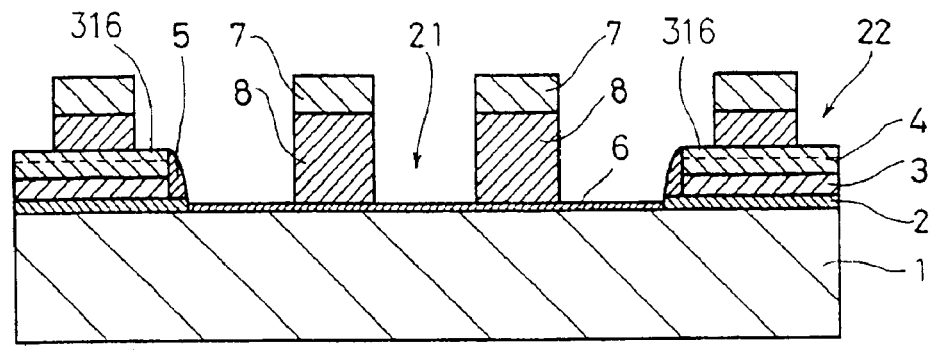

As shown in FIG. 1G, the polysilicon film 24 and the silicon oxide film 7 are patterned by photolithography and dry etching to form gate electrodes (gate wiring layers) 8 each having a predetermined shape on the element formation region 21 and field shield element isolation structures 22 such that the upper surfaces of the gate electrodes 8 are in almost the same plane, i.e., the upper surfaces are alomost flush with each other.

Figure 1H:
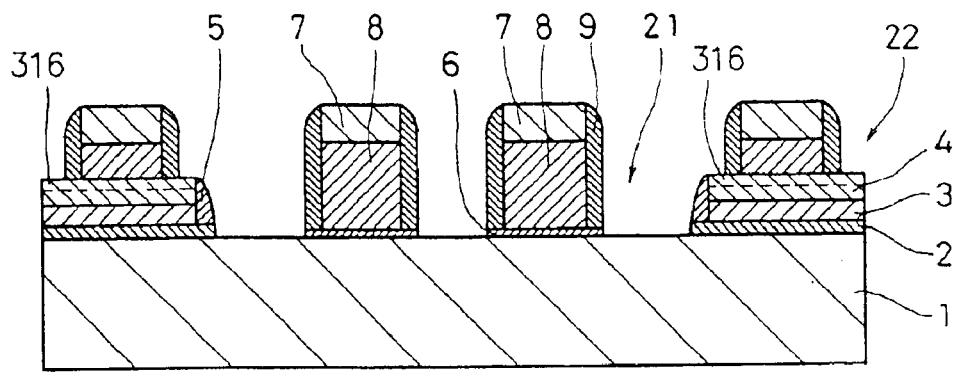

As shown in FIG. 1H, a silicon oxide film is deposited on the entire surface by CVD to cover the gate electrodes (gate wiring layers) 8 on the element formation region 21 and field shield element isolation structures 22. Next, the entire surface of the silicon oxide film is anisotropically dry-etched by, e.g., RIE to remove the gate oxide films 6 between the gate electrodes 8 in the element formation region 21. The silicon oxide film is left only on the side walls of the gate electrodes 8 to form side wall protective films 9.

Figure 1I:
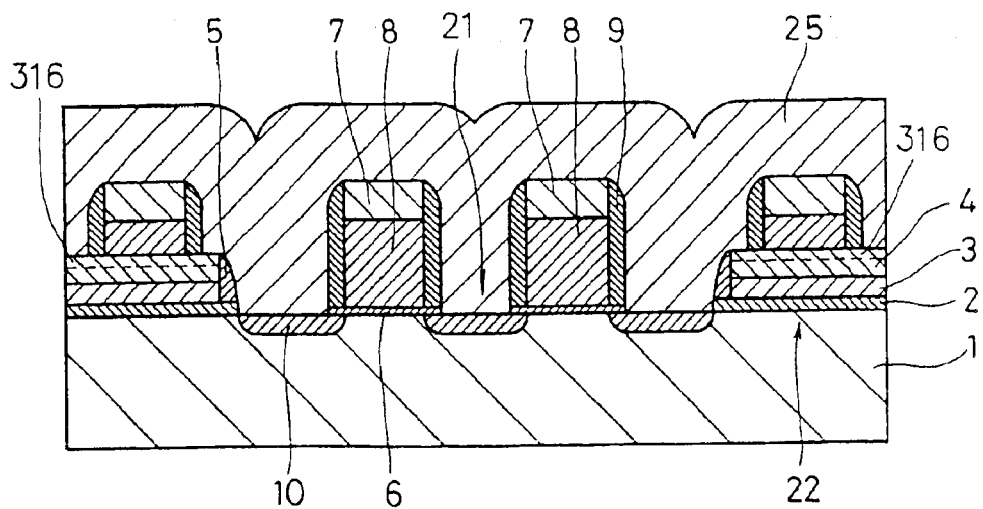

As shown in FIG. 1I, a polysilicon film 25 doped with phosphorus (P) is deposited on the entire surface including the field shield element isolation structures 22 by CVD. At this time, the phosphorus (P) in the polysilicon film 25 is diffused into the element formation region 21 of the p-type silicon semiconductor substrate 1 on both sides of the gate electrodes 8, so that each diffusion layer 10 serving as the source/drain of the MOS transistor is formed.

Figure 1J:
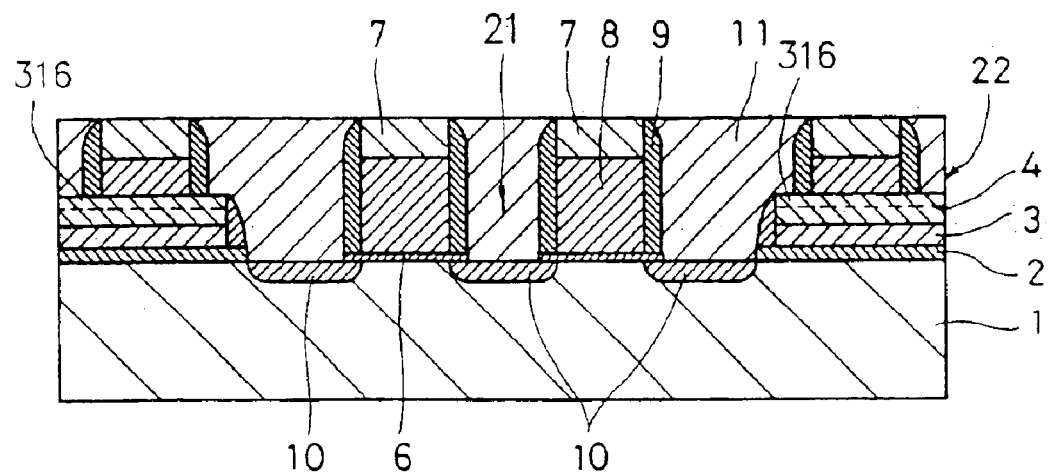

As shown in FIG. 1J, using the silicon oxide films 7 serving as cap insulating films of the field shield element isolation structures 22 as stoppers, the polysilicon film 25 is surface-polished by chemical mechanical polishing (CMP) until the silicon oxide films 7 are exposed, thereby planarizing the surface.

Figure 1K:
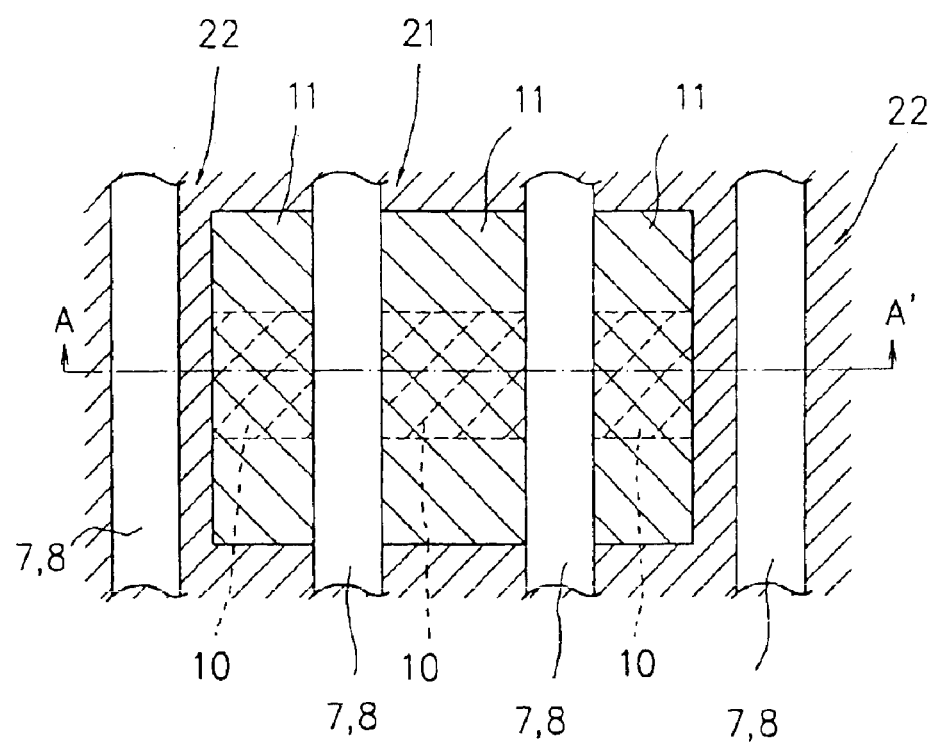

The only use of the polishing of the polysilicon film 25 may leave the film 25 to extend across the element formation region 21, resulting in connection between the diffusion layers 10. The polysilicon film 25 therefore must be separated to correspond to individual diffusion layers 10. Hence, as shown in FIG. 1K (a section taken along a line A–A' in FIG. 1K corresponds to FIG. 1J), photolithography and dry etching are performed to separate the planarized polysilicon film 25 on the field shield element isolation structures 22 in correspondence with the diffusion layers 10. The separation width of the polysilicon film 25 may be larger than the exposure limit in photolithography. At this time, the polysilicon film 25 is separated by the silicon oxide film 7 in units of diffusion layers 10 so that pad polysilicon films 11 are formed. Each pad polysilicon film 11 is electrically connected to only one diffusion layer 10.

Although not illustrated, insulating interlayers, contact holes, and metal wiring layers are formed subsequently, thereby completing the MOS transistor.

As described above, in the method of manufacturing the semiconductor device according to the first embodiment, the polysilicon film 24 is planarized by CMP and then patterned. With this process, the polysilicon films 24 whose upper surfaces are almost flush with each other are left on the element formation regions 21 and field shield element isolation structures 22 to form the gate electrodes (gate wiring layers) 8. Thereafter, the polysilicon film 25 is formed and subjected to CMP. With this process, the pad polysilicon films 11 each electrically connected to the diffusion layer 10 in the element formation region 21 are formed to self-align the gate electrodes (gate wiring layers) 8. Therefore, the width of the gate electrode (gate wiring layer) 8 can be reduced to the exposure limit of, e.g., photolithography independently of the designed size of the pad polysilicon film 11, thus allowing micropatterning and high integration of the gate electrodes (gate wiring layers) 8.

-Second Embodiment-

The second embodiment will be described next. As in the first embodiment, the structure of a MOS transistor and a manufacturing method therefor will be described together. The second embodiment is slightly different in the surface polishing method. A detailed description of the same steps as in the first embodiment will be omitted. The same reference numerals as in the first embodiment denote the same constituent elements in the second embodiment, and a detailed description thereof will be omitted.

In the second embodiment, in steps shown in FIGS. 1E and 1F of the above-described first embodiment, to easily and properly control polishing of a polysilicon film 24, silicon oxide films 4 serving as cap insulating films of field shield element isolation structures 22 are used as stoppers. When the cap insulating film is formed as an multilayered insulating film consisting of the silicon oxide film 4 and a silicon nitride film 316, the silicon nitride film 316 is used as a stopper.

Figure 2A:
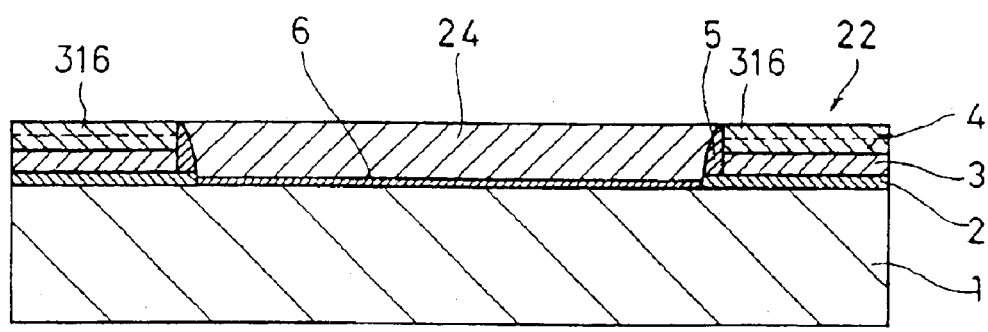

As shown in FIG. 2A, the polysilicon film 24 deposited on the entire surface including the field shield element isolation structures 22 is surface-polished by, e.g., CMP until the silicon oxide films 4 of the field shield element isolation structures 22 are exposed (for the multilayered insulating film consisting of the silicon oxide film 4 and the silicon nitride film 316, until the silicon nitride film 316 is exposed), thereby planarizing the surface.

Figure 2B:
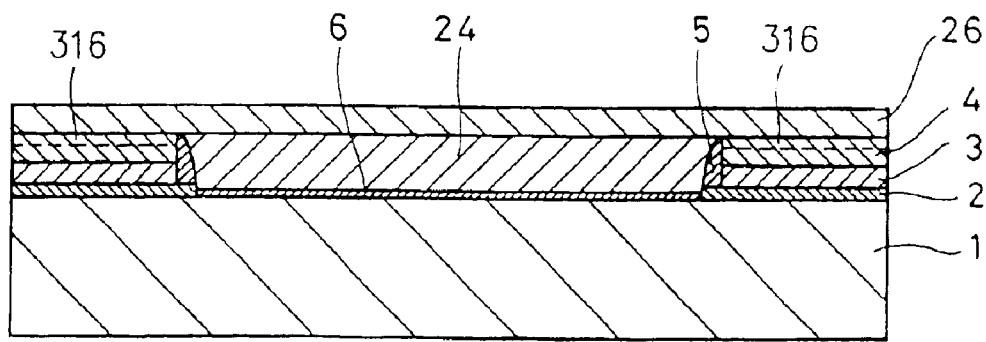

As shown in FIG. 2B, a polysilicon film 26 having a predetermined thickness is deposited on the exposed field shield element isolation structures 22 and the polysilicon film 24 by CVD, thereby burying the field shield element isolation structures 22 with the polysilicon films 24 and 26.

A silicon oxide film 7 is deposited on the surface of the planarized polysilicon film 26 by CVD. As shown in FIG. 2C, the polysilicon films 24 and 26 and the silicon oxide film 7 are patterned by photolithography and dry etching to form gate electrodes (gate wiring layers) 8 each having a predetermined shape on an element formation region 21 and field shield element isolation structures 22 such that the upper surfaces of the gate electrodes 8 are on almost the same plane, i.e., the upper surfaces are almost flush with each other.

Before formation of the silicon oxide film 7, a silicide layer of a refractory metal such as tungsten (W) may be formed on the planarized polysilicon film 26 by sputtering to form a polycide layer consisting of the polysilicon film 26 and the silicide layer.

To form the polycide layer, the multilayered insulating film formed by sequentially depositing the silicon oxide film 4 and the silicon nitride film 316 is preferably used as the cap insulating film of the field shield element isolation structure 22. More specifically, when the silicon oxide film 4 is exposed to the surface of the cap insulating film, and the tungsten silicide layer is formed immediately above the silicon oxide film 4, the tungsten silicide layer is readily peeled. However, when the silicon nitride film 316 is exposed to the surface of the cap insulating film, and the tungsten silicide layer is formed immediately above the silicon nitride film 316, the contact area between the tungsten silicide layer and the oxide layer becomes small. Peeling of the tungsten silicide layer from the cap insulating film is prevented because of the tensile stress between the tungsten silicide layer and the silicon nitride film 316. In this case, a polycide gate having a high adhesion strength between the polycide layer and the cap insulating film is formed. The stresses of the respective materials are as follows in term of tensile stress. WSi: $1\times10^{10}$ (dyne/cm$^2$), SiN: $1\times10^{10}$ (dyne/cm$^2$), and SiO$_2$: $4\times10^9$ (dyne/cm$^2$).

As shown in FIG. 2D, a silicon oxide film is deposited on the entire surface by CVD to cover the gate electrodes (gate wiring layers) 8 consisting of the polysilicon films 24 and 26 on the element formation region 21 and the field shield element isolation structures 22. Next, the entire surface of the silicon oxide film is anisotropically dry-etched by, e.g., RIE to remove gate oxide films 6 between the gate electrodes 8 in the element formation region 21. The silicon oxide film is left only on the side walls of the gate electrodes 8 to form side wall protective films 9.

A polysilicon film doped with phosphorus (P) is deposited on the entire surface including the field shield element isolation structures 22 by CVD. At this time, the phosphorus (P) in the polysilicon film is diffused into the element formation region 21 of the silicon semiconductor substrate 1 on both sides of the gate electrodes 8, so that each diffusion layer 10 serving as the source/drain of the MOS transistor is formed.

Next, using the silicon oxide films 7 serving as cap insulating films of the gate electrodes (gate wiring layers) 8 as stoppers, the polysilicon film is surface-polished by chemical mechanical polishing (CMP) until the silicon oxide films 7 are exposed, thereby planarizing the surface.

The only use of the polishing of the polysilicon film 25 may leave the film 25 to extend across the element formation region 21, resulting in connection between the diffusion layers 10. The polysilicon film 25 therefore must be separated to correspond to individual diffusion layers 10. Hence, photolithography and dry etching are performed to separate the planarized polysilicon film 25 on the field shield element isolation structures 22 in correspondence with the diffusion layers 10. The separation width of the polysilicon film 25 may be larger than the exposure limit in photolithography. At this time, the polysilicon film 25 is separated by the silicon oxide film 7 in units of diffusion layers 10 so that pad polysilicon films 11 are formed. Each pad polysilicon film 11 is electrically connected to only one diffusion layer 10.

In the second embodiment as well, the polysilicon films 24 whose upper surfaces are almost flush with each other are left on the element formation regions 21 and field shield element isolation structures 22 to form the gate electrodes (gate wiring layers) 8, as in the first embodiment. Thereafter, the polysilicon film is formed and subjected to CMP. With this process, the pad polysilicon films 11 each electrically connected to the diffusion layer 10 in the element formation region 21 are formed to self-align the gate electrodes (gate wiring layers) 8. Therefore, the width of the gate electrode (gate wiring layer) 8 can be reduced to the exposure limit of, e.g., photolithography independently of the designed size of the pad polysilicon film 11, thus allowing micropatterning and high integration of the gate electrodes 8 (gate wiring layers).

In the first and second embodiments, the element isolation structure may be formed not as a field shield element isolation structure by the field shield element isolation method but as a field oxide film by so-called LOCOS. More specifically, as shown in FIG. 3, field oxide films 31 are formed in the element isolation regions as element isolation structures to demarcate the element formation region 21 surrounded by the field oxide films 31. The gate electrodes (gate wiring layers) 8 are formed on the element formation region 21 and the field oxide films 31 in the above-described manner, thereby forming the pad polysilicon films 11.

-Third Embodiment-

The third embodiment of the present invention will be described below. In the third embodiment, an example in which a semiconductor device according to the present invention and a manufacturing method therefor are applied to a MOS transistor will be described, as in the first embodiment. In the third embodiment, the structure of the MOS transistor and steps in manufacturing the MOS transistor will be described together. FIGS. 4A to 4G are schematic sectional views showing steps in manufacturing the MOS transistor of the third embodiment.

First, p- and n-type wells are formed in the surface region of a p-type silicon semiconductor substrate.

Figure 4A:
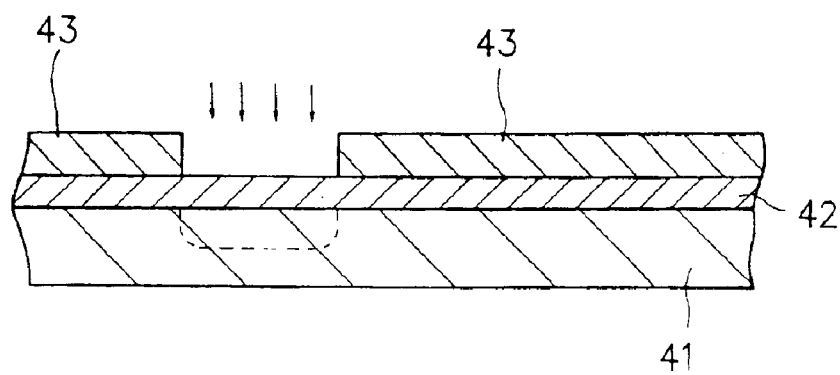
FIGS. 4A to 4G are schematic sectional views showing steps in manufacturing a MOS transistor according to the third embodiment.

More specifically, as shown in FIG. 4A, the entire surface of a p-type silicon semiconductor substrate 41 is subjected to thermal oxidation to form a silicon oxide film (so-called preoxide film) 42 having a thickness of about 1,000 to 5,000 Å. A resist 43 is applied to the surface of the silicon oxide film 42. The resist 43 at a portion where the n-type well is to be formed in the silicon semiconductor substrate 41 is removed by photolithography to expose the silicon oxide film 42. An n-type impurity, e.g., phosphorus (P) is ion-implanted into the surface region of the silicon semiconductor substrate 41 through the exposed portion of the silicon oxide film 42 at an acceleration energy of 100 to 150 (keV) and a dose of $10^{12}$ to $10^{13}$ ($cm^{-2}$).

Figure 4B:
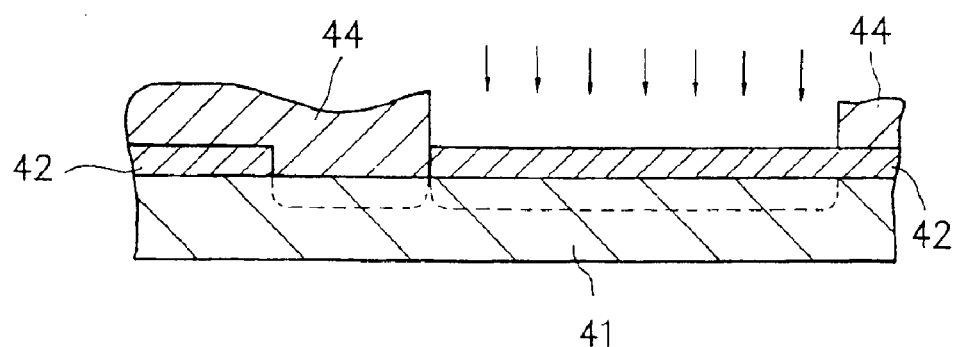

As shown in FIG. 4B, the silicon oxide film 42 is dry-etched using the resist 43 as a mask to remove the silicon oxide film 42 at a portion corresponding to the n-type well, thereby exposing the surface of the silicon semiconductor substrate 41. The resist 43 is removed by, e.g., ashing. A resist 44 is applied to the entire surface of the silicon oxide film 42 including the exposed surface of the silicon semiconductor substrate 41. The resist 44 at a portion where a p-type well is to be formed in the silicon semiconductor substrate 41 is removed by photolithography to expose the silicon oxide film 42. A p-type impurity, e.g., boron (B) is ion-implanted into the surface region of the silicon semiconductor substrate 41 through the exposed portion of the silicon oxide film 42 at an acceleration energy of 50 to 100 (keV) and a dose of $10^{12}$ to $10^{13}$ ($cm^{-2}$).

Figure 4C:
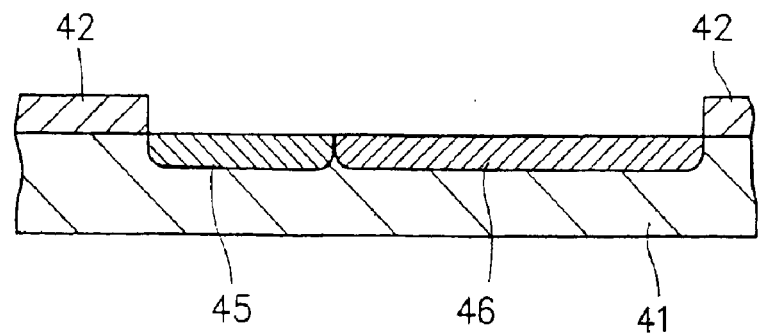

As shown in FIG. 4C, the resist 44 is removed by, e.g., ashing. Next, the silicon oxide film 42 is removed. At this time, using the fact that a large portion of the scribing line region of the silicon semiconductor substrate 41 does not contribute to element formation, the silicon oxide film 42 is subjected to photolithography and then to dry etching such that the silicon oxide film 42 is left on the scribing line region. The silicon semiconductor substrate 41 is annealed at 1,100° C. for 5 to 6 hours, thereby forming an n-type well 45 and a p-type well 46 in the surface of the silicon semiconductor substrate 41.

Figure 4D:
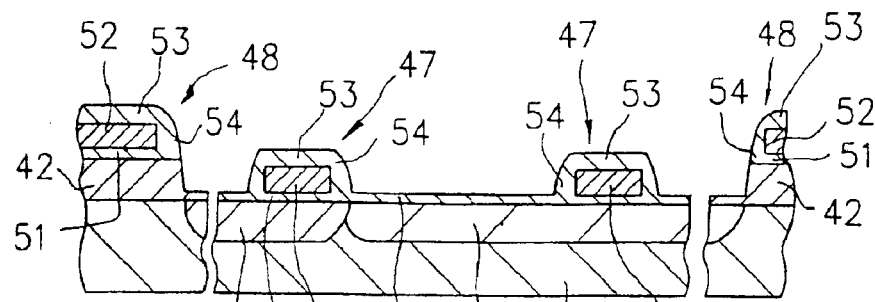

As shown in FIG. 4D, field shield element isolation structures 47 are formed on the silicon semiconductor substrate 41 by a field shield element isolation method.

More specifically, a silicon oxide film 51, a polysilicon film 52, and a silicon oxide film 53 are sequentially formed on the entire surface of the silicon semiconductor substrate 41 including the silicon oxide film 42 left in the scribing line region.

The silicon oxide film 51, the polysilicon film 52, and the silicon oxide film 53 are patterned by photolithography and dry etching to selectively remove these films. At this time, the silicon oxide film 51, the polysilicon film 52, and the silicon oxide film 53 are left on the silicon semiconductor substrate 41 to demarcate the element formation region. The silicon oxide film 51, the polysilicon film 52, and the silicon oxide film 53 are also left on the silicon oxide film 42.

A silicon oxide film is formed on the entire surface to cover the left silicon oxide film 51, polysilicon film 52, and silicon oxide film 53. The entire surface of the silicon oxide film is anisotropically dry-etched by, e.g., RIE to leave the silicon oxide only on the side walls of the silicon oxide film 51, the polysilicon film 52, and the silicon oxide film 53, thereby forming side wall protective films 54. With these processes, the field shield element isolation structures 47 each having a shield plate electrode consisting of the polysilicon film 52 surrounded by the silicon oxide films 51 and 53 and the side wall protective films 54 are formed in the element formation region. At the same time, step portions 48 formed of the layers which constitute the field shield element isolation structures 47 are formed on the silicon oxide films 42 in the scribing line regions. Since the thickness of the step portion 48 almost equals that of the field shield element isolation structure 47, the upper surface of the step portion 48 is formed at a level higher than that of the field shield element isolation structure 47 by the thickness of the silicon oxide film 42.

The exposed silicon semiconductor substrate 41 is subjected to thermal oxidation to form a gate oxide film 49 having a thickness of about 50 to 200 Å.

Figure 4E:
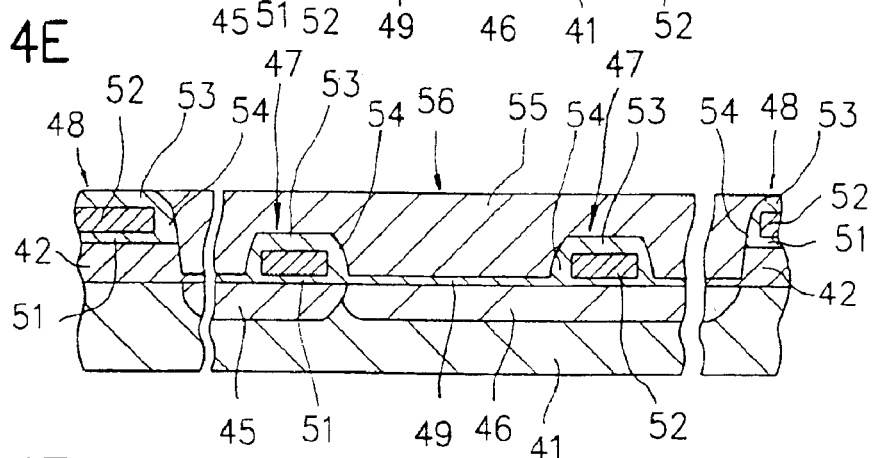

As shown in FIG. 4E, a polysilicon film 55 is formed on the entire surface of the silicon semiconductor substrate 41 including the step portions 48 by, e.g., CVD. The polysilicon film 55 is surface-polished by, e.g., chemical mechanical polishing (CMP), thereby planarizing the surface.

As illustrated, polishing is performed using the step portions 48 as stoppers such that the polysilicon film 55 is almost flush with the silicon oxide films 51 of the step portions 48. Upon completion of polishing, the upper surfaces of the step portions 48 and the upper surface of the polysilicon film 55 form a planarized surface 56. In this case, CMP is used to planarize the polysilicon film 55.

However, the polishing method is not limited to CMP, and the polysilicon film 55 may be anisotropically etched by, e.g., RIE. In both CMP and anisotropic etching, the silicon oxide film 53 is only slightly etched upon etching because of the difference in etching rate between the silicon oxide film 53 of the step portion 48 and the polysilicon film 55.

Figure 4F:
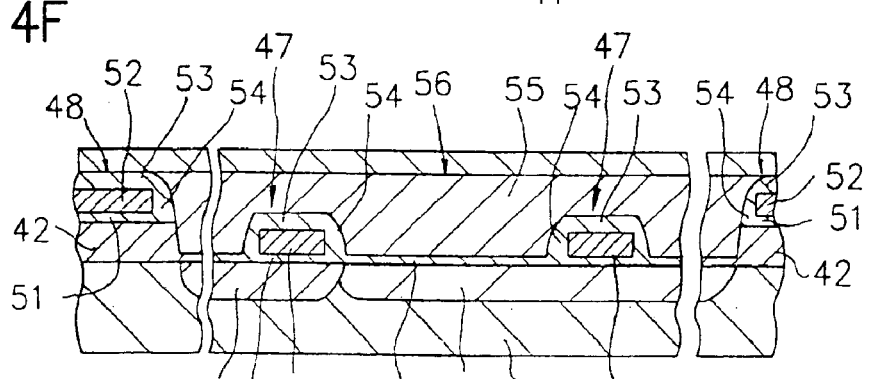

As shown in FIG. 4F, a silicon oxide film 57 is deposited on the step portions 48 and the polysilicon film 55, i.e., on the planarized surface 56 by, e.g., CVD. A resist is applied to the surface of the silicon oxide film 57, and a resist pattern having a predetermined shape is formed by photolithography. Before formation of the silicon oxide film 57, a refractory metal such as tungsten (W) may be deposited on the planarized surface 56 by sputtering to form a silicide layer on the polysilicon film 55.

Figure 4G:
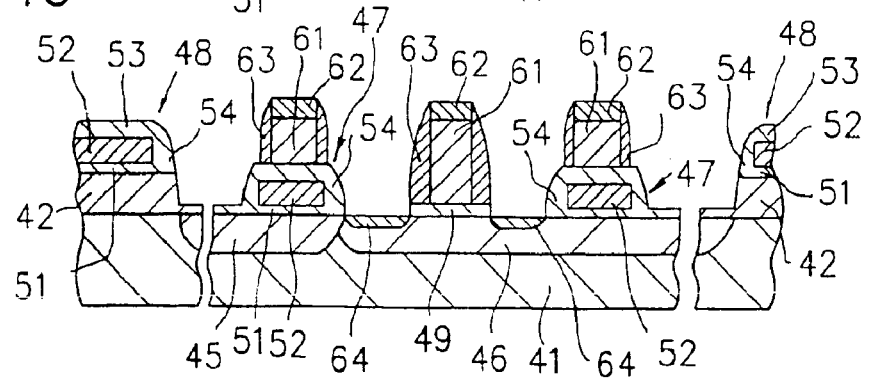
Figure 5:
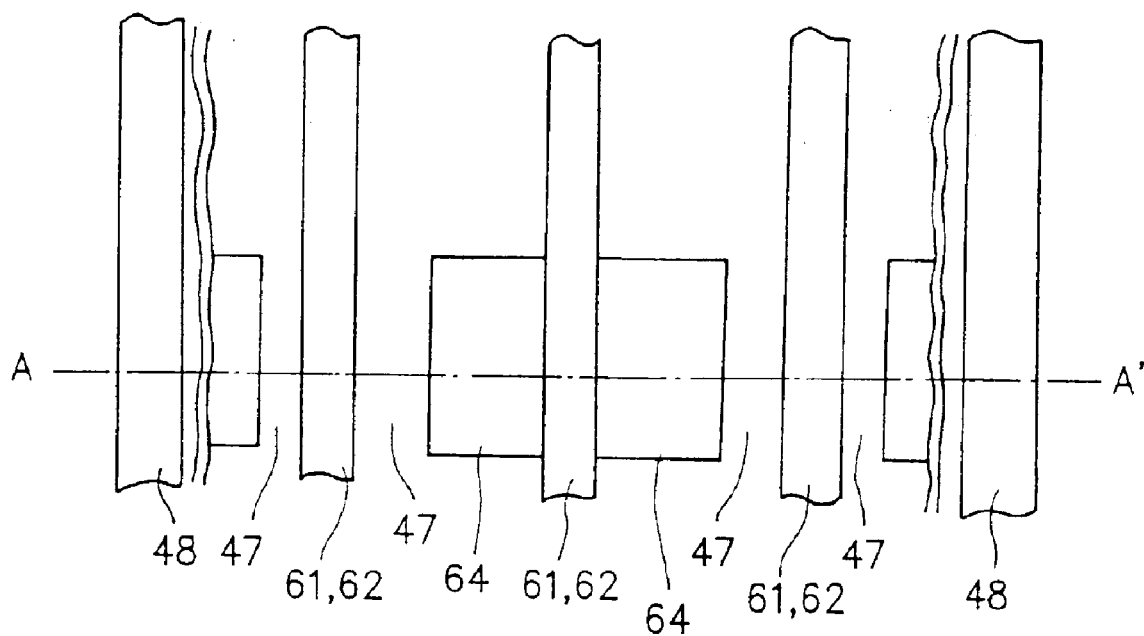
FIG. 5 is a schematic plan view showing the MOS transistor of the third embodiment.

The silicon oxide film 57 and the polysilicon film 55 are dry-etched using the resist pattern as a mask to leave the silicon oxide film 57 and the polysilicon film 55 into a shape based on the predetermined pattern on the gate oxide film 49 between the field shield element isolation structures 47 and on the field shield element formation regions 47. With this process, gate electrodes 61 and cap insulating films 62 of the gate electrodes 61 are formed, as shown in FIGS. 5 and 4G (sectional view taken along a line A–A' in FIG. 5). The gate electrodes 61 and the cap insulating films 62 on the field shield element isolation structures 47 are almost flush with those on the gate oxide film 49 of the element formation region.

A silicon oxide film is deposited to cover the gate electrodes 61 and the cap insulating films 62. The entire surface of the silicon oxide film is anisotropically etched to remove the gate oxide films 49 outside the gate electrode 61 formation portion in the element formation region, and at the same time, leave the silicon oxide film only on the side surfaces of the gate electrodes 61 and the cap insulating films 62 to form side wall protective films 63.

An n-type impurity is ion-implanted into the surface region of the silicon semiconductor substrate 41 on both sides of the gate electrode 61 in the element formation region using the cap insulating film 62 as a mask, thereby forming a pair of impurity diffusion layers 64.

Thereafter, insulating interlayers, contact holes (via holes), and various metal wiring layers are formed, thereby completing the MOS transistor.

As described above, in the method of manufacturing the MOS transistor according to-the third embodiment, the gate electrode 61 (and the cap insulating film 62) can be accurately formed into a predetermined shape. More specifically, the surfaces of the silicon oxide film 57 and polysilicon film 55 are planarized (into the planarized surface 56), and there are no steps left in the vicinity in photolithography for the resist applied to the planarized surface 56. For this reason, a desired resist pattern can be formed without generating any thinned resist pattern due to steps. In addition, the process margin in photolithography can increase to realize an increase in yield in the wafer process. Furthermore, since the polysilicon film 55 is formed as one layer, no foreign substance such as a residue upon etching is mixed into the interface between the polysilicon films of a multilayered polysilicon film, thus facilitating the process in etching.

In addition, in anisotropic etching of the polysilicon film 55, i.e., in formation of the gate electrode 61, since the polysilicon film 55 on the gate oxide film 49 has an almost uniform thickness, the gate oxide film 49 can be prevented from being partially overetched to expose the surface of the silicon semiconductor substrate 41.

Furthermore, the silicon oxide film 42 used for formation of the n- and p-type wells 45 and 46 in the silicon semiconductor substrate 41 is left on the scribing line region of the silicon semiconductor substrate 41 after formation of the n- and p-type wells 45 and 46. When CMP is performed for the polysilicon film 55 using the scribing line region which does not normally contribute to formation of the semiconductor device, the polysilicon film 55 can be filled between the scribing line regions in a self-aligned manner. With this arrangement, the resist can be prevented from being thinned, so that the gate electrode 61 can be easily and properly patterned into a desired shape.

In the third embodiment, as an element isolation structure for demarcating the element formation region on the silicon semiconductor substrate 41, the field shield element isolation structure 47 is formed. However, the present invention is not limited to this. For example, a region where the silicon oxide film 42 is left to form the step portion 48 may be used as a bonding pad region to which each wire is connected in place of the scribing line region.

Figure 6:
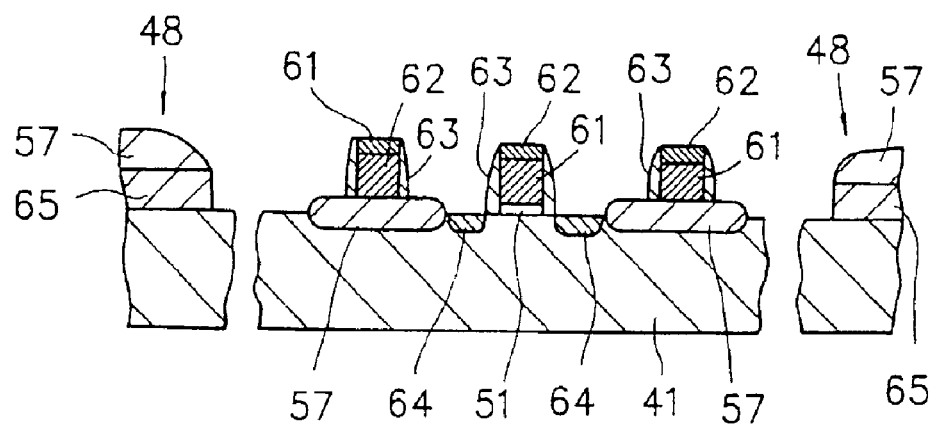
FIG. 6 is a schematic sectional view showing a case wherein an element isolation structure is formed as a field oxide film by LOCOS.

As shown in FIG. 6, a field oxide film 65 may be formed on the silicon semiconductor substrate 41 by so-called LOCOS as the element isolation structure. In this case, the polysilicon film 65 is formed in the scribing line region, and the field oxide film 57 is formed on the polysilicon film 65 and the silicon semiconductor substrate 41 by LOCOS.

In the forming process of the field oxide film 57, first, a silicon oxide film (not shown) and a silicon nitride film (not shown) are sequentially deposited on the entire surface the silicon semiconductor substrate 41 including the polysilicon film 65 formed in the scribing line region. The silicon nitride film formed in the element isolation region and the polysilicon film 65 is selectively removed therefrom. The remaining silicon nitride film serves as a mask to subject the silicon semiconductor substrate 41 to a thermal process in oxidization atmosphere for forming a field oxide film 57 on the element isolation region of the silicon semiconductor substrate 41 as well as on the polysilicon film 65. The silicon nitride film and the silicon oxide film are then removed in turn.

At this time, the step portions 48 are formed from the polysilicon film 65 and the field oxide film 57. Thereafter, as in formation of the field shield element isolation structure 47, the gate electrodes 61 and the cap insulating films 62 on the gate electrodes are formed to be flush between those, on the field oxide film 57 in the element formation region and on the silicon semiconductor substrate 41.

-Modification-

A modification of the third embodiment will be described. In the third embodiment, the scribing line regions are used to form the gate electrodes 61 whose upper surfaces on the gate oxide film 49 are flush with those on the field shield element isolation structures of the silicon semiconductor substrate 41, as described above. In this modification, various upper wiring layers at the upper portion of the semiconductor device are formed using step portions in the vicinity thereof. FIGS. 7A to 7E are schematic sectional views showing processes in forming a structure near the upper wiring layers. FIGS. 8A to 8C are schematic sectional views showing processes in forming a structure near a memory capacitor in DRAM formation.

Figure 7A:
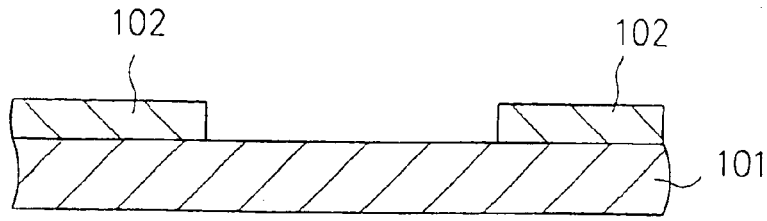
FIGS. 7A to 7E are schematic sectional views showing steps in forming a structure near an upper wiring layer of a MOS transistor according to a modification of the third embodiment.
Figure 8A:
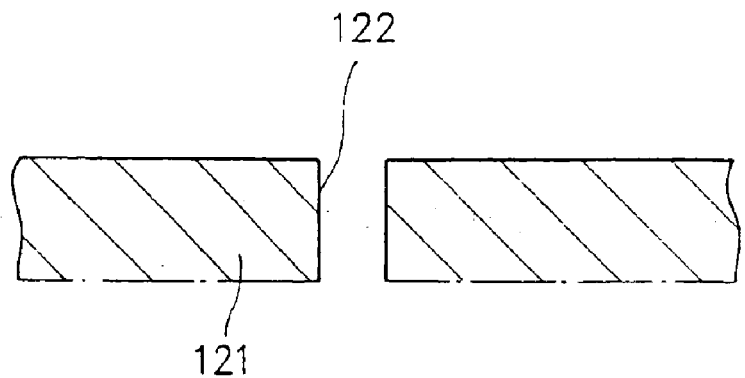
FIGS. 8A to 8E are schematic sectional views showing steps in forming a structure near a memory capacitor in DRAM formation of a MOS transistor according to a modification of the third embodiment.
Figure 8B:
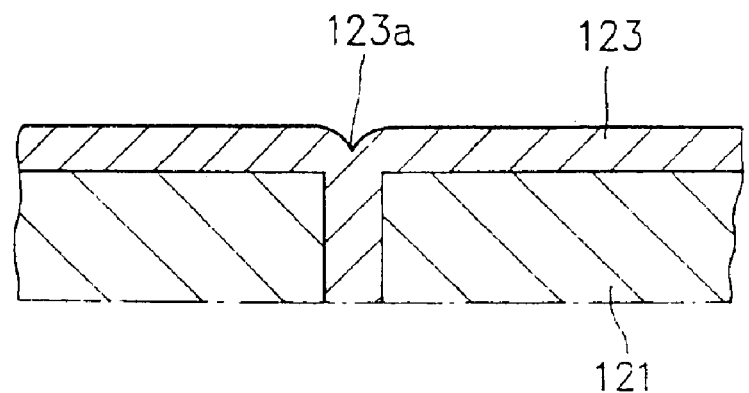
Figure 8C:
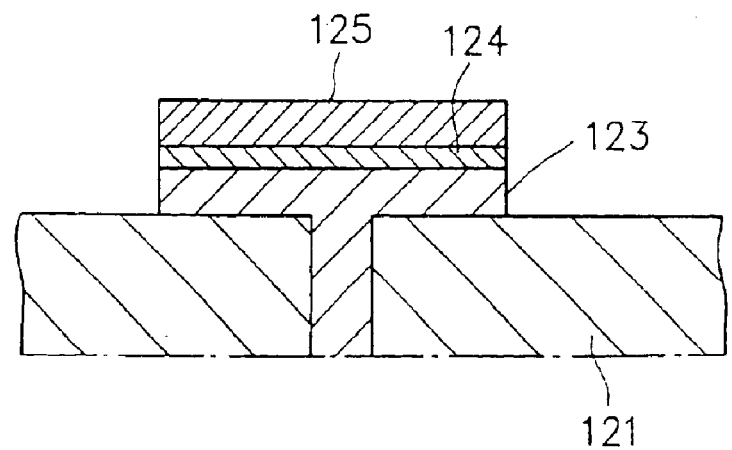

As shown in FIG. 7A, an insulating interlayer 101 consisting of, e.g., a silicon oxide film is deposited on a semiconductor device such as a MOS transistor by, e.g., CVD, and CMP is performed to planarize the surface.

Subsequently, a silicon oxide film 102 is deposited on the planarized insulating interlayer 101. The silicon oxide film 102 is subjected to photolithography and then to dry etching to leave the silicon oxide film 102 at portions separated by a predetermined interval. Various upper wiring layers (to be described later) are formed at the portion between the silicon oxide films 102.

Figure 7B:
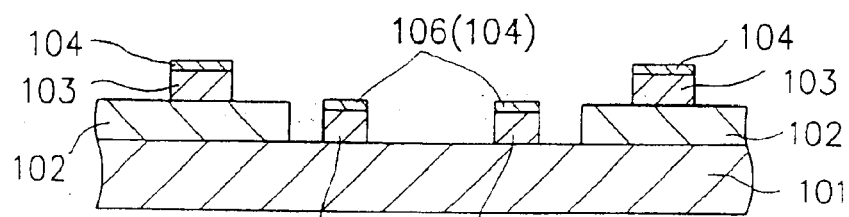

As shown in FIG. 7B, a conductive film 103 consisting of, e.g., an aluminum alloy and a silicon oxide film 104 are sequentially formed on the entire surface of the insulating interlayer 101 including the silicon oxide films 102. The silicon oxide film 104 and the conductive film 103 are subjected to photolithography and then to dry etching to leave the conductive film 103 and the silicon oxide film 104 on the insulating interlayer 101, thereby patterning wiring layers 105 and cap insulating films 106 of the wiring layers 105. At the same time, the conductive film 103 and the silicon oxide film 104 are also left on the silicon oxide films 102.

Figure 7C:
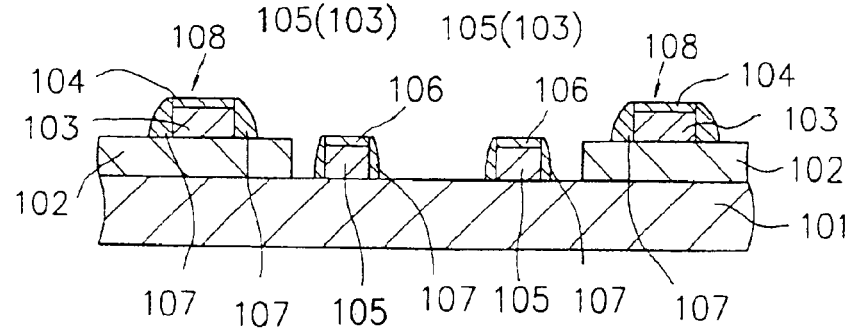

As shown in FIG. 7C, a silicon oxide film is deposited on the entire surface of the insulating interlayer 101 including the silicon oxide films 102. The entire surface of the silicon oxide film is anisotropically etched to leave the silicon oxide film only on the side surfaces of the wiring layers 105 and the cap insulating films 106 and on the side surfaces of the conductive films 103 and the silicon oxide films 104 on the silicon oxide films 102, thereby forming, on the insulating interlayer 101, side wall protective films 107 each surrounding the conductive film 103 and the silicon oxide film 104. At the same time, step portions 108 are formed on the silicon oxide films 102.

Figure 7D:
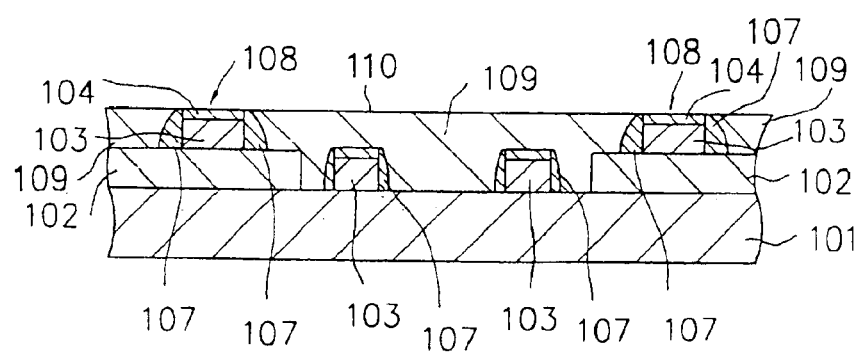

As shown in FIG. 7D, a polysilicon film 109 is deposited on the entire surface of the polysilicon film 109 including the step portions 108. The polysilicon film 109 is surface-polished by, e.g., chemical mechanical polishing (CMP), thereby planarizing the surface. As illustrated, polishing is performed using the step portions 108 as stoppers such that the polysilicon film 109 is almost flush with the silicon oxide films 104 of the step portions 108. Upon completion of polishing, the upper surfaces of the step portions 108 and the upper surface of the polysilicon film 109 form a planarized surface 110. In this case, CMP is used to planarize the polysilicon film 110. However, the polishing method is not limited to CMP, and the polysilicon film 109 may be anisotropically etched by, e.g., RIE. Regardless of CMP and anisotropic etching, the silicon oxide film 104 is only slightly etched upon etching because of the difference in etching rate between the silicon oxide film 104 of the step portion 108 and the polysilicon film 109.

Figure 7E:
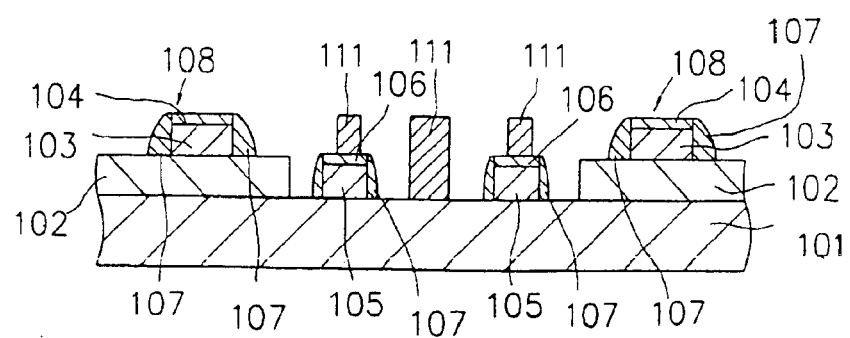

As shown in FIG. 7E, a resist is applied to the surface of the polysilicon film 109, and a resist pattern having a predetermined shape is formed by photolithography. The polysilicon film 109 is dry-etched using the resist pattern as a mask to leave the polysilicon film 109 into a shape based on the predetermined pattern on the insulating interlayer 101 between the wiring layers 105 and on cap insulating films 106, thereby forming upper wiring layers 111.

In this modification, after the surface of the insulating interlayer 101 is planarized, the silicon oxide film 102 is patterned at a predetermined position on the insulating interlayer 101. However, the process is not limited to this. For example, when step portions have already been formed on the insulating interlayer 101 when the insulating interlayer 101 is completed because of the underlying structure, these step portions may be positively used instead of forming the step portions 108 by patterning the silicon oxide film 102. The step portions may be used as stoppers to polish the polysilicon film 109 by, e.g., CMP.

Assume that the semiconductor device formed in the underlying layer is, e.g., a constituent element of a DRAM, e.g., a transistor or a memory capacitor. To easily planarize the insulating interlayer 101 to be formed on the upper layer to form more precise upper wiring layers, the memory capacitor may be formed in the following manner.

As shown in FIG. 8A, an insulating interlayer 121 consisting of, e.g., a silicon oxide film is deposited on the transistor of a DRAM (not shown) by, e.g., CVD. CMP is performed to planarize the surface.

A contact hole 122 is formed in the planarized insulating interlayer 121 to expose the surface of the impurity diffusion layer of the transistor formed in the lower layer.

As shown in FIG. 8B, a polysilicon film 123 is deposited on the insulating interlayer 121 by, e.g., CVD such that the contact hole is filled. At this time, a relatively small recessed portion 123a is formed in the surface of the polysilicon film 123 due to the presence of the contact hole 122 in the insulating interlayer 121.

This recessed portion 123a may adversely affect the insulating interlayer 101 of the upper layer. To prevent this, as shown in FIG. 8C, the polysilicon film 123 is polished by CMP to planarize the surface. Subsequently, a dielectric film 124 such as an ONO film and a polysilicon film 125 are sequentially deposited on the planarized polysilicon film 123 by, e.g., CVD. The polysilicon film 125, the dielectric film 124, and the polysilicon film 123 are subjected to photolithography and then to dry etching, thus completing a memory capacitor in which a storage node electrode consisting of the polysilicon film 123 opposes a cell plate electrode consisting of the polysilicon film 125 through the dielectric film 124.

Figure 8D:
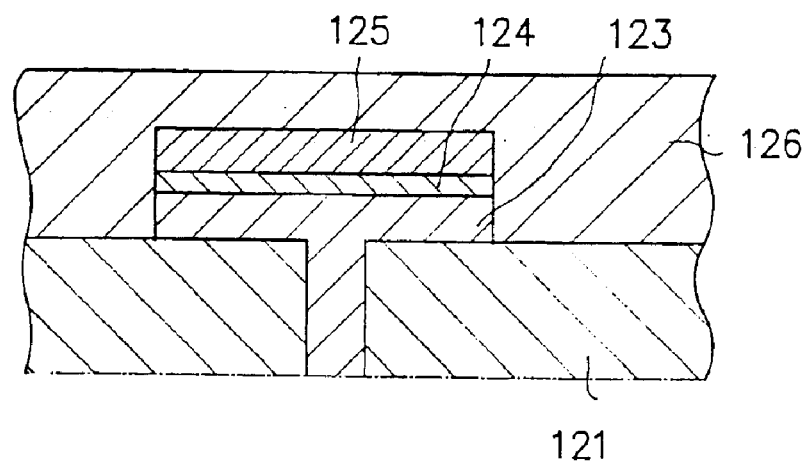

As shown in FIG. 8D, a silicon oxide film 126 is then deposited to cover the memory capacitor by, e.g. CVD with a film thickness predetermined by the total or more of thickness of the polysilicon film 123, dielectric film 124 and polysilicon film 125.

Figure 8E:
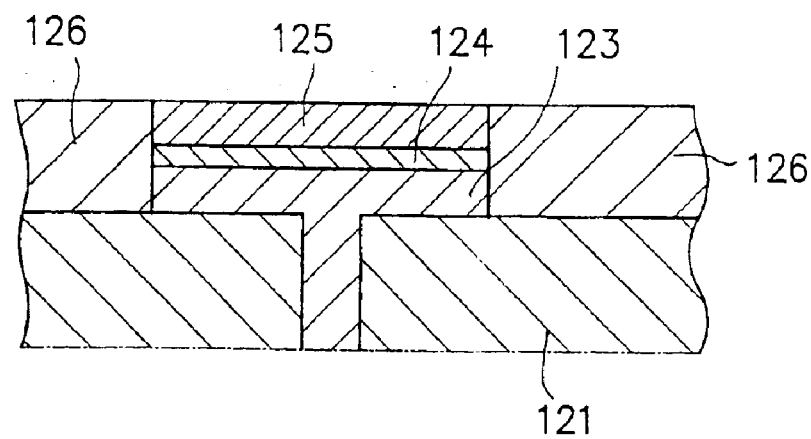

Thereafter, as shown in FIG. 8E, with using the polysilicon film 125 as a stopper, the silicon oxide film 126 is polished by CMP to planarize the surface until the surface of the polysilicon film 125 is exposed.

In this modification, the upper wiring layer 111 can be properly patterned into a predetermined shape. More specifically, the surface of the polysilicon film 109 is planarized (into the planarized surface 110), and there are no steps left in the vicinity of the resist applied to the planarized surface 110 on photolithography process thereto. For this reason, a desired resist pattern can be formed without generating any thinned resist pattern due to steps. In addition, the process margin in photolithography can increase to realize an increase in yield in the wafer process. Furthermore, since the polysilicon film 109 is formed as one layer, no foreign substance such as a residue upon etching is mixed into the interface between the polysilicon films of a multilayered polysilicon film 109, thus facilitating the process in etching.

-Fourth Embodiment-

The fourth embodiment of the present invention will be described below. In the fourth embodiment, an example in which a semiconductor device according to the present invention and a manufacturing method therefor are applied to a MOS transistor will be described, as in the third embodiment. In the fourth embodiment, the structure of the MOS transistor and steps in manufacturing the MOS transistor will be described together. FIGS. 9A to 9D are schematic sectional views showing steps in manufacturing this MOS transistor.

Figure 9A:
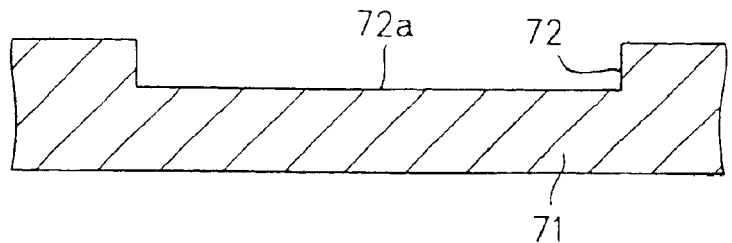
FIGS. 9A to 9D are schematic sectional views showing steps in manufacturing a MOS transistor according to the fourth embodiment.

As shown in FIG. 9A, one major surface of a silicon semiconductor substrate 71 is subjected to photolithography and then to etching to form a groove portion 72 having a predetermined depth in the major surface. A bottom surface 72a in the groove portion 72 corresponds to an element region where element isolation structures and gate electrodes (both will be described later) are formed.

Figure 9B:
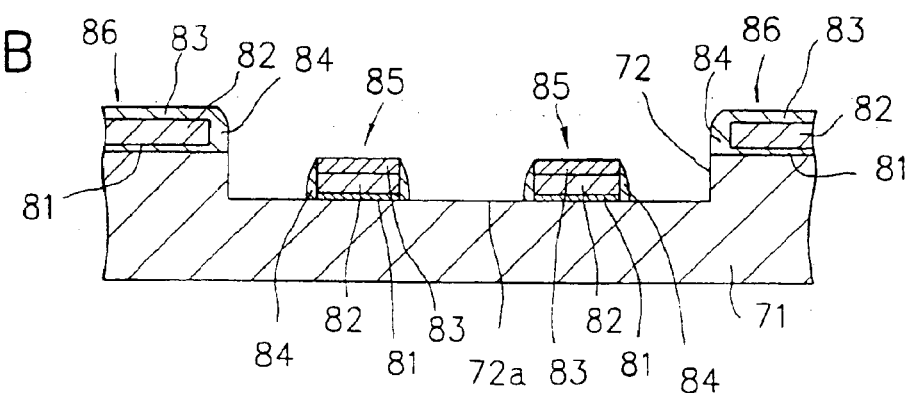

As shown in FIG. 9B, field shield element isolation structures 85 are formed on the silicon semiconductor substrate 71 by a field shield element isolation method.

More specifically, a silicon oxide film 81, a polysilicon film 82, and a silicon oxide film 83 are sequentially formed on the entire surface of the silicon semiconductor substrate 71 including the groove portion 72.

The silicon oxide film 81, the polysilicon film 82, and the silicon oxide film 83 are patterned by photolithography and dry etching to selectively remove these films. At this time, the silicon oxide film 81, the polysilicon film 82, and the silicon oxide film 83 are left on the bottom surface 72a in the groove portion 72, thereby demarcating the element formation region. At the same time, the silicon oxide film 81, the polysilicon film 82, and the silicon oxide film 83 are also left in the vicinity of the groove portion 72 on the silicon semiconductor substrate 71.

A silicon oxide film is formed on the entire surface to cover the left silicon oxide film 81, polysilicon film 82, and silicon oxide film 83. The entire surface of the silicon oxide film is anisotropically dry-etched by, e.g., RIE to leave the silicon oxide film only on the side walls of the silicon oxide films 81, the polysilicon films 82, and the silicon oxide films 83, thereby forming side wall protective films 84. With these processes, field shield element isolation structures 85 each having a shield plate electrode consisting of the polysilicon film 82 surrounded by the silicon oxide films 81 and 83 and the side wall protective film 84 are formed in the element formation region on the bottom surface 72a. At the same time, step portions 86 formed of the layers which constitute the field shield element isolation structures 85 are formed near the groove portion 72 on the silicon semiconductor substrate 71. Since the height of the step portion 86 from the silicon semiconductor substrate 71 almost equals the thickness of the field shield element isolation structure 85, the upper surface of the step portion 86 is formed at a level higher than that of the field shield element isolation structure 85 by the depth of the groove portion 72.

The exposed bottom surface 72a in the groove portion 72 is subjected to thermal oxidation to form a gate oxide film 87 having a thickness of about 50 to 200 Å.

Figure 9C:
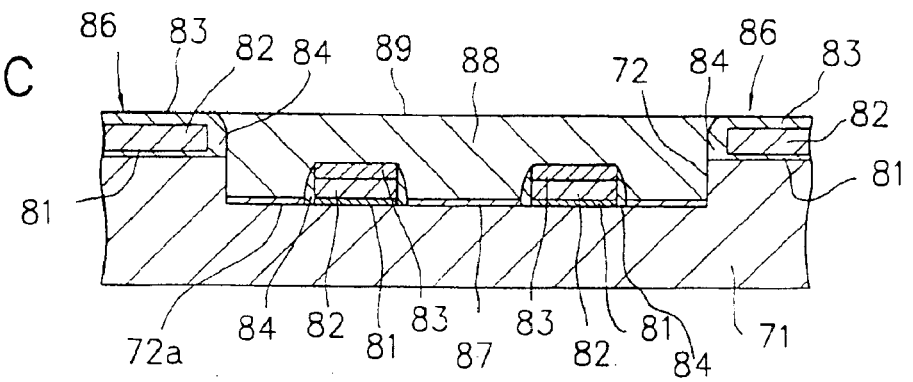

As shown in FIG. 9C, a polysilicon film 88 is deposited to fill the groove portion 72 and cover the entire surface of the silicon semiconductor substrate 71 including the step portions 86 by, e.g., CVD. The polysilicon film 88 is surface-polished by, e.g., chemical mechanical polishing (CMP), thereby planarizing the surface. As illustrated, polishing is performed using the step portions 86 as stoppers such that the polysilicon film 88 is almost flush with the silicon oxide films 83 of the step portions 86. Upon completion of polishing, the upper surfaces of the step portions 86 and the upper surface of the polysilicon film 88 form a planarized surface 89. In this case, CMP is used to planarize the polysilicon film 88. However, the polishing method is not limited to CMP, and the polysilicon film 88 may be anisotropically etched by, e.g., RIE. Regardless of CMP and anisotropic etching, the silicon oxide film 83 is only slightly etched upon etching because of the difference in etching rate between the silicon oxide film 83 of the field shield element isolation structure 85 and the polysilicon film 88. Therefore, the element isolation characteristics of the field shield element isolation structure 85 are not affected.

Figure 9D:
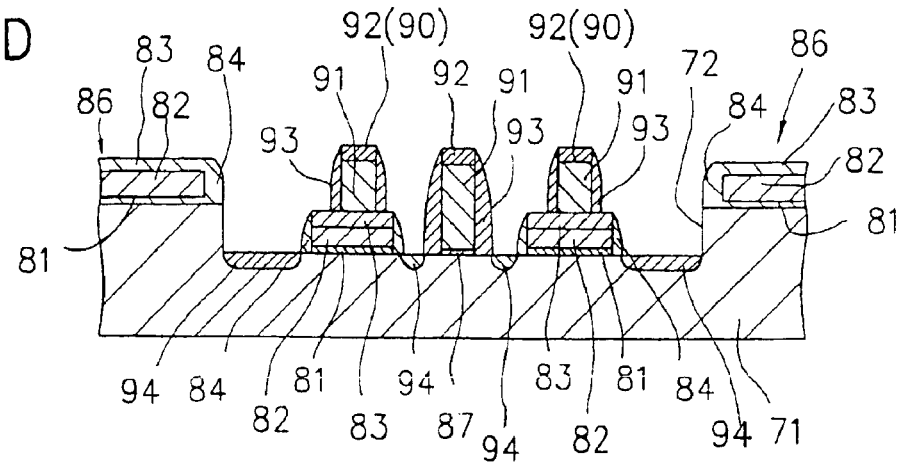

As shown in FIG. 9D, a silicon oxide film 90 is deposited on the step portions 86 and the polysilicon film 89, i.e., on the planarized surface 89 by, e.g., CVD. Before formation of the silicon oxide film 90, a refractory metal such as tungsten (W) may be deposited on the planarized surface 89 by sputtering to form a silicide layer on the polysilicon film 88.

A resist is then applied to the surface of the silicon oxide film 90, and a resist pattern having a predetermined shape is formed by photolithography. The silicon oxide film 90 and the polysilicon film 88 are dry-etched using the resist pattern as a mask to leave the silicon oxide film 90 and the polysilicon film 88 into a shape based on the predetermined pattern on the gate oxide film 87 between the field shield element isolation structures 85 and on the field shield element isolation structure 85, thereby forming gate electrodes 91 and cap insulating films 92 of the gate electrodes 91. When the silicide layer is formed, the gate electrodes 91 are formed as polycide layers. The gate electrodes 91 and the cap insulating films 92 on the field shield element isolation structures 85 are almost flush with those on the gate oxide film 87 in the element formation region.

A silicon oxide film is deposited to cover the gate electrodes 91 and the cap insulating films 92. The entire surface of the silicon oxide film is anisotropically etched to remove the gate oxide films 87 outside the gate electrode 91 formation portion in the element formation region, and at the same time, leave the silicon oxide film only on the side surfaces of the gate electrodes 91 and the cap insulating films 92 to form side wall protective films 93.

An n-type impurity is ion-implanted into the surface region of the silicon semiconductor substrate 71 on both sides of the gate electrode 91 in the element formation region using the cap insulating film 62 as a mask, thereby forming a pair of impurity diffusion layers 94.

Thereafter, insulating interlayers, contact holes (via holes), and various metal wiring layers are formed, thereby completing the MOS transistor.

As described above, in the method of manufacturing the MOS transistor according to the fourth embodiment, the gate electrode 91 (and the cap insulating film 92) can be accurately formed into a predetermined shape. More specifically, the surfaces of the silicon oxide film 90 and polysilicon film 88 are planarized (into the planarized surface 89), and there are no steps left in the vicinity of the resist applied to the planarized surface 89 on photolithography process thereto. For this reason, a desired resist pattern can be formed without generating any thinned resist pattern due to steps. In addition, the process margin in photolithography can increase to realize an increase in yield in the wafer process. Furthermore, since the polysilicon film 88 is formed as one layer, no foreign substance such as a residue upon etching is mixed into the interface between the polysilicon films of a multilayered polysilicon film, thus facilitating the process in etching.

In addition, in anisotropic etching of the polysilicon film 88, i.e., in formation of the gate electrode 91, since the polysilicon film 88 on the gate oxide film 87 has an almost uniform thickness, the gate oxide film 87 can be prevented from being partially overetched to expose the surface of the silicon semiconductor substrate 71.

Furthermore, the surface of the silicon semiconductor substrate 71 around the groove portion 72 is used as a stopper for CMP to the polysilicon film 88. With this arrangement, the polysilicon film 88 can be filled in the groove portion in a self-aligned manner. The resist can be prevented from being thinned, so that the gate electrode 91 can be easily and properly patterned into a desired shape.

-Fifth Embodiment-

A specific embodiment in which a method of manufacturing a semiconductor device according to the present invention is applied to manufacture a MOS transistor having a gate length of about 0.5 µm will be described below in detail with reference to the accompanying drawings.

FIGS. 10A to 10K are schematic sectional views showing steps in manufacturing the MOS transistor of the fifth embodiment.

As shown in FIG. 10A, field shield element isolation structures 203 are formed in field regions on, e.g., a p-type silicon semiconductor substrate 201 by a so-called field shield element isolation method, thereby demarcating an element formation region 202.

More specifically, a silicon oxide film, a polysilicon film, and a silicon oxide film are sequentially formed on the silicon semiconductor substrate 201 to thicknesses of, e.g., 50 nm, 200 nm, and 200 nm, respectively.

The silicon oxide film, the polysilicon film, and the silicon oxide film are patterned by photolithography and dry etching to selectively remove these films, thereby demarcating the element formation region 202.

A silicon oxide film is formed on the entire surface to cover the left silicon oxide film, polysilicon film, and silicon oxide film. The entire surface of the silicon oxide film is anisotropically dry-etched by, e.g., RIE to leave the silicon oxide film only on the side walls of the silicon oxide films, the polysilicon films, and the silicon oxide films, thereby forming side wall protective films. With these processes, the field shield element isolation structures 203 each having a polysilicon film 205 functioning as a shield plate electrode and surrounded by silicon oxide films 204a and 204b and the side wall protective film 204c are formed in the field regions.

In this case, the field shield element isolation structure 203 is formed as an element isolation structure. However, in place of the field shield element isolation structure 203, a field oxide film may be formed in the field region by so-called LOCOS.

The surface of the silicon semiconductor substrate 201 on each of the element formation regions 202 which are separated from each other by the field shield element isolation structures 203 and demarcated relative to the field shield element isolation structures 203 is thermally oxidized to form a gate oxide film 206 having a thickness of about 15 nm.

As shown in FIG. 10B, a polysilicon film 211 doped with an impurity is formed on the entire surface including the field shield element isolation structures 203 by CVD at a temperature of 580° C. The polysilicon film 211 must be deposited to a thickness for burying the field shield element isolation structures 203 in the polysilicon film 211. Considering that the height of the field shield element isolation structure 203 is about 450 nm, the polysilicon film 211 is formed to a thickness of about 600 nm.

As shown in FIG. 10C, the polysilicon film 211 is surface-polished by, e.g., chemical mechanical polishing (CMP) at a rotation speed of 70 rpm and a pressure of 30 mgf/cm², thereby planarizing the surface of the polysilicon film 211. As illustrated, planarization is performed while leaving the polysilicon film 211 having a predetermined thickness on the field shield element isolation structures 203. CMP is a polishing method using a slurry of a predetermined chemical fluid and abrasive. This method allows highly precise planarization by eliminating even a step on the millimeter order to suppress, e.g., the surface step to about 0.05 µm.

As shown in FIG. 10D, a silicon nitride film 212 is deposited on the planarized surface of the polysilicon film 211 to a thickness of about 200 nm by CVD at a temperature of 750° C. A silicon oxide film 213 is deposited on the silicon nitride film 212 to a thickness of about 250 nm by CVD at a temperature of 675° C. The silicon oxide film 213 formed on the silicon nitride film 212 may be formed as a plasma-CVD silicon oxide film by plasma CVD. Before formation of the silicon nitride film 212, a refractory metal such as tungsten (W) may be deposited on the polysilicon film 211 by sputtering to form a silicide layer.

As shown in FIG. 10E, a photoresist is applied to the surface of the silicon oxide film 213 and subjected to photolithography to form a mask 214 having a predetermined pattern. The silicon nitride film 212 and the silicon oxide film 213 are anisotropically dry-etched using the mask 214 to pattern these films into a predetermined electrode shape. More specifically, this dry etching is performed using a conventional parallel plate etching chamber and $CF_4/Ar$ as etching gases. The gas flow rate ratio is $CF_4/Ar$ =120/800 sccm, the pressure is 1.7 Torr, and the applied power is 750 W.

The mask 214 is removed by ashing using, e.g., $O_2$ plasma. As shown in FIG. 10F, the silicon oxide films 213 each having the electrode shape are used as masks to anisotropically dry-etch the polysilicon film 211, thereby patterning the polysilicon film 211 into an electrode shape.

Gate electrodes (gate wiring layers) 207 whose upper surfaces are on the almost same plane, i.e. almost flush with each other are formed into a predetermined electrode shape on the element formation region 202 and on the field shield element isolation structures 203. When the silicide film is formed, the gate electrodes (gate wiring layers) 207 are formed as polycide films. More specifically, this dry etching is performed using a conventional parallel plate etching chamber and $He/HBr/Cl_2$ as etching gases. The gas flow rate ratio is $He/HBr/Cl_2$=400/15/200 sccm, the pressure is 425 Torr, and the applied power is 225 W.

Figure 10G:
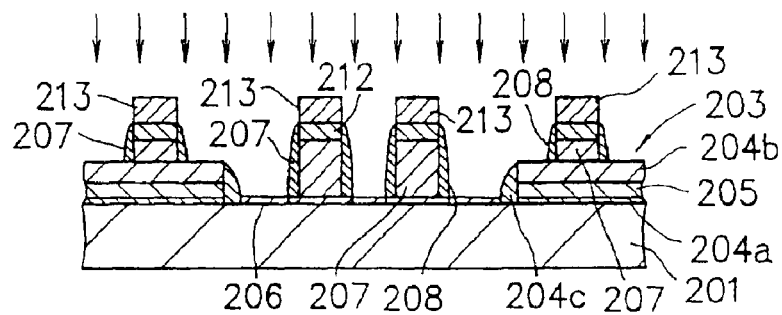

As shown in FIG. 10G, a silicon nitride film is deposited on the entire surface to a thickness of about 200 nm by CVD at a temperature of 750° C. to cover the gate electrodes (gate wiring layers) 207 on the element formation region 202 and on the field shield element isolation structures 203. The entire surface of the silicon nitride film is anisotropically dry-etched to leave the silicon nitride film only on the side walls of the gate electrodes (gate wiring layers) 207 and the silicon nitride films 212, thereby forming side wall protective films 208. More specifically, this dry etching is performed using a conventional parallel plate etching chamber and $CF_4/Ar$ as etching gases. The gas flow rate ratio is $CF_4/Ar$=120/800 sccm, the pressure is 1.7 Torr, and the applied power is 750 W. At this time, each gate electrode (gate wiring layer) 207 is covered with the silicon nitride film 212 and the side wall protective film 208.

The silicon oxide film 213 between the gate electrodes 207 is removed by dry etching.

Figure 10H:
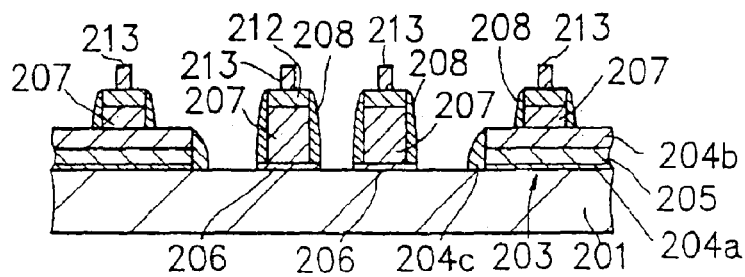

The silicon semiconductor substrate 201 is cleaned using an acid solution, e.g., HF solution at a concentration of 0.5% for 30 seconds. Thereafter, the silicon semiconductor substrate 201 is annealed using a conventional diffusion furnace in an $N_2$ atmosphere at a temperature of 900° C. for 30 minutes. At this time, as shown in FIG. 10H, the width of the silicon oxide film 213 on the silicon nitride film 212 decreases by about 50 nm because of etching during cleaning and shrinkage due to the thermal hysteresis of annealing. The gate oxide film 206 between the gate electrodes 207 in the element formation region 202 is removed by cleaning the silicon semiconductor substrate 201, so that the surface portion of the silicon semiconductor substrate 201 between the gate electrodes 207 in the element formation region 202 is exposed. When the silicon oxide film 213 is formed as a plasma-CVD silicon oxide film, the width of the plasma silicon oxide film further decreases upon cleaning and annealing because of its large heat shrinkage coefficient.

A thin oxide film (thickness: about 10 to 20 Å) is formed again between the gate electrodes 207 by annealing. The silicon semiconductor substrate 201 is cleaned again to remove this oxide film.

Figure 10I:
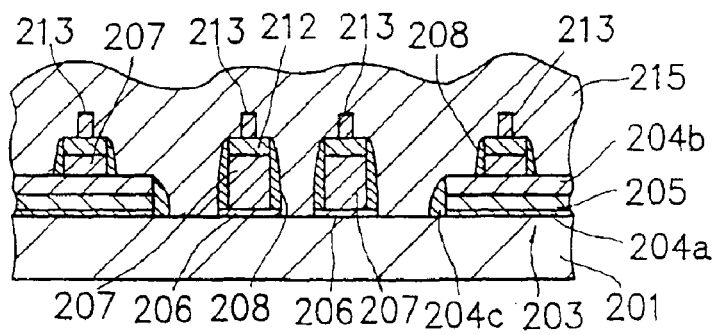

As shown in FIG. 10I, a polysilicon film 215 doped with an impurity is deposited on the entire surface including the field shield element isolation structures 203 to a thickness of about 1,000 nm by CVD at a temperature of 500° C.

Figure 10J:
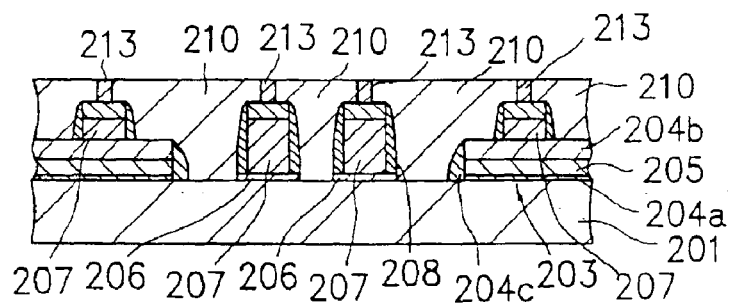

As shown in FIG. 10J, using the silicon oxide films 213 as stoppers, the polysilicon film 215 is surface-polished by, e.g., chemical mechanical polishing (CMP) at a rotation speed of 70 rpm and a pressure of 30 mgf/cm$^2$ until the silicon oxide films 213 are exposed, thereby planarizing the surface of the polysilicon film 215. At this time, the polysilicon film 215 is separated by the silicon oxide films 213 at intervals of adjacent silicon oxide films 213, so that pad polysilicon films 210 whose separation widths almost equal the width of the silicon oxide film 213 are formed.

Figure 10K:
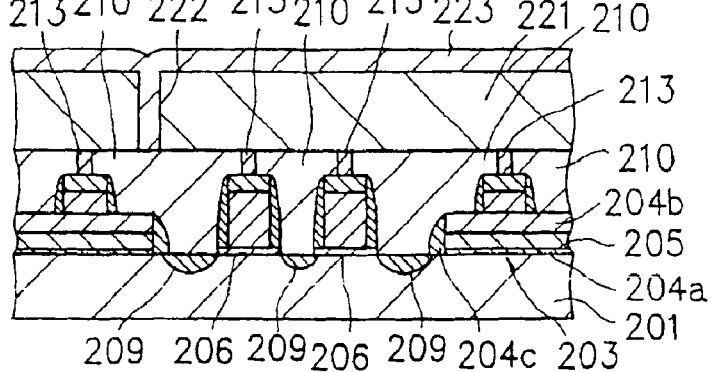

As shown in FIG. 10K, the pad polysilicon films 210 are annealed to form diffusion layers 209 serving as the source and drain of the MOS transistor on the surface regions of the silicon semiconductor substrate 201 contacting the pad polysilicon films 210. More specifically, the impurity in the pad polysilicon films 210 is diffused into the surface regions of the silicon semiconductor substrate 201 on both sides of the gate electrodes 207 in the element formation region 202 by annealing, thus forming the diffusion layers 209. Use of such an impurity diffusion layer formation method based on solid-phase diffusion enables shallow junction formation of the diffusion layers 209. Each pad polysilicon film 210 is electrically connected to only one diffusion layer 209.

A BPSG (BoroPhosphoSilicate Glass) film 221 is formed on the entire surface. A contact hole 222 is formed in the BPSG film 221 to expose the surface portion of the pad polysilicon film 210.

A polysilicon film is deposited on the BPSG film 221 including the contact hole 222. The polysilicon film is patterned by photolithography and dry etching to form a wiring layer 223 such as a bit line which fills the contact hole 222. The wiring layer 223 is electrically connected to the pad polysilicon film 210 through the contact hole 222. The pad polysilicon film 210 is also electrically connected to the diffusion layer 209 locating below. That is, the wiring layer 223 is electrically connected to a predetermined diffusion layer 209 through the contact hole 222 (i.e., the polysilicon film in the contact hole 222) and the pad polysilicon film 210.

Although not illustrated, insulating interlayers, contact holes, and wiring layers are formed in the post process, thereby completing the MOS transistor.

As described above, in the method of manufacturing the MOS transistor according to the fifth embodiment, when the pattern consisting of the silicon nitride film 212, the silicon oxide film 213, and the gate electrode (gate wiring layer) 207 is formed such that the width almost equals the exposure limit value, the width of the silicon oxide film 213 which has undergone cleaning and annealing is equal to or smaller than the exposure limit value. Therefore, the separation width of the pad polysilicon films 210 which are separated by the silicon oxide films 213 into predetermined patterns are equal to or smaller than the exposure limit value.

Even when the widths of the gate electrodes (gate wiring layers) 207 are reduced to the substantial exposure limit in photolithography, the polysilicon film 215 can be separated without using photolithography to form, e.g., the pad polysilicon films 210 having a separation width equal to or smaller than the exposure limit value.

When the silicon oxide film 213 on the silicon nitride film 212 is formed as a plasma-CVD silicon oxide film by plasma CVD, the separation width of the pad polysilicon film 210 to be formed later can be further reduced, so that the positional accuracy in formation of the contact hole 222 can be further relaxed.

-Modification-

A modification of the fifth embodiment of the present invention will be described below. In this modification, a method of manufacturing a MOS transistor will be described, as in the fifth embodiment. This modification is slightly different in the surface polishing method. FIGS. 11A to 11H are schematic sectional views showing steps in manufacturing the MOS transistor according to the modification. A detailed description of the same steps as in the fifth embodiment will be omitted. The same reference numerals as in the MOS transistor of the fifth embodiment denote the same constituent elements in this modification, and a detailed description thereof will be omitted.

In this modification, in the step shown in FIG. 10C of the above-described fifth embodiment, to easily and properly control polishing of the polysilicon film 211, the silicon oxide films 204b serving as cap insulating films of the field shield element isolation structures 203 are used as stoppers.

Figure 11A:
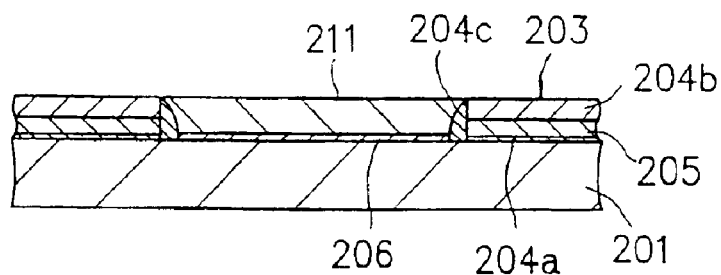
FIGS. 11A to 11H are schematic sectional views showing steps in manufacturing a MOS transistor according to a modification of the fifth embodiment.

More specifically, as shown in FIG. 11A, the polysilicon film 211 deposited on the entire surface including the field shield element isolation structures 203 is surface-polished by, e.g., CMP until the surfaces of the silicon oxide films 204b on the field shield element isolation structures 203 are exposed, thereby planarizing the surface.

Figure 11B:
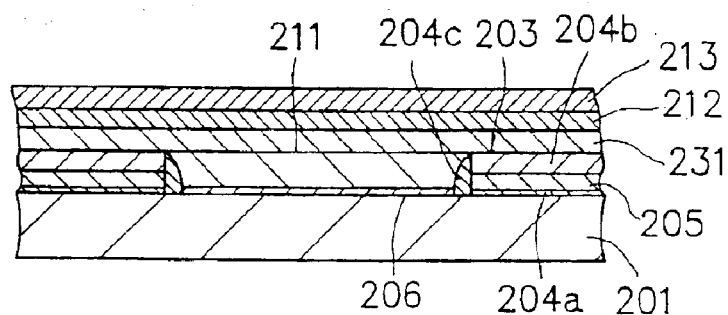

As shown in FIG. 11B, a polysilicon film 231 doped with an impurity is deposited on the exposed field shield element isolation structures 203 and the polysilicon film 211 to a thickness of about. 200 nm by CVD at a temperature of 580° C., thereby burying the field shield element isolation structures 203 in the polysilicon films 211 and 231.

The silicon nitride film 212 is deposited on the surface of the polysilicon film 231 to a thickness of about 200 nm by CVD at a temperature of 750° C. The silicon oxide film 213 is deposited on the silicon nitride film 212 to a thickness of about 250 nm by CVD at a temperature of 675° C. The silicon oxide film 213 formed on the silicon nitride film 212 may be formed as a plasma-CVD silicon oxide film by plasma CVD.

Figure 11C:
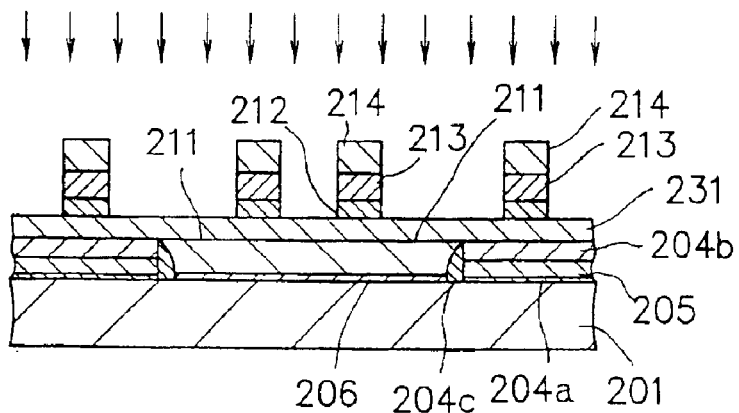
Figure 11D:
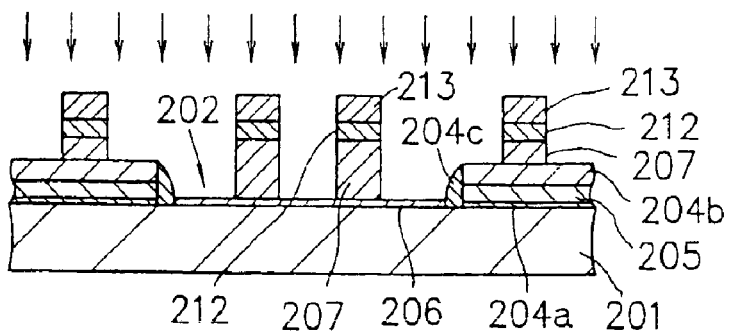
Figure 11E:
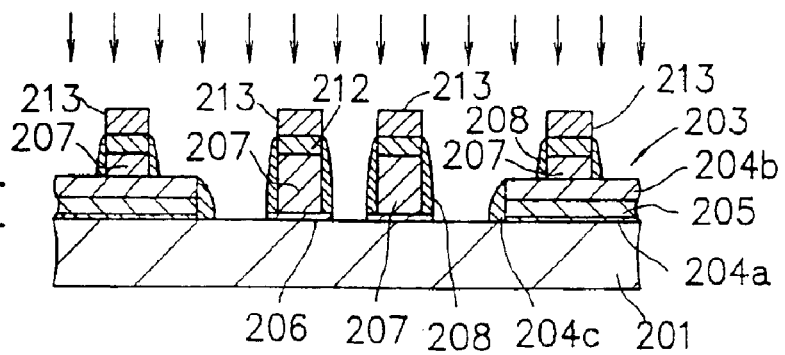

As shown in FIG. 11C, a photoresist is applied to the surface of the silicon oxide film 213 and subjected to photolithography to form the mask 214 having a predetermined pattern. The silicon nitride film 212 and the silicon oxide film 213 are anisotropically dry-etched using the mask 214 to pattern these films into a predetermined electrode shape. More specifically, this dry etching is performed using a conventional parallel plate etching chamber and CF$_4$/Ar as etching gases. The gas flow rate ratio is CF$_4$/Ar=120/800 sccm, the pressure is 1.7 Torr, and the applied power is 750 W.

The mask 214 is removed by ashing using, e.g., O$_2$ plasma. As shown in FIG. 1D, the silicon oxide films 213 each having the electrode shape are used as masks to anisotropically dry-etch the polysilicon films 211 and 231, thereby patterning these films into an electrode shape. The gate electrodes (gate wiring layers) 207 whose upper surfaces are on the almost same plane, i.e., almost flush with each other are formed into a predetermined electrode shape on the element formation region 202 and on the field shield element isolation structures 203. More specifically, this dry etching is performed using a conventional parallel plate etching chamber and $He/HBr/Cl_2$ as etching gases. The gas flow rate ratio is $He/HBr/Cl_2=400/15/200$ sccm, the pressure is 425 Torr, and the applied power is 225 W.

As shown in FIG. 1E, a silicon nitride film is deposited on the entire surface to a thickness of about 200 nm by CVD at a temperature of 750° C. to cover the gate electrodes (gate wiring layers) 207 on the element formation region 202 and on the field shield element isolation structures 203. The entire surface of the silicon nitride film is anisotropically dry-etched to leave the silicon nitride film only on the side walls of the gate electrodes (gate wiring layers) 207 and the silicon nitride films 212, thereby forming the side wall protective films 208. More specifically, this dry etching is performed using a conventional parallel plate etching chamber and $CF_4/Ar$ as etching gases. The gas flow rate ratio is $CF_4/Ar=120/800$ sccm, the pressure is 1.7 Torr, and the applied power is 750 W. At this time, each gate electrode (gate wiring layer) 207 is covered with the silicon nitride film 212 and the side wall protective film 208.

The silicon oxide film 213 between the gate electrodes 207 is removed by dry etching.

Figure 11F:
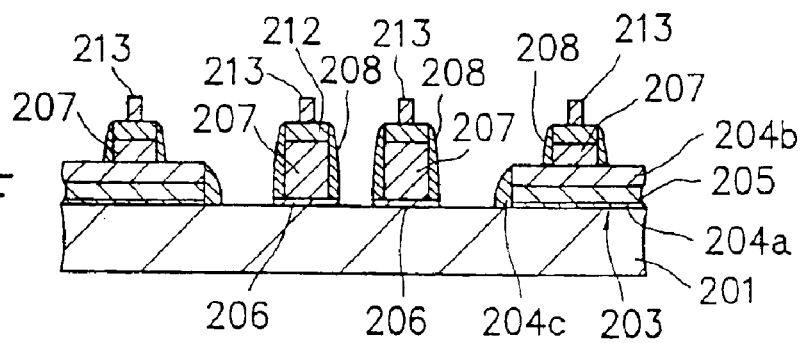

The silicon semiconductor substrate 201 is cleaned using an acid solution, e.g., HF solution at a concentration of 0.5% for 30 seconds. Thereafter, the silicon semiconductor substrate 201 is annealed using a conventional diffusion furnace in an $N_2$ atmosphere at a temperature of 900° C. for 30 minutes. At this time, as shown in FIG. 11F, the width of the silicon oxide film 213 on the silicon nitride film 212 decreases by about 50 nm because of etching during cleaning and shrinkage due to the thermal hysteresis of annealing. The gate oxide film 206 between the gate electrodes 207 in the element formation region 202 is removed by cleaning the silicon semiconductor substrate 201, so that the surface portion of the silicon semiconductor substrate 201 between the gate electrodes 207 in the element formation region 202 is exposed. When the silicon oxide film 213 is formed as a plasma-CVD silicon oxide film, the width of the plasma silicon oxide film further decreases upon cleaning and annealing because of its large heat shrinkage coefficient.

A thin oxide film (thickness: about 10 to 20 Å) is formed again between the gate electrodes 207 by annealing. The silicon semiconductor substrate 201 is cleaned again to remove this oxide film.

Figure 11G:
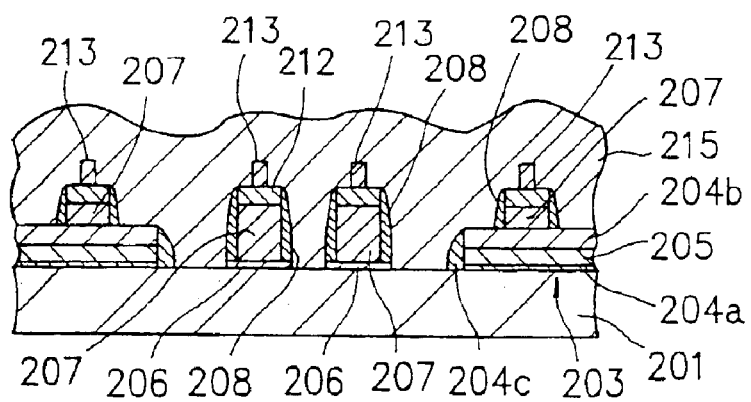

As shown in FIG. 11G, the polysilicon film 215 doped with an impurity is deposited on the entire surface including the field shield element isolation structures 203 to a thickness of about 1,000 nm by CVD at a temperature of 500° C.

Figure 11H:
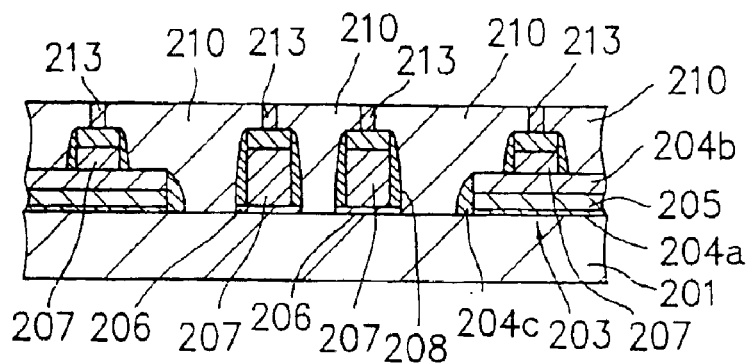

As shown in FIG. 11H, using the silicon oxide films 213 as stoppers, the polysilicon film 215 is surface-polished by, e.g., chemical mechanical polishing (CMP) at a rotation speed of 70 rpm and a pressure of 30 mgf/cm² until the silicon oxide films 213 are exposed, thereby planarizing the surface of the polysilicon film 215. At this time, the polysilicon film 215 is separated by the silicon oxide films 213 at intervals of adjacent silicon oxide films 213, so that the pad polysilicon films 210 whose separation widths almost equal the width of the silicon oxide film 213 are formed.

As in the fifth embodiment, the diffusion layers 209 serving as the source and drain of the MOS transistor are formed. The BPSG film 221 is formed, and the contact hole 222 is formed in the BPSG film 221 to expose the surface portion of the pad polysilicon film 210. A polysilicon film is deposited on the BPSG film 221 including the contact hole 222. The polysilicon film is patterned by photolithography and dry etching to form the wiring layer 223 such as a bit line which fills the contact hole 222. Thereafter, insulating interlayers, contact holes, and wiring layers are formed in the post process, thereby completing the MOS transistor.

In the modification of the method of manufacturing the MOS transistor according to the fifth embodiment, when the pattern consisting of the silicon nitride film 212, the silicon oxide film 213, and the gate electrode (gate wiring layer) 207 is formed such that the width almost equals the exposure limit value, the width of the silicon oxide film 213 which has undergone cleaning and annealing is equal to or smaller than the exposure limit value. Therefore, the separation width of the pad polysilicon films 210 which are separated by the silicon oxide films 213 into predetermined patterns are equal to or smaller than the exposure limit value.

Even when the widths of the gate electrodes (gate wiring layers) 207 are reduced to the substantial exposure limit in photolithography, the polysilicon film 215 can be separated without using photolithography to form, e.g., the pad polysilicon films 210 having a separation width equal to or smaller than the exposure limit value.

When the silicon oxide film 213 on the silicon nitride film 212 is formed as a plasma-CVD silicon oxide film by plasma CVD, the separation width of the pad polysilicon film 210 to be formed later can be further reduced, so that the positional accuracy in formation of the contact hole 222 can be further relaxed.

-Sixth Embodiment-

Figure 14:
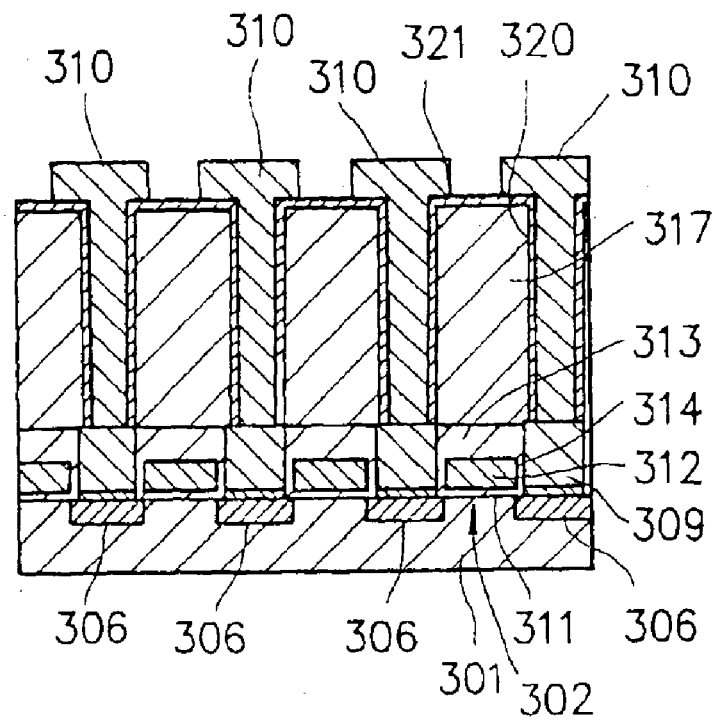
FIG. 14 is a schematic sectional view taken along a line B–B' in FIG. 12.
Figure 15:
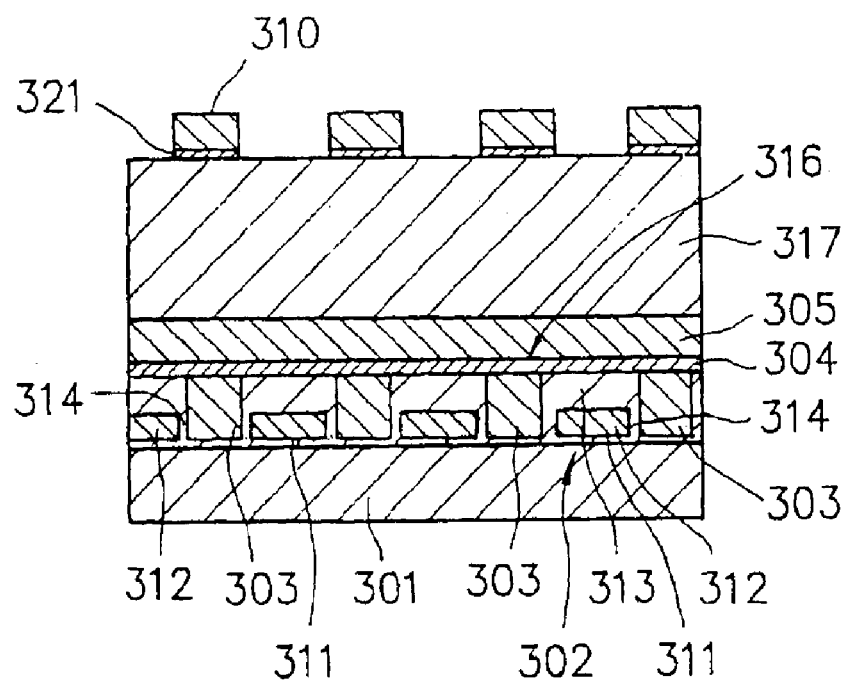
FIG. 15 is a schematic sectional view taken along a line C–C' in FIG. 12.

A semiconductor device according to the sixth embodiment and a manufacturing method therefor will be described below. In this case, an EEPROM as one of nonvolatile semiconductor memories will be exemplified as a semiconductor device. FIG. 12 is a schematic plan view showing-the structure of an EEPROM according to the sixth embodiment. FIGS. 13, 14, and 15 are schematic sectional views taken along lines A–A', B–B', and C–C' in FIG. 12, respectively.

This EEPROM comprises floating gate electrodes 303 independently electrically floating in element formation regions demarcated by field shield element isolation structures 302 on a p-type silicon semiconductor substrate 301, strip-shaped control gate electrodes 305 formed to be almost perpendicular to the field shield element isolation structures 302 and oppose the one-row floating gate electrodes 303 through strip-shaped dielectric films 304, pairs of impurity diffusion layers 306 formed in the surface regions of the silicon semiconductor substrate 301 on both sides of the respective control gate electrodes 305 in the element formation regions, leading-out electrodes 309 filled between adjacent control gate electrodes 305 through cap insulating films 318 and side wall protective films 319 which cover the floating gate electrodes 303, the dielectric films 304, and the control gate electrodes 305, and connected to the impurity diffusion layers 306, and strip-shaped bit lines 310 almost parallel to the field shield element isolation structures 302 and electrically connected to one (drain diffusion layer) of the impurity diffusion layers 306 through the extraction electrode 309. In FIG. 12, a region enclosed by a circle D corresponds to a memory cell.

As shown in FIGS. 14 and 15, in the field shield element isolation structure 302, a polysilicon film 312 serving as a shield plate electrode and a cap insulating film 313 of the shield plate electrode are patterned into a strip shape. Thermal oxide films 314 are formed on the side surface portions of the polysilicon film 312, and the polysilicon film 312 serving as a shield plate electrode is surrounded by the thermal oxide film 311, the cap insulating film 313, and the thermal oxide films 314.

The floating gate electrodes 303 are formed of polysilicon films each patterned on a tunnel oxide film 315 formed in the element formation region, and electrically disconnected from each other. As shown in FIG. 13, the floating gate electrodes 303 are arranged at an almost equal interval on the element formation regions through the intermediary of the impurity diffusion layers 306. In addition, as shown in FIG. 15, the floating gate electrodes 303 are filled between the field shield element isolation structure 302 and oppose the polysilicon films 312 across the thin thermal oxide films 314.

As shown in FIG. 15, the surfaces of the field shield element isolation structures 302 and the floating gate electrodes 303 are planarized. That is, the upper surfaces of the field shield element isolation structures 302 and the upper surfaces of the floating gate electrodes 303 have almost the same plane (planarized surface 316).

The dielectric film 304 is formed of an ONO film which has a three-layer structure of an oxide film, a nitride film, and an oxide film. The control gate electrode 305 is formed of, e.g., an n-type polysilicon film. The dielectric films 304 and the control gate electrodes 305 are formed into almost the same strip shape on the planarized surface 316 including the upper surfaces of the floating gate electrodes 303 in the row direction. Each floating gate electrode 303 and the corresponding control gate electrode 305 are capacitively coupled through the dielectric film 304.

A cap insulating film 318 is formed on the control gate electrode 305. Side wall protective films 319 are formed on the side surfaces of the floating gate electrode 303, the dielectric film 304, and the control gate electrode 305.

The floating gate electrode 303, the dielectric film 304, and the control gate electrode 305 are surrounded by the tunnel oxide film 315, the cap insulating film 318, and the side wall protective films 319.

As shown in FIG. 13, the leading-out electrode 309 is filled between the floating gate electrodes 303, the dielectric films 304, and the control gate electrodes 305 through the cap insulating film 318 in the element formation region. In addition, as shown in FIG. 13, the leading-out electrode 309 is filled between the field shield element isolation structures 302 with the thermal oxide film 314 intervened. Each leading-out electrode 309 is electrically connected to one impurity diffusion layer 306 in the lower layer.

An insulating interlayer 317 is formed on the entire surface of the silicon semiconductor substrate 301 including the field shield element isolation structures 302 and the upper surfaces of the control gate electrodes 305. Contact holes 320 are formed in the insulating interlayer 317 to expose a part of the surface of each leading-out electrode 309 connected to one impurity diffusion layer 306 serving as a drain diffusion layer.

An underlayer 321 having a two-layer structure of TiN/Ti is formed on the insulating interlayer 317 including the contact holes 320 by sputtering. The strip-shaped bit lines 310 consisting of an aluminum alloy are filled in the contact holes 320 and extend on the insulating interlayer 317 through the underlayer 321.

The write/erase operation of this EEPROM will be described below.

The capacitances of the tunnel oxide film 315, the dielectric film 304, and the field shield element isolation structure 302 are represented by $C_1$, $C_2$, and $C_3$ ($Ct=C_1+C_2+C_3$), respectively. The potentials of the floating gate electrode 303, the control gate electrode 305, and the polysilicon film 312 of the field shield element isolation structure 302 are represented by Vfg, Vcg, and Vfs, respectively. When charges in the floating gate electrode 303 are represented by Q, the following relation holds:

$$Ct \cdot Vfg = C_2 \cdot Vcg + 2C_3 \cdot Vfs + Q \qquad (1)$$

The write operation will be described first. In a write mode, the floating gate electrode 303 is discharged to lower the threshold value. Normally, the polysilicon film 312 of the field shield element isolation structure 302 is used as a shield plate electrode fixed at 0 (V). In the write mode, however, the polysilicon film 312 is used as a write electrode. More specifically, Vcg may be fixed at 0 (V), and Vfs may be set at a high negative potential. At this time, the following relation holds on the basis of equation (1):

$$(C_1+C_2+C_3) \cdot Vfg = 2C_3 \cdot Vfs + Q$$

therefore, $$\begin{aligned} Vfg - Vfs &= -(C_1+C_2) \cdot Vfg/C_3 \\ &= -5Vfg + (Ct/C_3) \cdot (Q/Ct) \end{aligned} \qquad (2)$$

To generate a Fowler-Nordheim tunnel current, a voltage of at least 10 (MV/cm) must be applied to the thermal oxide film 314 of the field shield element isolation structure 302. When the thermal oxide film 314 is about 20 (nm) thick, $$Vfg - Vfs \geq 20 \text{ (V)}$$

Therefore, by setting Vfs at a negative potential of −20 (V) or less, charges are removed from the floating gate electrode 303.

The erase operation will be described next. In an erase mode, the floating gate electrode 303 is charged to raise the threshold value. In a normal erase mode, as the first erase method, Vcg is set at a high positive potential (about 13 (V)), and Vfs is fixed at 0 (V). On the basis of equation (1), the following relation holds:

$$Ct \cdot Vfg = 2C_3 \cdot Vfs + Q \qquad (3)$$

Charges corresponding to Q≈−3.64 Ct are stored in the floating gate electrode 303.

As the second erase method, by setting Vcg at a high potential (about 13 V), and Vfs at a high negative potential (about −20 V), charges are stored in the floating gate electrode 303 through the thermal oxide film 314.

A method of manufacturing the EEPROM having the above structure will be described below. FIGS. 16A, 17A, 18A, 19A, 20A, and 21A are plan views showing steps in manufacturing the EEPROM. FIGS. 16B, 17B, 18B, 19B, 20B, and 21B are sectional views taken along lines A–A' in these plan views, respectively, and FIGS. 16C, 17C, 18C, 19C, 20C, and 21C are sectional views taken along lines B–B' in these plan views, respectively. The same reference numerals as in FIGS. 12 to 15 denote the same members throughout these drawings, and a detailed description thereof will be omitted.

Figure 16A:
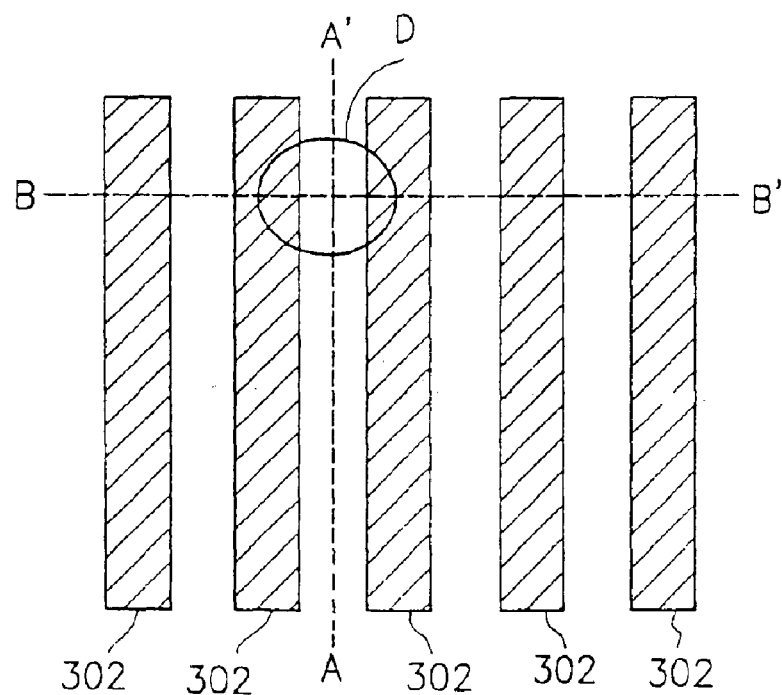
FIGS. 16A to 16C are schematic plan and sectional views showing a step in manufacturing the EEPROM according to the sixth embodiment.
Figure 16B:
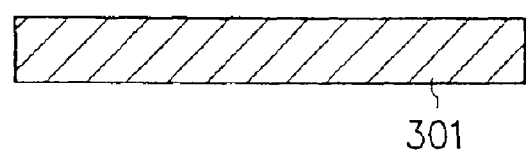
Figure 16C:
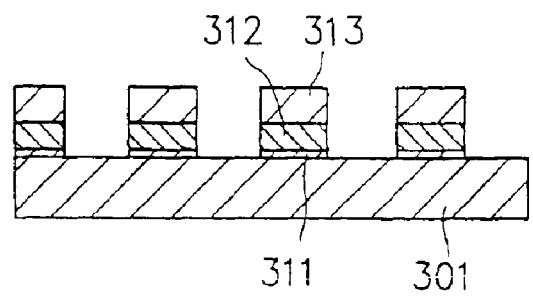

As shown in FIGS. 16A to 16C, the surface of the p-type silicon semiconductor substrate 301 is thermally oxidized to form the thermal oxide film 311. The polysilicon film 312 and the cap insulating film 313 are sequentially deposited on the thermal oxide film 311 by CVD. The cap insulating film 313, the polysilicon film 312, and the thermal oxide film 311 are subjected to photolithography and then to dry etching to leave the cap insulating films 313, the polysilicon films 312, and the thermal oxide film 311 into a strip shape.

As shown in FIGS. 17A to 17C, the side surfaces of the polysilicon film 312 are thermally oxidized to form the thermal oxide films 314, thereby completing the field shield element isolation structure 302 surrounded by the thermal oxide film 311, the cap insulating film 313, and the thermal oxide films 314. Instead of forming the thermal oxide film 314, a silicon oxide film may be deposited on the entire surface of the thermal oxide film 311 to cover the polysilicon film 312 and the cap insulating film 313. By anisotropically etching the entire surfaces of the silicon oxide film and the thermal oxide film 311, the silicon oxide film may be left on the side surfaces of the polysilicon film 312 and the cap insulating film 313.

As shown in FIGS. 18A to 18C, the surfaces of the silicon semiconductor substrate 301 between the field shield element isolation structures 302 are thermally oxidized to form the tunnel oxide films 315. A polysilicon film 322 is deposited on the entire surface including the field shield element isolation structures 302 to fill between the field shield element isolation structures 302. The polysilicon film 322 is surface-polished by, e.g., chemical mechanical polishing (CMP) using the cap insulating films 313 of the field shield element isolation structures 302 as stoppers. At this time, the polysilicon film 322 is patterned to be filled between the adjacent field shield element isolation structures 302 and to be separated by the field shield element isolation structures 302.

Figure 19A:
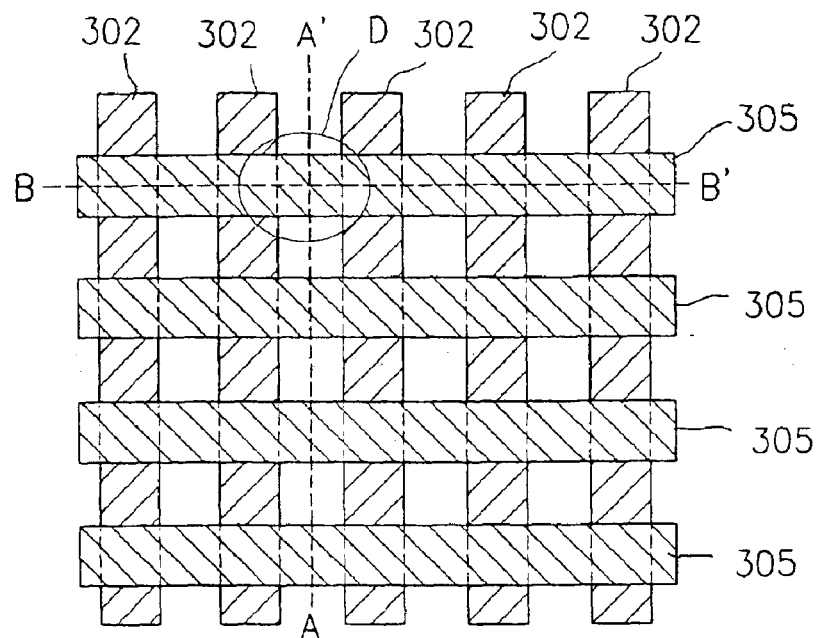
FIGS. 19A to 19C are schematic plan and sectional views showing a step subsequent to the step in manufacturing the EEPROM according to the sixth embodiment in FIGS. 18A to 18C.
Figure 19B:
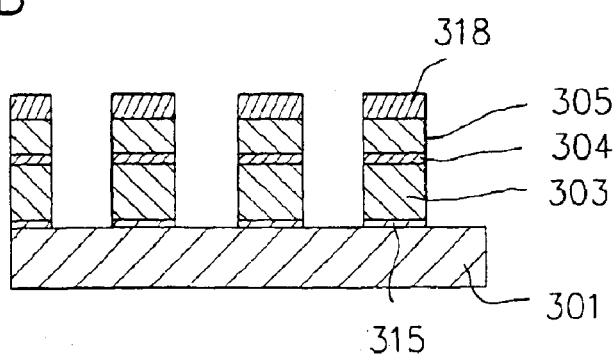
Figure 19C:
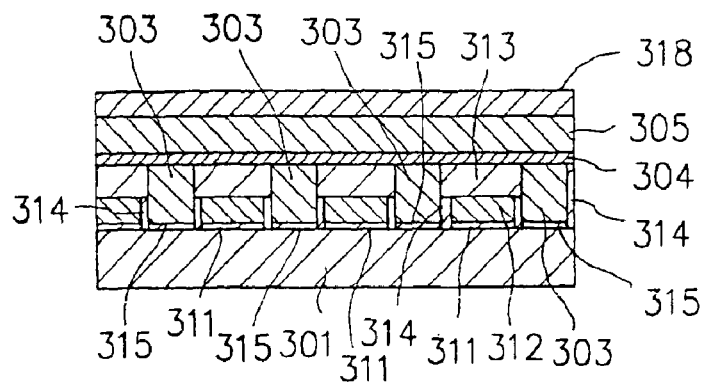

As shown in FIGS. 19A to 19C, an ONO film having a three-layer structure of an oxide film, a nitride film, and an oxide film, a polysilicon film, and a silicon oxide film are sequentially deposited on the cap insulating films 313 and the polysilicon films 322, i.e., on the planarized surface 316. Before formation of the silicon oxide film, a refractory metal may be deposited on the polysilicon film by sputtering to form a silicide layer.

The silicon oxide film, the polysilicon film, the ONO film, the polysilicon film 322, and the tunnel oxide film 315, are subjected to photolithography and then to dry etching. The silicon oxide film, the polysilicon film, and the ONO film are patterned into a strip shape to be almost perpendicular to the field shield element isolation structures 302, thereby forming the dielectric films 304, the control gate electrodes 305, and the cap insulating films 318 of the control gate electrodes 305. At the same time, the polysilicon films 322 and the tunnel oxide films 315 between the adjacent control gate electrodes 305 are removed to form the floating gate electrodes 303 which are independently capacitively coupled to the control gate electrodes 305 through the dielectric films 304 in the element formation regions. When the silicide layer is formed, the control gate electrode 305 is formed as a polycide film.

Figure 20A:
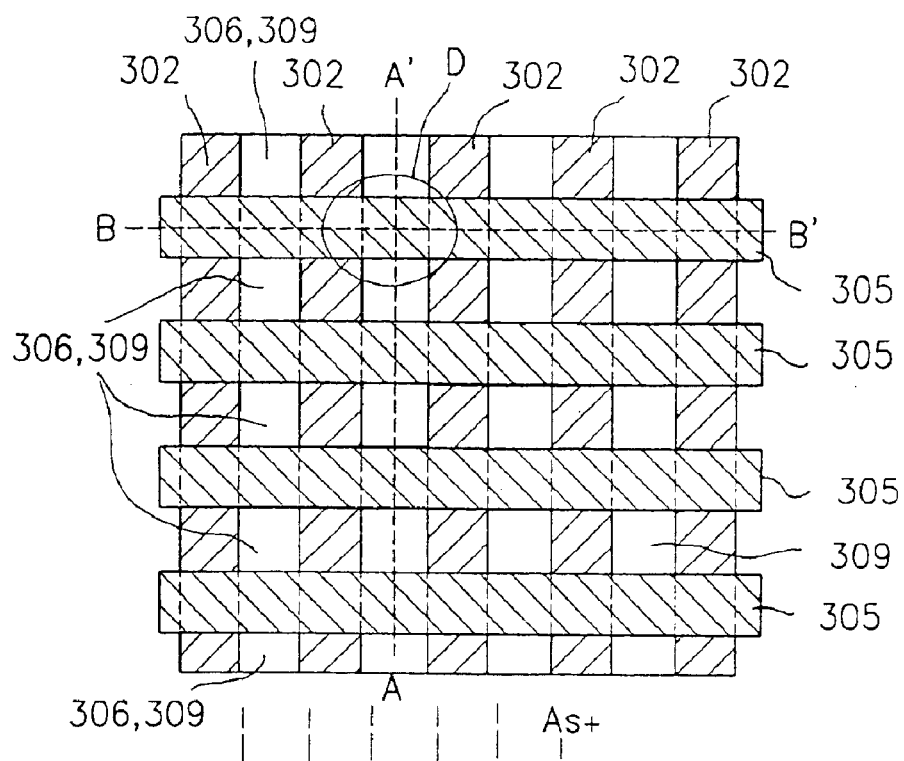
FIGS. 20A to 20C are schematic plan and sectional views showing a step subsequent to the step in manufacturing the EEPROM according to the sixth embodiment in FIGS. 19A to 19C.
Figure 20B:
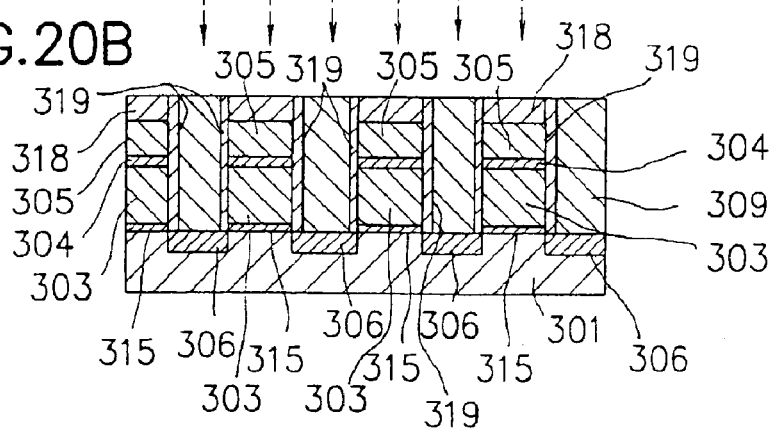
Figure 20C:
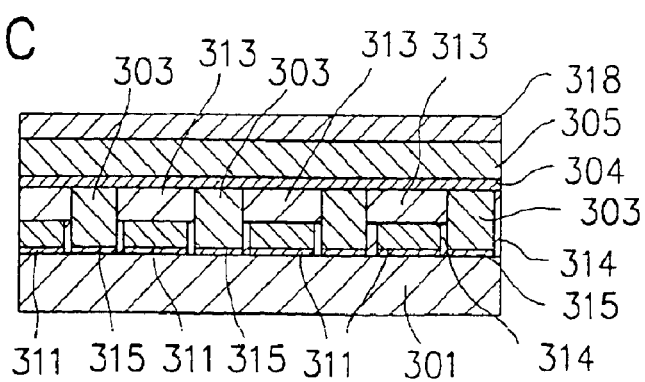

As shown in FIGS. 20A to 20C, a silicon oxide film is deposited on the entire surface of the silicon semiconductor substrate 301 including the cap insulating films 318. The entire surface of the silicon oxide film is anisotropically etched to leave the silicon oxide film on the side surfaces of the tunnel oxide films 315, the floating gate electrodes 303, the dielectric films 304, the control gate electrodes 305, and the cap insulating films 318, thereby forming the side wall protective films 319.

After an undoped polysilicon film is deposited on the entire surface by CVD, the polysilicon film is surface-polished by CMP to expose the surfaces of the control gate electrodes 305. At this time, the independent leading-out electrodes 309 which are filled between the adjacent side wall protective films 319 and the cap insulating films 318 on the silicon semiconductor substrate 301 in the element formation regions are formed.

Arsenic (As) is ion-implanted into the silicon semiconductor substrate 301 through the extraction electrodes 309 at an acceleration energy of 75 keV and a dose of $10^{12}$ cm$^{-2}$. The silicon semiconductor substrate 301 is annealed at 900° C. to diffuse the arsenic in the surface regions of the silicon semiconductor substrate 301, thereby forming the impurity diffusion layers 306 serving as the source/drain diffusion layers.

Figure 21A:
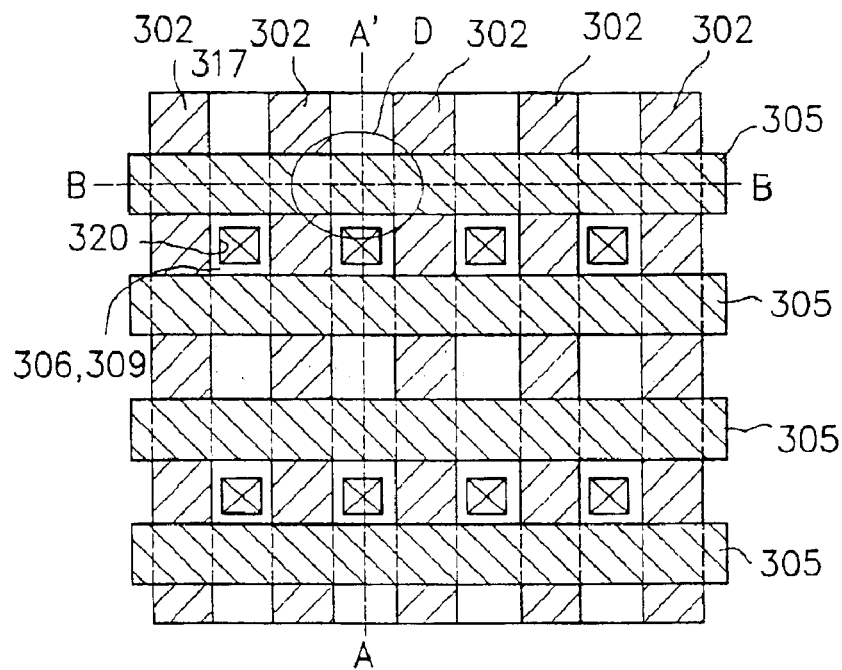
FIGS. 21A to 21C are schematic plan and sectional views showing a step subsequent to the step in manufacturing the EEPROM according to the sixth embodiment in FIGS. 20A to 20C.
Figure 21B:
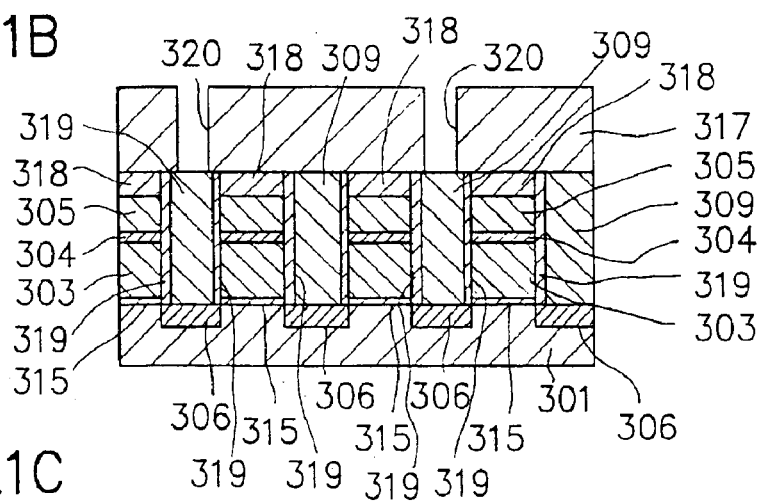
Figure 21C:
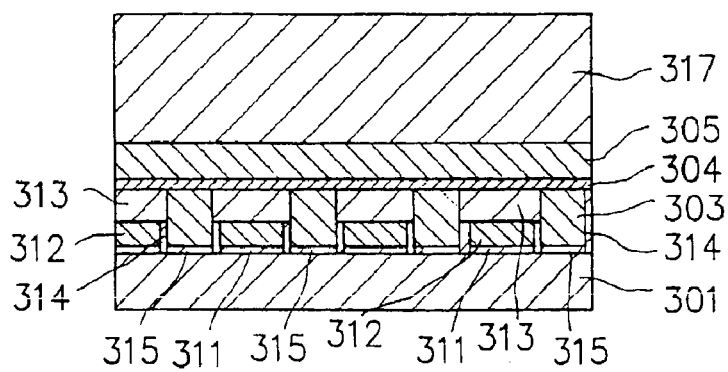

As shown in FIGS. 21A to 21C, the insulating interlayer 317 is deposited on the entire surface by CVD. The contact holes 320 are formed to expose part of the surfaces of the leading-out electrodes 309 connected to the impurity diffusion layers 306 serving as drain diffusion layers.

The underlayer 321 having a two-layer structure of TiN/Ti is formed on the surface of the insulating interlayer 317 including the inner walls of the contact holes 320. Subsequently, an aluminum alloy film is formed by sputtering and subjected to photolithography and then to dry-etching. With this process, the bit lines 310 which are filled in the contact holes 320 and extend along the insulating interlayer 317 on the underlayer 321 are formed.

Thereafter, various upper wiring layers and via holes are formed, thus completing the EEPROM.

As described above, in the semiconductor device according the sixth embodiment and the manufacturing method therefor, the floating gate electrode 303 filled between the adjacent field shield element isolation structures 302 opposes the polysilicon film 312 buried in the field shield element isolation structure 302 and serving as a shield plate electrode through the intermediary of the thermal oxide film 314 as the side wall protective film of the polysilicon film 312. In addition, the control gate electrode 305 is formed on floating gate electrode 303 through the intermediary of the dielectric film 304. When the polysilicon film 312 is to serve as a shield plate electrode, the potential of the polysilicon film 312 is set at 0 V, and the silicon semiconductor substrate 301 at a portion corresponding to the field shield element isolation structure 302 is fixed at 0 (V), so that element isolation is attained. However, a voltage of 0 V or less can be applied to the polysilicon film 312. When a predetermined negative voltage is applied to the polysilicon film 312 to make a tunnel current flow between the polysilicon film 312 and the floating gate electrode 303 through the thermal oxide film 314, the polysilicon film 312 can be used not only as a shield plate electrode but also as a write/erase electrode.

In addition, since the deposited polysilicon film 322 is surface-polished using the thermal oxide films 311 of the field shield element isolation structures 302 as stoppers, e.g., the floating gate electrodes 303 which are properly separated by the thermal oxide films 311 of the field shield element isolation structures 302 are formed in a self-aligned manner.

-Seventh Embodiment-

The seventh embodiment of the present invention will be described next. In the seventh embodiment, an example in which a semiconductor device according to the present invention and a manufacturing method therefor are applied to a CMOS transistor will be described. In the seventh embodiment, the structure of the CMOS transistor and steps in manufacturing the CMOS transistor will be described together. FIGS. 22A to 22M are schematic sectional views showing steps in manufacturing this CMOS transistor.

Field shield element isolation structures 422 are formed in the element isolation regions on a p-type silicon semiconductor substrate 401 by a so-called field shield element isolation method, thereby demarcating an element formation region.

Figure 22A:
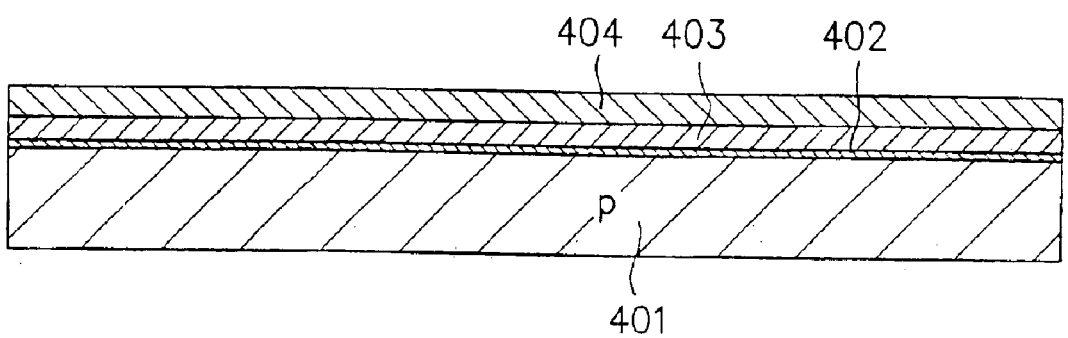

More specifically, as shown in FIG. 22A, a silicon oxide film 402, a polysilicon film 403, and a silicon oxide film 404 are sequentially formed on the p-type silicon semiconductor substrate 401 to thicknesses of, e.g., about 50 nm, 200 nm, and 200 nm, respectively. A silicon nitride film (not shown) may be formed on the entire surface of the silicon oxide film 404 by CVD.

Figure 22B:
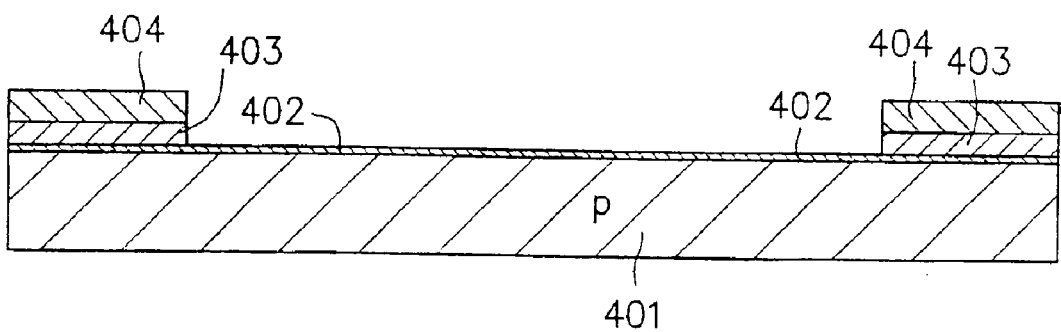

As shown in FIG. 22B, the silicon oxide film 402, the polysilicon film 403, and the silicon oxide film 404 (and the silicon nitride film) are patterned by photolithography and dry etching to selectively remove these films.

Figure 22C:
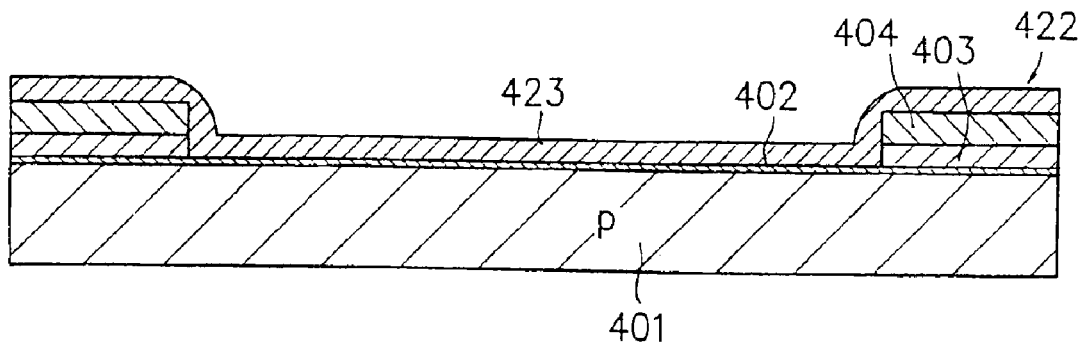

As shown in FIG. 22C, a silicon oxide film 423 is formed on the entire surface to cover the left silicon oxide films 402, polysilicon films 403, and silicon oxide films 404 (and the silicon nitride films).

Figure 22D:
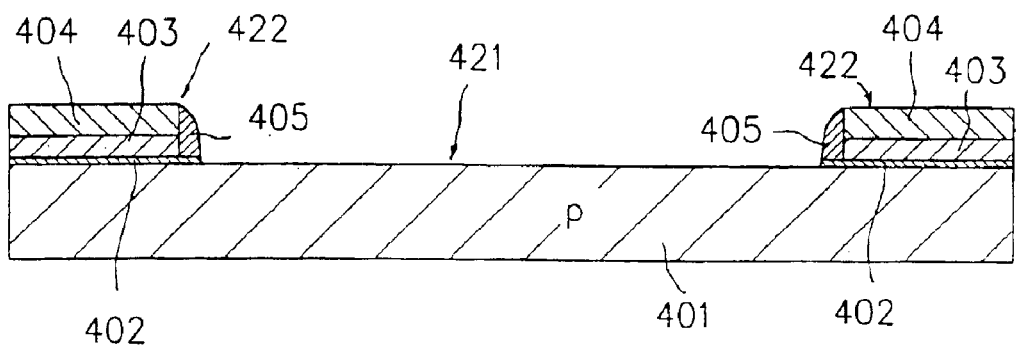

As shown in FIG. 22D, the entire surface of the silicon oxide film 423 is anisotropically dry-etched by, e.g., RIE to leave the silicon oxide only on the side walls of the silicon oxide films 402, the polysilicon films 403, and the silicon oxide films 404 (and the silicon nitride films), thereby forming side wall protective films 405. With these processes, the field shield element isolation structures 422 each having a shield plate electrode consisting of the polysilicon film surrounded by the silicon oxide films are formed in the field regions.

Figure 22E:
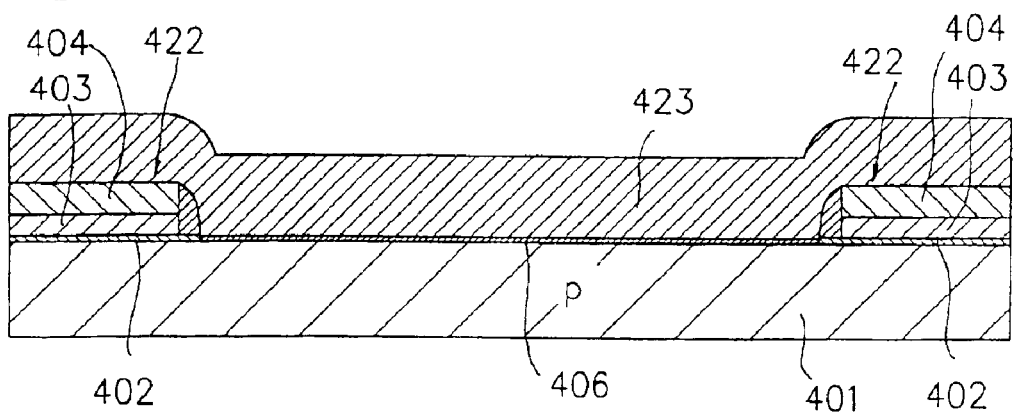

As shown in FIG. 22E, the surface of the silicon semiconductor substrate 401 on each of element formation regions 421 which are separated by the field shield element isolation structures 422 and demarcated relative to the field shield element isolation structures 422 is thermally oxidized to form a gate oxide film 406 having a thickness of about 15 nm. A polysilicon film 423 is formed on the entire surface including the field shield element isolation structures 422 by CVD. The polysilicon film 423 must be deposited to a thickness for burying the field shield element isolation structures 422 in the polysilicon film 423. Considering that the height of the field shield element isolation structure 422 is about 450 nm, the polysilicon film 423 is formed to a thickness of about 500 to 1,000 nm.

Figure 22F:
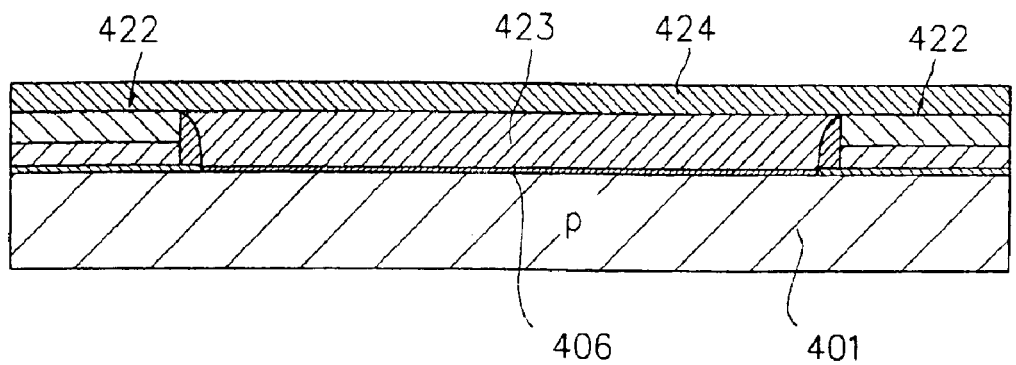

As shown in FIG. 22F, the polysilicon film 423 deposited on the entire surface including the field shield element isolation structures 422 is surface-polished by, e.g., CMP until the silicon oxide films 404 of the field shield element isolation structures 422 are exposed (for a multilayered insulating film consisting of the silicon oxide film 404 and the silicon nitride film, until the silicon nitride film is exposed), thereby planarizing the surface. At this time, an alkali solution based on a silica powder and amine is preferably used as a slurry for CMP of the polysilicon film 423.

A polysilicon film 424 is deposited on the field shield element isolation structures 422 exposed upon planarization and on the polysilicon film 423 to a thickness of about 50 to 150 nm by CVD to bury the field shield element isolation structures 422 with the polysilicon films 423 and 424.

A silicide film of a refractory metal such as tungsten (w) may be formed on the planarized polysilicon film 424 by sputtering to form a polycide layer consisting of the polysilicon film 424 and the silicide film.

Figure 22G:
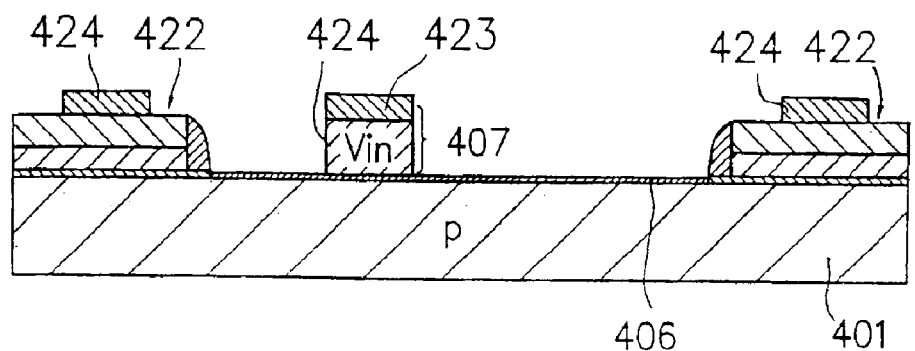

As shown in FIG. 22G, the polysilicon films 423 and 424 are patterned by photolithography and dry etching to form strip-shaped gate electrodes (gate wiring layers) 407. The gate electrodes (gate wiring layers) 407 are formed at almost the same level across the element formation region 421 and the field shield element isolation structures 422. On the element formation region 421, the gate electrode is constituted by the polysilicon films 423 and 424. On the field shield element isolation structure 422, the gate wiring layer is constituted by the polysilicon film 424.

Figure 22H:
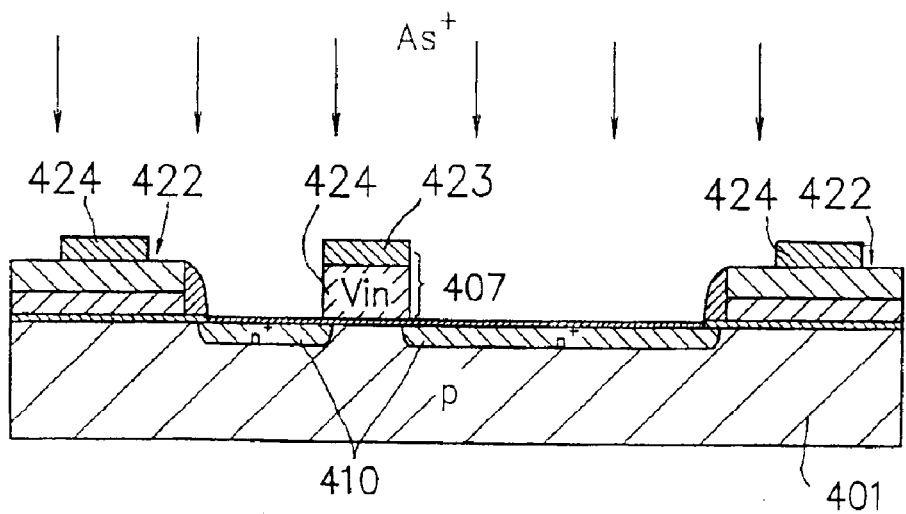

As shown in FIG. 22H, the silicon semiconductor substrate 401 is doped with an n-type impurity. More specifically, using the gate electrode 407 as a mask, arsenic (As) is ion-implanted into the surface regions of the silicon semiconductor substrate 401 on both sides of the gate electrode 407 in the element formation region 421, thereby forming each diffusion layer 410 serving as the source/drain of an NMOS transistor.

Figure 22I:
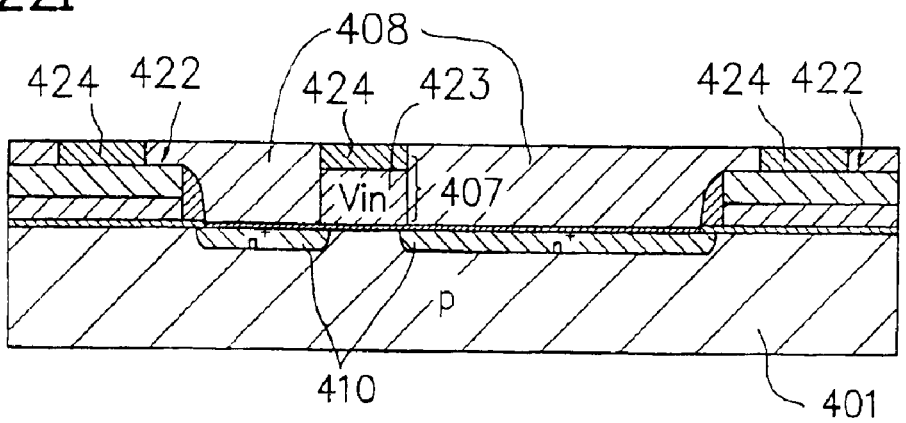

As shown in FIG. 22I, a silicon oxide film 408 is deposited on the entire surface by CVD to a thickness sufficient to bury the gate electrode 407. Using as stoppers with the gate electrode 407 on the element formation region 421 and the gate wiring layers 407 (i.e., the polysilicon films 424) on the field shield element isolation structures 422 as stoppers, the surface of the silicon oxide film 408 is planarized by CMP until the gate electrode (gate wiring layer) 407 is exposed. At this time, an alkali solution based on a silica powder and KOH or ammonia is preferably used as a slurry for CMP of the silicon oxide film 408.

Figure 22J:
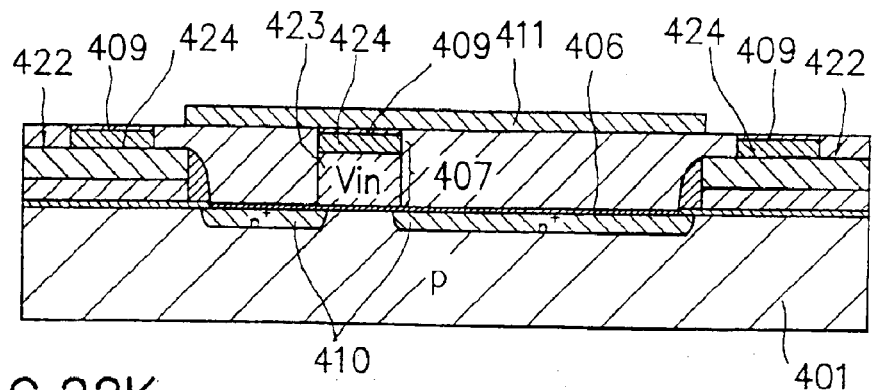

As shown in FIG. 22J, the upper surfaces of the gate electrodes (gate wiring layers) 407 are thermally oxidized to form gate oxide films 409 on the upper surfaces of the gate electrodes (gate wiring layers) 407. A polysilicon film 411 is deposited on the entire surface including the gate oxide films 409 to a thickness of about 50 to 250 nm by CVD. The polysilicon film 411 is patterned by photolithography and dry etching to leave the polysilicon film 411 into a predetermined shape including the gate oxide film 409.

Figure 22K:
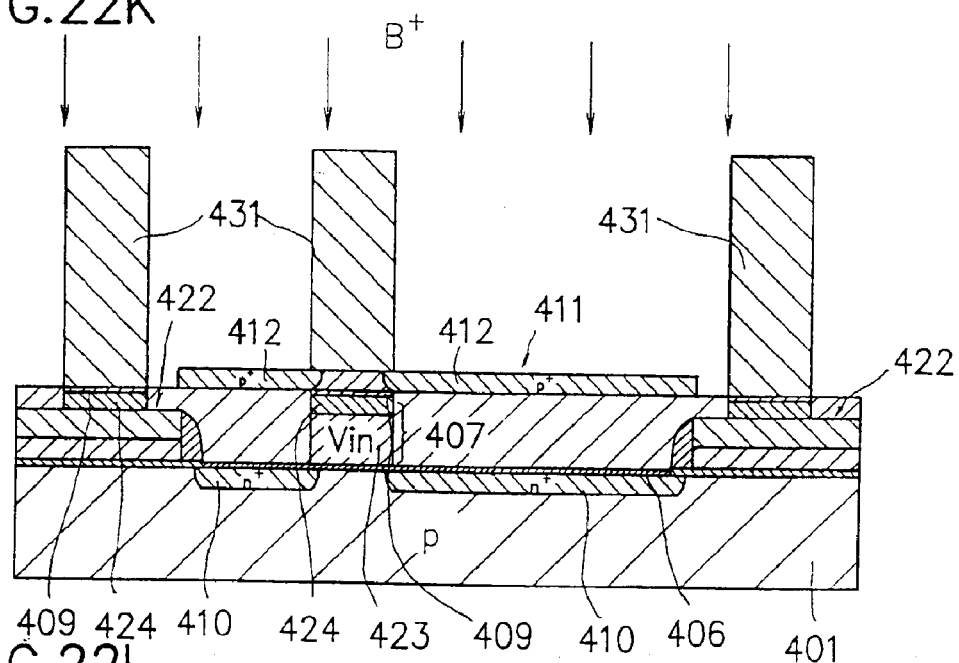

As shown in FIG. 22K, a photoresist 431 is applied to the entire surface and patterned by photolithography. The photoresist 431 is left into a predetermined shape on the gate oxide film 409 on the field shield element isolation structure 422 to have almost the same width as that of the gate oxide film 409, and on the polysilicon film 411 on the element formation region 421 to also have almost the same width as that of the gate oxide film 409.

The entire surface is doped with a p-type impurity using the photoresist 431 as a mask. More specifically, boron (B) is ion-implanted into the polysilicon film 411 to form each diffusion layer 412 serving as the source/drain of a PMOS transistor in the polysilicon film 411 except a portion immediately below the photoresist 431 on the polysilicon film 411.

Figure 22L:
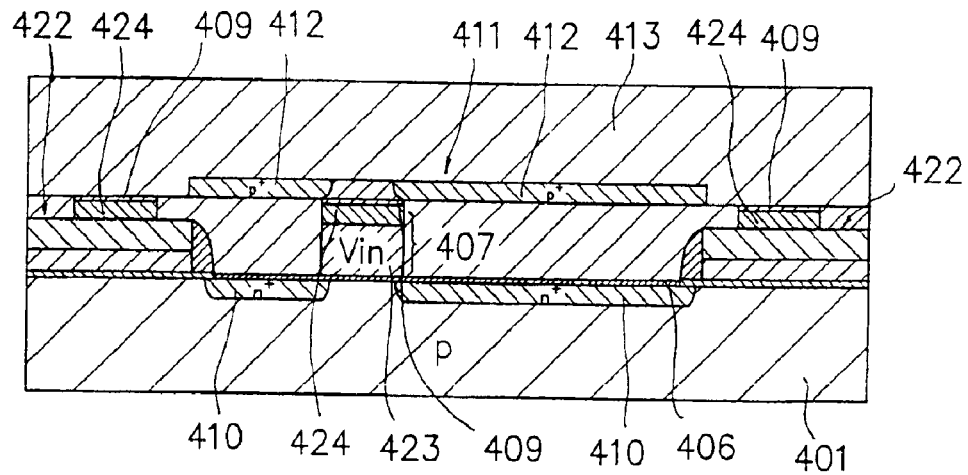

As shown in FIG. 22L, the photoresist 431 is removed by, e.g., ashing. A BPSG (BoroPhosphoSilicate Glass) film 413 is formed on the entire surface to bury the polysilicon film 411. The BPSG film 413 is reflowed by annealing to planarize the surface.

As shown in FIG. 22M, the BPSG film 413 is patterned to form a contact hole 414 extending through the BPSG film 413 to expose a part of the surface of one diffusion layer 412 in the polysilicon film 411. In addition, the BPSG film 413, the other diffusion layer 412 in the polysilicon film 411, the silicon oxide film 408, and the gate oxide film 406 are patterned to form a contact hole 415 extending through the BPSG film 413, the other diffusion layer 412 in the polysilicon film 411, the silicon oxide film 408, and the gate oxide film 406 to expose a part of the surface of one diffusion layer 410 formed in the surface region of the silicon semiconductor substrate 401.

An aluminum alloy film is formed on the entire surface including the contact holes 414 and 415 by sputtering. The aluminum alloy film is patterned to form a metal wiring layer 416 which is filled in the contact hole 414, electrically connected to one diffusion layer 412 in the polysilicon film 411, and connected to a power supply terminal Vdd, and a metal wiring layer 417 which is filled in the contact hole 415, electrically connected to the other diffusion layer 412 in the polysilicon film 411 and the other diffusion layer 410 formed in the silicon semiconductor substrate 401, and connected to an output terminal Vout, thereby completing the CMOS transistor.

As described above, the CMOS transistor of the seventh embodiment is constituted by the NMOS transistor and the PMOS transistor which share the gate electrode 407. The NMOS transistor is constituted by the gate electrode 407 and the pair of diffusion layers 410. The PMOS transistor is constituted by the gate electrode 407 and the polysilicon film 411 formed on the silicon oxide film 408 which buries the gate electrode (gate wiring layer) 407 to expose the surface of the gate oxide film 409 on the gate electrode 407 and has a planarized surface. The pair of diffusion layers 412 are formed in the polysilicon film 411 on both sides of the gate electrode 407. The metal wiring layer 416 which is to be connected to the power supply terminal Vdd is connected to the diffusion layer 410 serving as the drain of the NMOS transistor and the diffusion layer 412 serving as the drain of the PMOS transistor. In addition, the metal wiring layer 417 which is to be connected to the output terminal Vout is connected to the diffusion layer 412 serving as the source of the PMOS transistor. The common gate electrode (gate wiring layer) 407 is connected to an input terminal Vin, and the diffusion layer 410 serving as the source of the NMOS transistor is connected to a ground terminal Vss.

According to the seventh embodiment, the PMOS transistor which has one thin polysilicon film and shares the gate electrode 407 with the NMOS transistor is formed on the planarized NMOS transistor. Therefore, a flat semiconductor device having a CMOS structure which has a small occupied area and enables further integration is realized without using any special semiconductor substrate such as an SOI structure.

Figure 23:
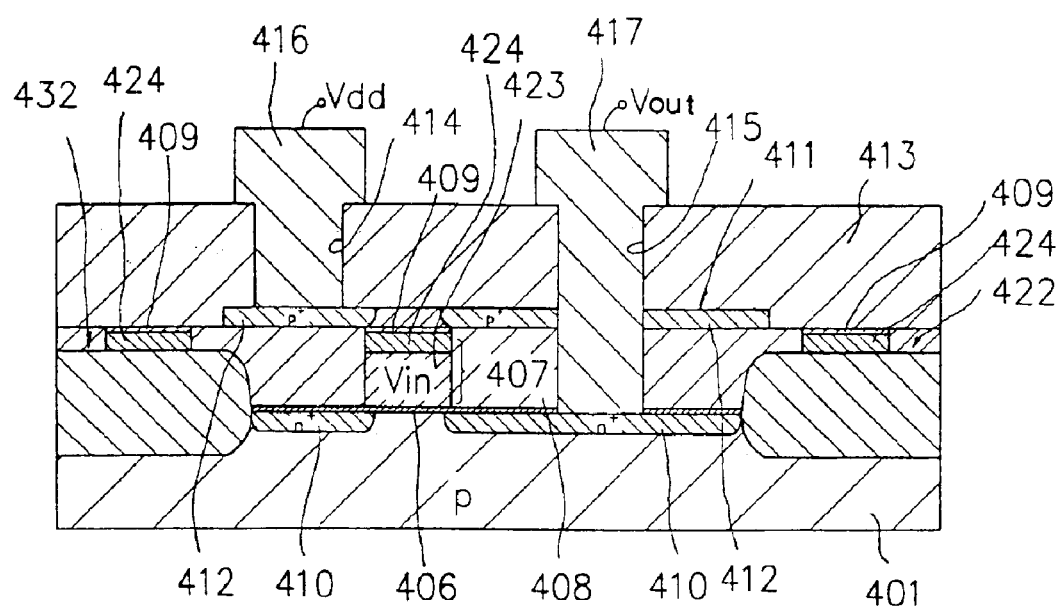
FIG. 23 is a schematic sectional view showing a case wherein an element isolation structure is formed as a field oxide film by LOCOS.

In the seventh embodiment, the field shield element isolation structures 422 is formed as an element isolation structure. However, in place of the field shield element isolation structures 422, a field oxide film 432 may be formed by so-called LOCOS (Local Oxidation of Silicon), as shown in FIG. 23.

-First Modification-

Figure 24:
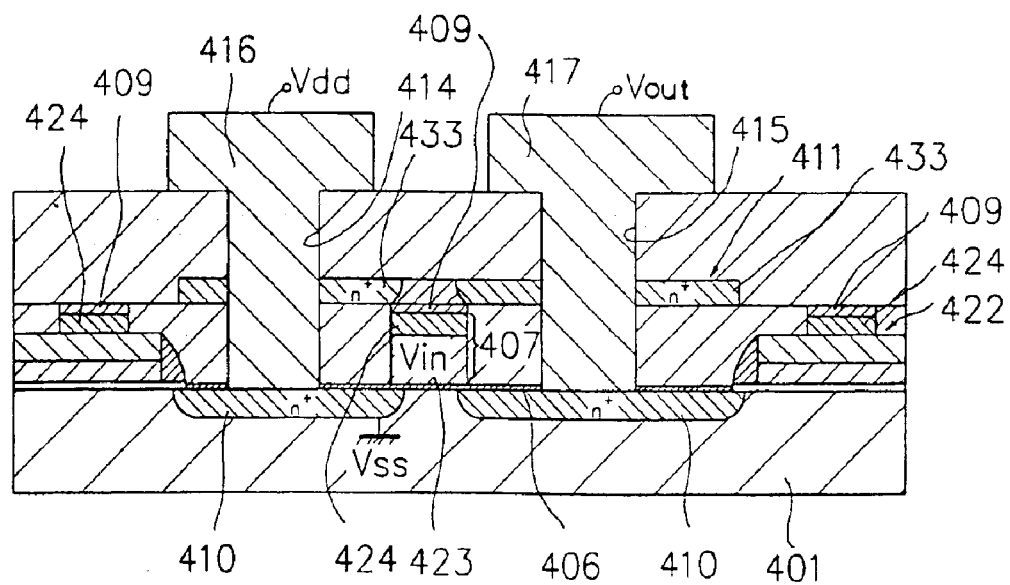
FIG. 24 is a schematic sectional view showing a CMOS transistor according to the first modification of the seventh embodiment.

The first modification of the CMOS transistor according to the seventh embodiment will be described below. In the first modification, a MOS transistor having a two-layer structure will be exemplified as a semiconductor device. This MOS transistor having a two-layer structure has almost the same structure as that of the CMOS transistor of the seventh embodiment. However, this MOS transistor is different in that two MOS transistors are of the same conductivity type. FIG. 24 is a schematic sectional view showing the MOS transistor having the two-layer structure of the first modification. The same reference numerals as in the CMOS transistor of the seventh embodiment denote the same constituent elements in this modification, and a detailed description thereof will be omitted.

The MOS transistor having a two-layer structure according to the first modification is constituted by upper and lower NMOS transistors which share the gate electrode 407. The lower NMOS transistor has the gate electrode (gate wiring layer) 407 and the pair of diffusion layers 410, as in the seventh embodiment. The upper NMOS transistor is constituted by the gate electrode 407 and the polysilicon film 411 formed on the silicon oxide film 408 which buries the gate electrode 407 to expose the gate oxide film 409 on the gate electrode 407 and has a planarized surface. An n-type impurity such as phosphorus (P) is ion-implanted into the polysilicon film 411 on both sides of the gate electrode 407 to form a pair of diffusion layers 433. The metal wiring layer 416 to be connected to the power supply terminal Vdd is connected to the diffusion layer 410 serving as the drain of the lower NMOS transistor and the diffusion layer 433 serving as the drain of the upper NMOS transistor. In addition, the metal wiring layer 417 to be connected to the output terminal Vout is connected to the diffusion layer 410 serving as the source of the lower NMOS transistor and the diffusion layer 433 serving as the source of the upper NMOS transistor. The common gate electrode 407 is connected to the input terminal Vin, and the diffusion layer 410 serving as the source of the lower NMOS transistor is connected to the ground terminal Vss.

According to the first modification, as in the seventh embodiment, the upper NMOS transistor which has one thin polysilicon film and shares the gate electrode 407 with the NMOS transistor is formed on the planarized lower NMOS transistor. Therefore, a flat semiconductor device having a two-layer MOS structure which has a small occupied area and enables further integration is realized without using any special semiconductor substrate such as an SOI structure.

-Second Modification-

The second modification of the CMOS transistor according to the seventh embodiment will be described below. In the second modification, a MOS transistor having a two-layer structure will be exemplified as a semiconductor device. This MOS transistor having a two-layer structure has almost the same structure as that of the CMOS transistor of the seventh embodiment. However, this MOS transistor is different in that each of two MOS transistors has a gate electrode. The structure of the CMOS transistor and a method of manufacturing the CMOS transistor will be described together. FIGS. 22A to 22F and FIGS. 25A to 25J are schematic sectional views showing the MOS transistor having the two-layer structure of the second modification. The same reference numerals as in the CMOS transistor of the seventh embodiment denote the same constituent elements in this modification, and a detailed description thereof will be omitted.

With processes shown in FIGS. 22A to 22F described in the seventh embodiment, the polysilicon film 423 is surface-polished by CMP to planarize the surface. The polysilicon film 424 is deposited on the polysilicon film 423 and on the field shield element isolation structures 422 exposed upon planarization.

Figure 25A:
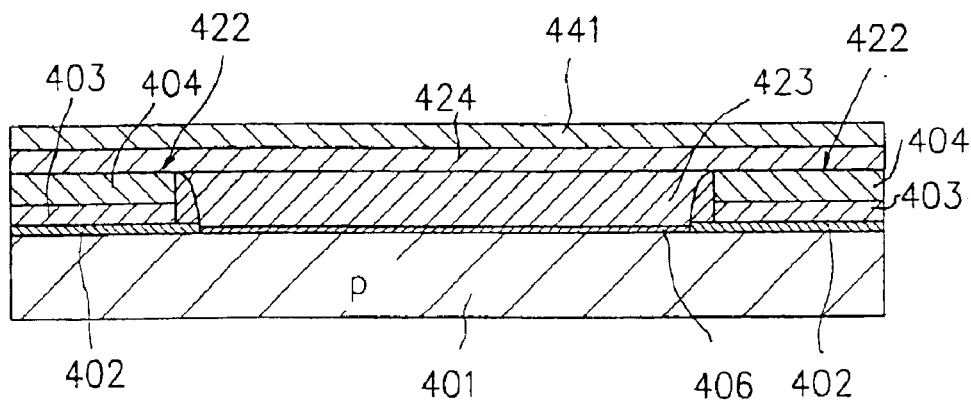
FIGS. 25A to 25J are schematic sectional views showing steps in manufacturing a MOS transistor according to the second modification of the seventh embodiment.

As shown in FIG. 25A, a silicon oxide film 441 serving as a cap insulating film is deposited on the polysilicon film 424 by CVD.

Figure 25B:
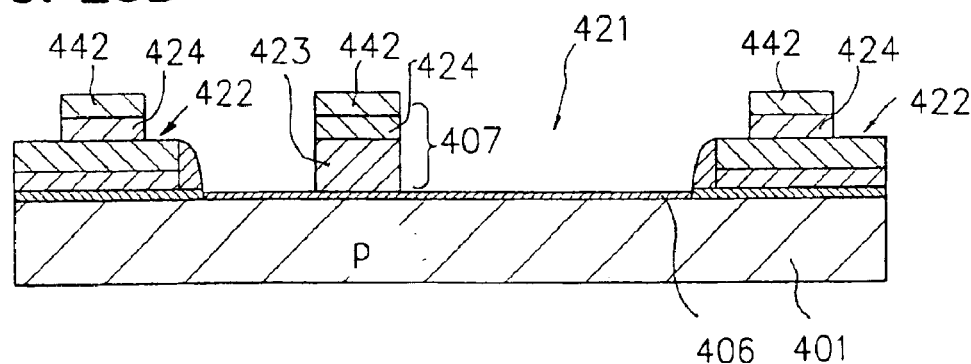

As shown in FIG. 25B, the polysilicon films 423 and 424 and the silicon oxide film 441 are patterned by photolithography and dry etching to form the strip-shaped gate electrodes (gate wiring layers) 407 and cap insulating films 442 of the gate electrodes (gate wiring layers) 407. The gate electrodes (gate wiring layers) 407 and the cap insulating films 442 are formed at almost the same levels, respectively, over the element formation region 421 and the field shield element isolation structures 422. On the element formation region 421, the gate electrode 407 is constituted by the polysilicon films 423 and 424. On the field shield element isolation structure 422, the gate wiring layer 407 is constituted by the polysilicon film 424.

Figure 25C:
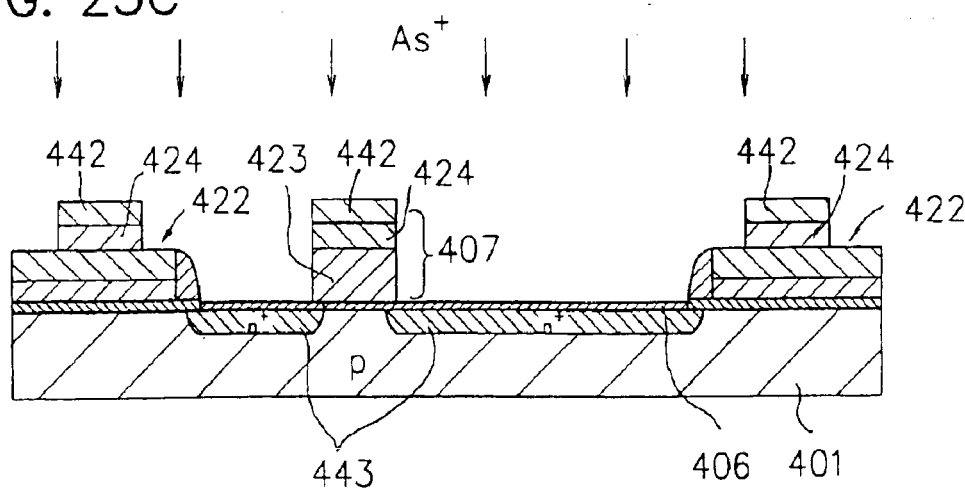

As shown in FIG. 25C, the silicon semiconductor substrate 401 is doped with an n-type impurity. More specifically, using the cap insulating film 442 as a mask, arsenic (As) is ion-implanted into the surface regions of the silicon semiconductor substrate 401 on both sides of the gate electrode 407 in the element formation region 421 to form relatively lightly doped $n^-$-type diffusion region 443.

Figure 25D:
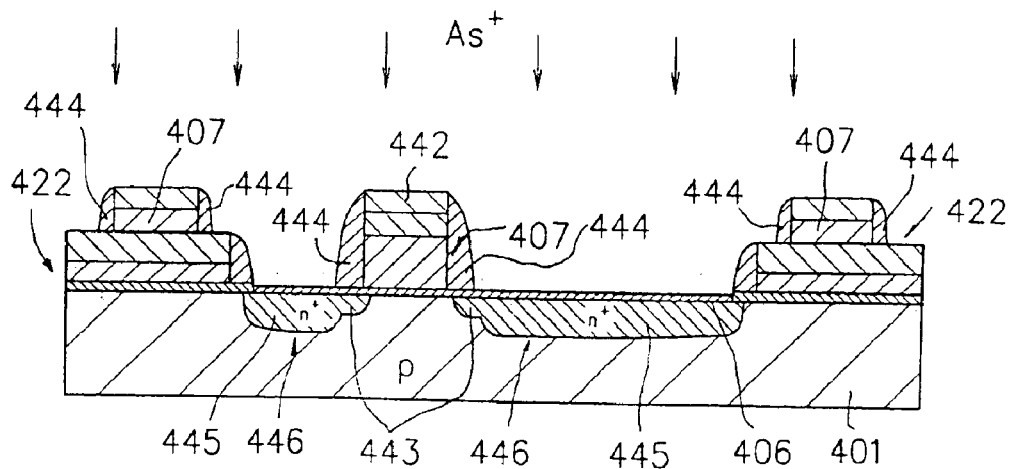

As shown in FIG. 25D, a silicon oxide film is deposited on the entire surface including the field shield element isolation structures 422 by CVD. The entire surface of the silicon oxide film is anisotropically etched to leave the silicon oxide film only on the side surfaces of the gate electrodes (gate wiring layers) 407 and the cap insulating films 442, thereby forming side walls 444.

Next, the silicon semiconductor substrate 401 is doped with an n-type impurity. More specifically, using the cap insulating film 442 and the side walls 444 as masks, arsenic (As) is ion-implanted into the surface regions of the silicon semiconductor substrate 401 on both sides of the side walls 444 in the element formation region 421 to form relatively heavily doped $n^+$-type diffusion regions 445. At this time, the $n^-$-type diffusion regions 443 are joined to the $n^+$-type diffusion regions 445 to form impurity diffusion layers 446 each having an LDD (Lightly Doped Drain) structure.

Figure 25E:
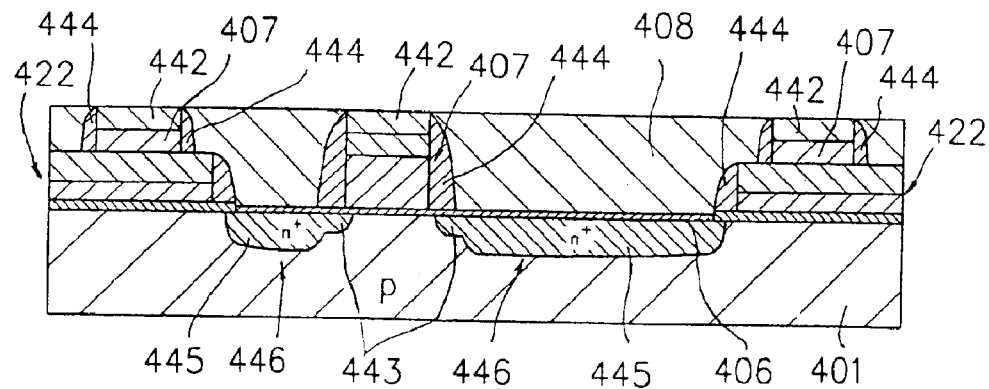

As shown in FIG. 25E, the silicon oxide film 408 is deposited on the entire surface by CVD to a thickness for burying the cap insulating films 442. The surface of the silicon oxide film 408 is planarized by CMP until the cap insulating films 442 on the element formation region 421 and on the field shield element isolation structures 422 are exposed.

Figure 25F:
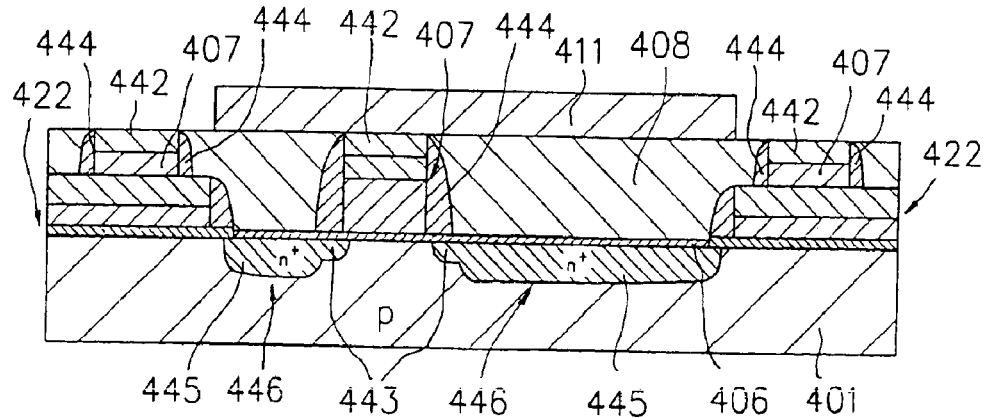

As shown in FIG. 25F, the polysilicon film 411 is deposited to a thickness of about 50 to 250 nm by CVD. The polysilicon film 411 is patterned by photolithography and dry etching to leave the polysilicon film 411 into a predetermined shape including the cap insulating film 442.

Figure 25G:
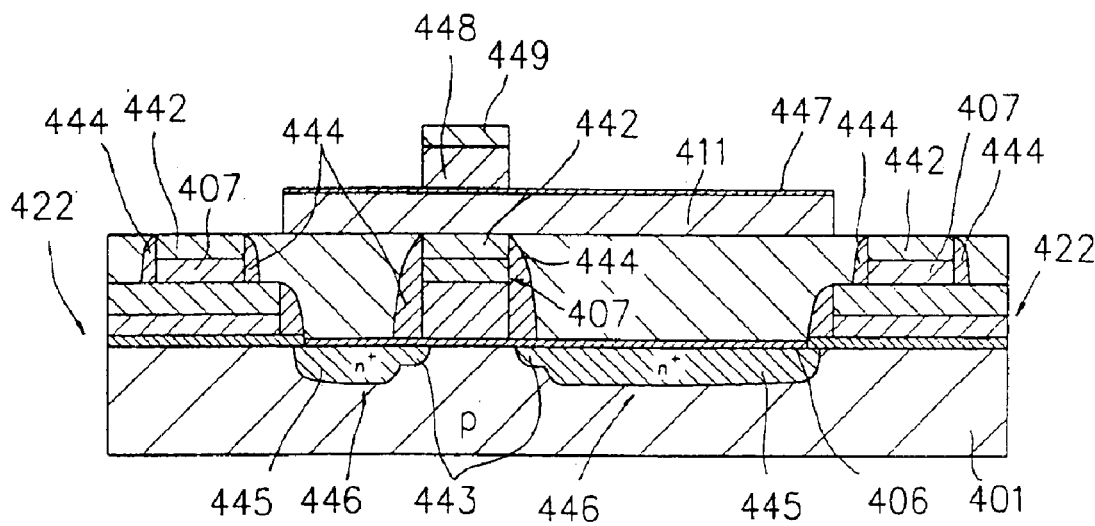

As shown in FIG. 25G, the upper surface of the polysilicon film 411 is thermally oxidized to form a gate oxide film 447 on the upper surface of the silicon oxide film 441. A polysilicon film and a silicon oxide film are sequentially deposited on the entire surface by CVD to cover the polysilicon film 411 and the gate oxide film 447. The polysilicon film and the silicon oxide film are patterned by photolithography and dry etching to form a gate electrode 448 and a cap insulating film 449 of the gate electrode 448.

Figure 25H:
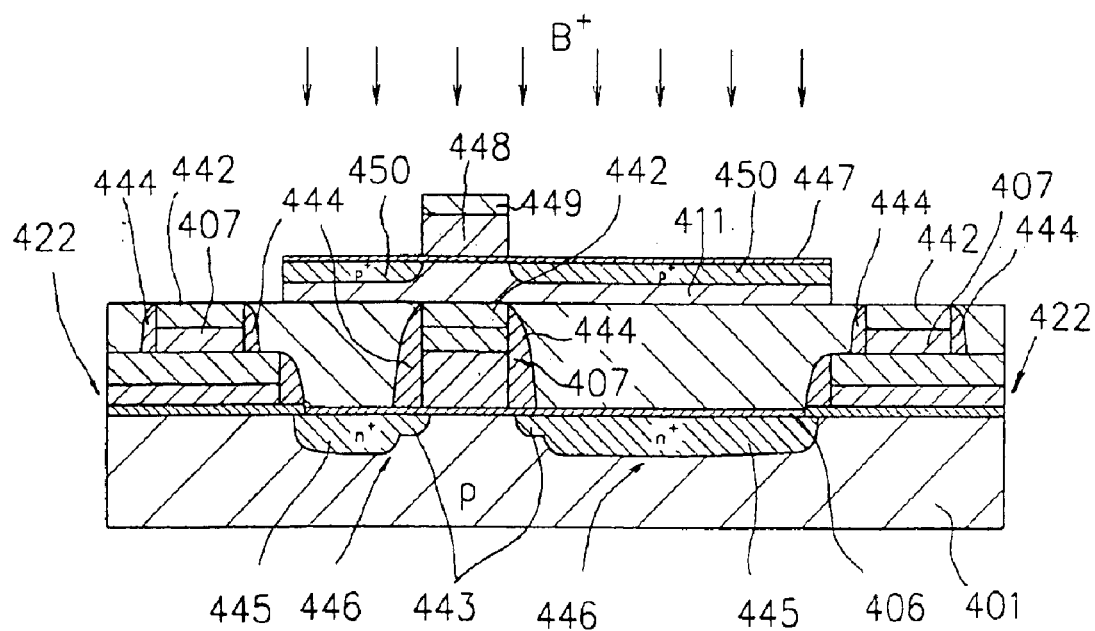

As shown in FIG. 25H, the polysilicon film 411 is doped with a p-type impurity. More specifically, using the cap insulating film 449 as a mask, boron (B) is ion-implanted into the surface regions of the polysilicon film 411 on both sides of the gate electrode 448 to form relatively lightly doped $p^-$-type diffusion regions 450.

Figure 25I:
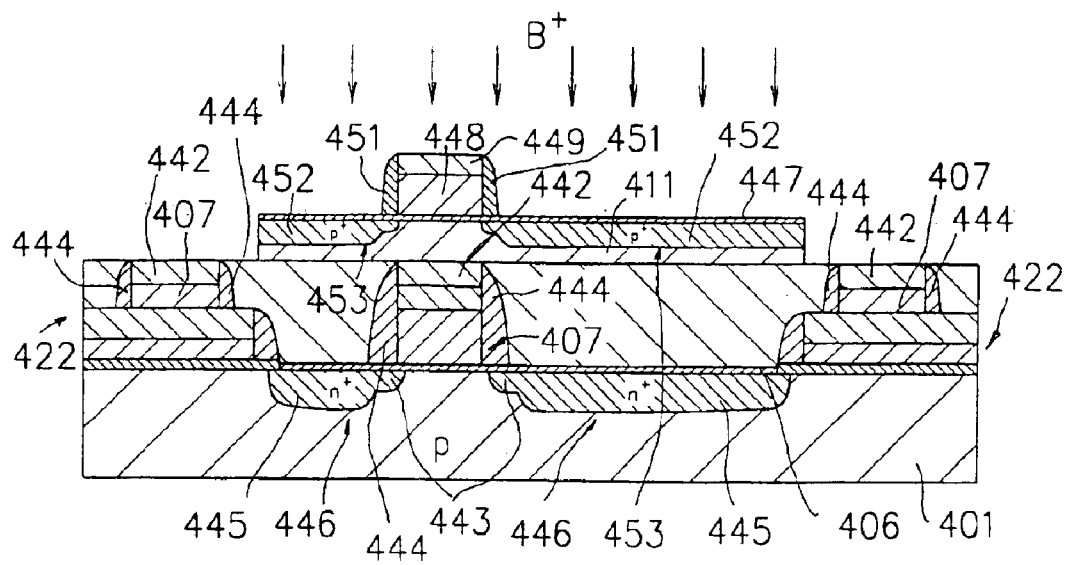

As shown in FIG. 25I, a silicon oxide film is deposited on the entire surface by CVD. The entire surface of the silicon oxide film is anisotropically etched to leave the silicon oxide film only on the side surfaces of the gate electrode 448 and the cap insulating film 449, thereby forming side walls 451.

Next, the polysilicon film 411 is doped with a p-type impurity. More specifically, using the cap insulating film 449 and the side walls 451 as masks, boron (B) is ion-implanted into the surface regions of the polysilicon film 411 on both sides of the side walls 451 to form relatively heavily doped $p^+$-type diffusion regions 452. At this time, the $p^-$-type diffusion regions 450 are joined to the $p^+$-type diffusion regions 452 to form impurity diffusion layers 453 each having an LDD structure.

Figure 25J:
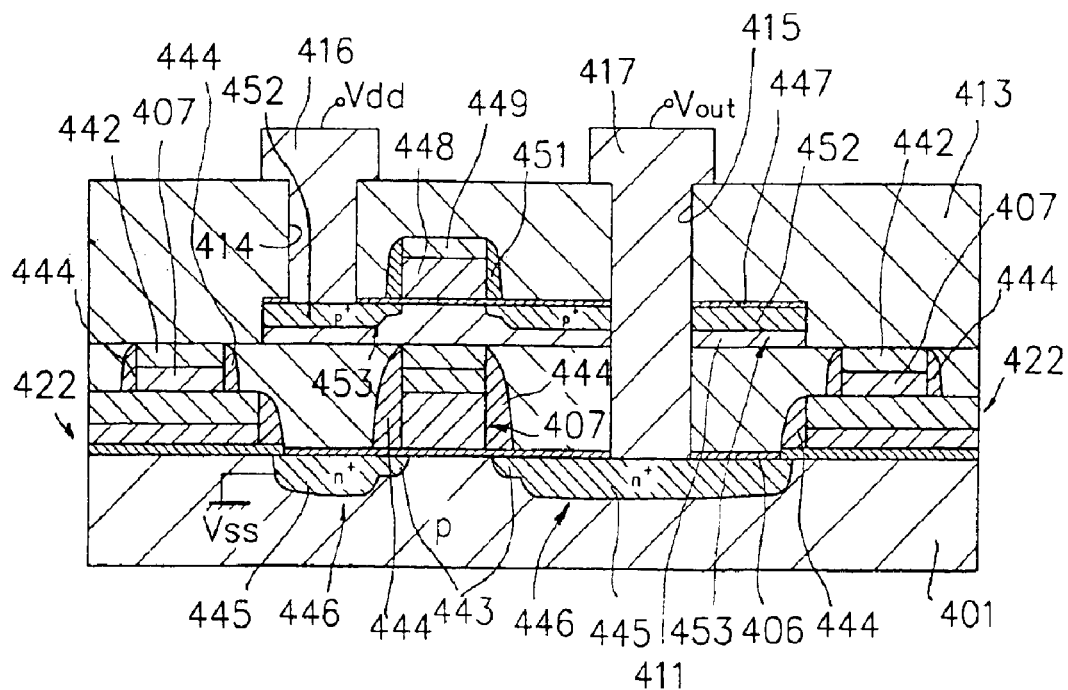

As shown in FIG. 25J, the BPSG (BoroPhosphoSilicate Glass) film 413 is formed on the entire surface to bury the polysilicon film 411 and the cap insulating film 449. The BPSG film 413 is reflowed by annealing to planarize the surface.

The BPSG film 413 is patterned to form the contact hole 414 extending through the BPSG film 413 and the gate oxide film 447 to expose a part of the surface of one impurity diffusion layer 453 in the polysilicon film 411. In addition, the BPSG film 413, the gate oxide film 447, the polysilicon film 411 (the other diffusion layer 453), the silicon oxide film 408, and the gate oxide film 406 are patterned to form the contact hole 415 to expose part of the surface of one impurity diffusion layer 446 formed in the surface region of the silicon semiconductor substrate 401.

An aluminum alloy film is formed on the entire surface including the contact holes 414 and 415 by sputtering. The aluminum alloy film is patterned to form the metal wiring layer 416 which is filled in the contact hole 414, electrically connected to one impurity diffusion layer 453 in the polysilicon film 411, and connected to the power supply terminal Vdd, and the metal wiring layer 417 which is filled in the contact hole 415, electrically connected to the other impurity diffusion layer 453 in the polysilicon film 411 and one impurity diffusion layer 446 formed in the silicon semiconductor substrate 401, and connected to the output terminal Vout, thereby completing the CMOS transistor.

According to the second modification, the upper PMOS transistor which has one thin polysilicon film 411 and the gate electrode 448 is formed on the planarized lower NMOS transistor. Therefore, a flat semiconductor device having a two-layer MOS structure which has a small occupied area and enables further integration is realized without using any special semiconductor substrate such as an SOI structure.

According to the second modification, each of the impurity diffusion layers 446 and 453 serving as the sources/drains of the NMOS and PMOS transistors can be formed to have an LDD structure. Therefore, the breakdown voltage can be largely raised.

-Eighth Embodiment-

The eighth embodiment of the present invention will be described next. In the eighth embodiment, an example in which the present invention is applied to a MOS transistor having a pad polysilicon film functioning as an leading-out electrode will be described, as in the first embodiment. In the eighth embodiment, the structure of the MOS transistor and a method of manufacturing the MOS transistor will be described together. FIGS. 26A to 26H are schematic sectional views showing steps in manufacturing the MOS transistor.

Figure 26A:
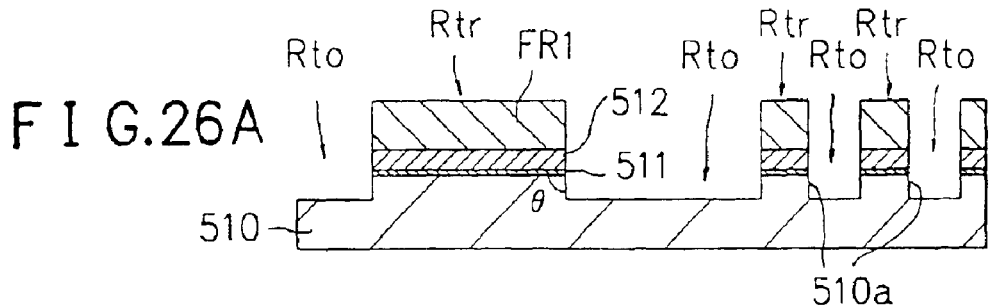
FIGS. 26A to 26H are schematic sectional views showing steps in manufacturing a MOS transistor according to the eighth embodiment.

As shown in FIG. 26A, a gate insulating film 511 (thickness: about 10 nm) and a polysilicon film 512 (first conductive film) (thickness: about 150 to 300 nm) serving as an etching stopper film are deposited on a silicon semiconductor substrate 510. Thereafter, a photoresist film FR1 is formed on the polysilicon film 512 to form element isolation regions Rto and cover element formation regions Rtr. Etching is performed using the photoresist film FR1 as a mask to remove the polysilicon film 512 and the gate insulating film 511. The semiconductor substrate 510 is further etched to form groove portions 510a each having a predetermined depth (about 500 nm). At this time, the etching conditions are set such that an angle θ between the surface of the semiconductor substrate 510 and the side surface of the groove portion 510a is close to 90° (within the range of about 80° to 100°).

Figure 26B:
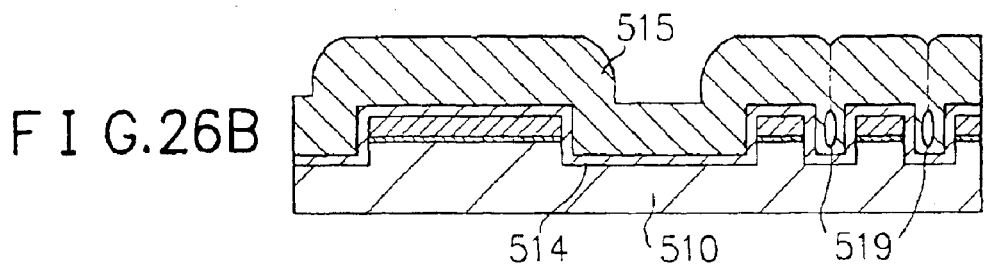

As shown in FIG. 26B, the photoresist films FR1 are removed by, e.g., ashing. A diffusion prevention film 514 having a thickness of about 20 nm and consisting of a silicon oxide film (e.g., a thermal oxide film, a silane-based HTO film, or a TEOS-based HTO film) having a thickness smaller than the depth of the groove portion 510a is deposited by low-pressure CVD. In addition, an isolation insulating film 515 consisting of a silicon oxide film having a thickness (e.g., about 800 to 1,000 nm) larger than the depth of the groove portion 510a is deposited on the diffusion prevention film 514 to bury the groove portions 510a with the isolation insulating film 515. The isolation insulating film 515 consists of, e.g., a silane-based BPSG film or a TEOS-based BPSG film having reflow properties. However, not only the BPSG film but also a PSG film, a BSG film, or a silicon oxide film containing arsenic may be used. Alternatively, the reflow properties may be obtained by depositing a silicon oxide film and ion-implanting an impurity in the silicon oxide film.

As shown in FIG. 26B, since the aspect ratio of the groove portion 510a is high in the narrow element isolation region Rto, voids 519 are apt to be generated in the isolation insulating film 515 at a high probability.

Figure 26C:
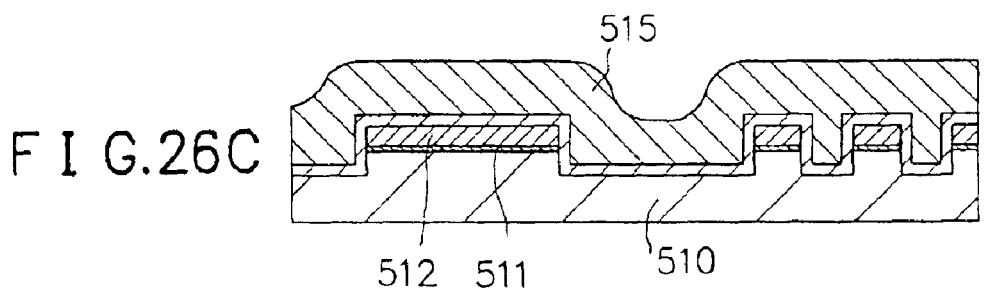

As one of the characteristic features of the eighth embodiment, annealing is performed in the step shown in FIG. 26C at, e.g., 850° C. for about 30 minutes to reflow the isolation insulating film 515, thereby eliminating the voids 519.

Figure 26D:
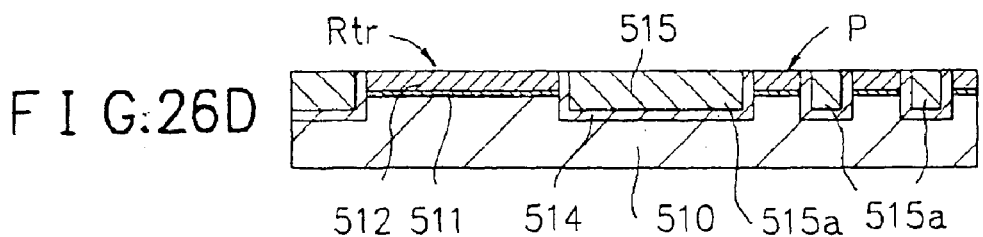

As shown in FIG. 26D, e.g., chemical mechanical polishing (CMP) is performed using the polysilicon films 512 as stoppers to planarize the isolation insulating film 515. The upper surface formed at this time on the silicon semiconductor substrate 510 will be referred to as a planarized surface P. More specifically, the isolation insulating films 515 and the diffusion prevention films 514 in the element formation regions Rtr are completely removed to expose the surfaces of the polysilicon films 512. At this time, element isolation structures 515a are formed by the isolation insulating films 515 which are filled in the groove portions 510a.

Figure 26E:
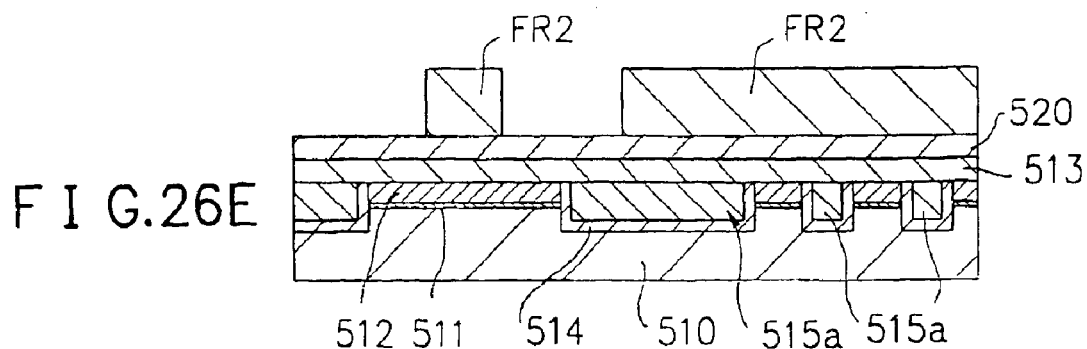

As shown in FIG. 26E, a polysilicon film 513 serving as the second conductive film and having a thickness of about 100 to 200 nm and a silicon oxide film 520 serving as a cap insulating film of a gate electrode are sequentially deposited on the planarized surface P. Photoresist films FR2 are formed on the silicon oxide film 520 to cover regions where a gate electrode or the like is to be formed.

Figure 26F:
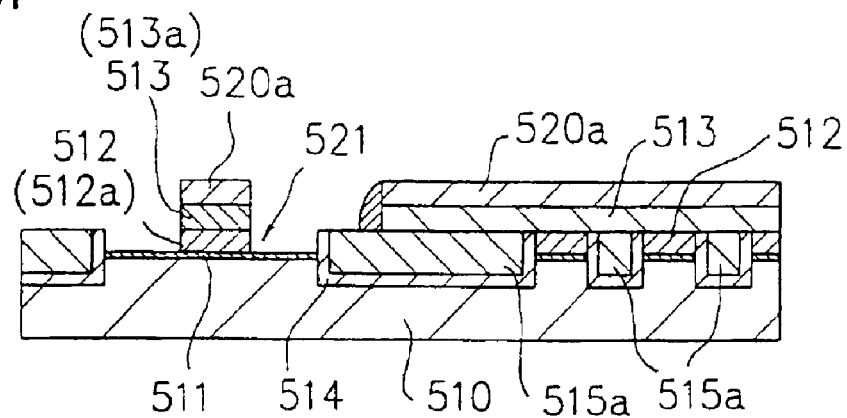

As shown in FIG. 26F, the two polysilicon films 512 and 513 and the silicon oxide film 520 are etched using the photoresist films FR2 as masks to pattern gate electrodes 521 each having a cap insulating film 520a and consisting of a lower layer 512a and an upper layer 513a. At this time, the upper surface of the cap insulating film 520a on the gate electrode 521 on the element formation region Rtr (on the gate insulating film 511) is almost flush with the upper surface of the cap insulating film 520a on the gate electrode 521 on the element isolation structure 515a.

Figure 26G:
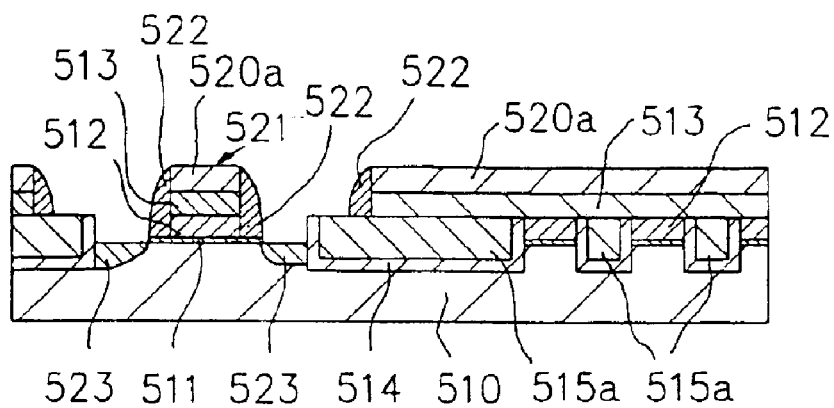

As shown in FIG. 26G, the photoresist films FR2 are removed by, e.g., ashing. A silicon oxide film is deposited on the entire surface to cover the gate electrodes 521. The entire surface is anisotropically etched to leave the silicon oxide film on the side surfaces of the gate electrodes 521, thereby forming side walls 522.

An impurity of a conductivity type opposite to that of the silicon semiconductor substrate 510 is ion-implanted into the surface regions of the silicon semiconductor substrate 510 on both sides of the gate electrode 521 using the gate electrode 521 as a mask (i.e., using the cap insulating film 520a as a mask) to form a pair of diffusion layers 523 serving as a source and drain.

Figure 26H:
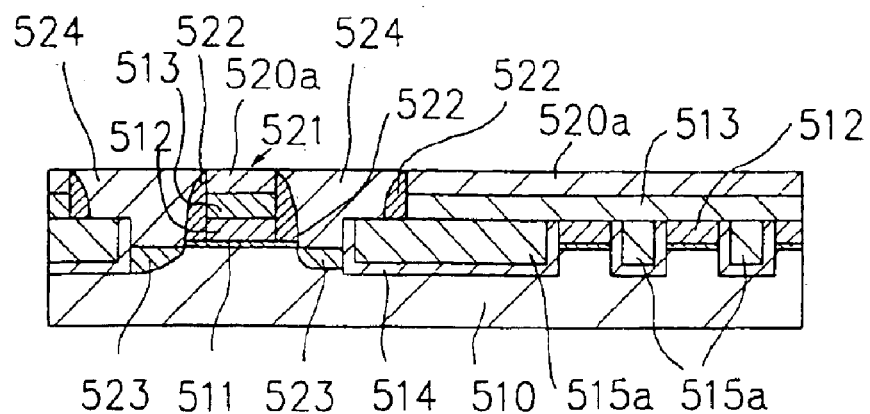

As shown in FIG. 26H, a polysilicon film is deposited on the entire surface to a thickness for burying the gate electrode 521. The polysilicon film is polished by CMP using the cap insulating film 520a as a stopper to planarize the polysilicon film, thereby forming pad polysilicon films 524 which are filled between the adjacent gate electrodes 521 with the side walls 522 intervened and function as the leading-out electrodes of the diffusion layers 523. As a method of forming the pair of diffusion layers 523, the polysilicon film may be doped with an impurity. After the pad polysilicon films 524 are formed, the pad polysilicon film 524 may be subjected to annealing to diffuse the impurity into the silicon semiconductor substrate 510 to form the diffusion layers 523.

Thereafter, various wiring layers connected to the pad polysilicon films 524, insulating interlayers for burying the wiring layers, and the like are formed, thereby completing the MOS transistor.

In the eighth embodiment, even if the interval between the element isolation regions Rto becomes small, and the aspect ratio of the groove portion 510a becomes high to generate the void 519 in the isolation insulating film 515, such void 519 can be eliminated by reflowing the isolation insulating film 515. Particularly, in the eighth embodiment, the gate insulating film 511 and the polysilicon film 512 are formed before formation of the element isolation structure 515a. For this reason, the surface of the silicon semiconductor substrate 510 is not exposed before deposition of the isolation insulating film 515 having the reflow properties. Therefore, the transistor characteristics do not vary due to diffusion of an impurity such as boron or phosphorus contained in the isolation insulating film 515. In addition, since the underlayer has no steps in patterning the gate electrode 521, a fine pattern can be stably formed.

In the eighth embodiment, the upper layer 513a on the gate electrode 521 is formed of the polysilicon film 513. However, the upper layer 513a may be formed of a silicide film of, e.g., WSi or TiSi, or a multilayered film of a barrier metal such as TiN and a refractory metal film of, e.g., W to lower the resistance.

In the eighth embodiment, the diffusion prevention film 514 is formed immediately below the isolation insulating film 515, although the diffusion prevention film 514 need not always be formed. However, when the diffusion prevention film 514 is formed, the impurity in the isolation insulating film 515 can be properly prevented from being diffused into the silicon semiconductor substrate 510, so that the reliability of the MOS transistor formed in the element formation region Rtr can be increased.

The step of reflowing the isolation insulating film 515 may be performed after completion of the planarization process.

-Ninth Embodiment-

Figure 27:
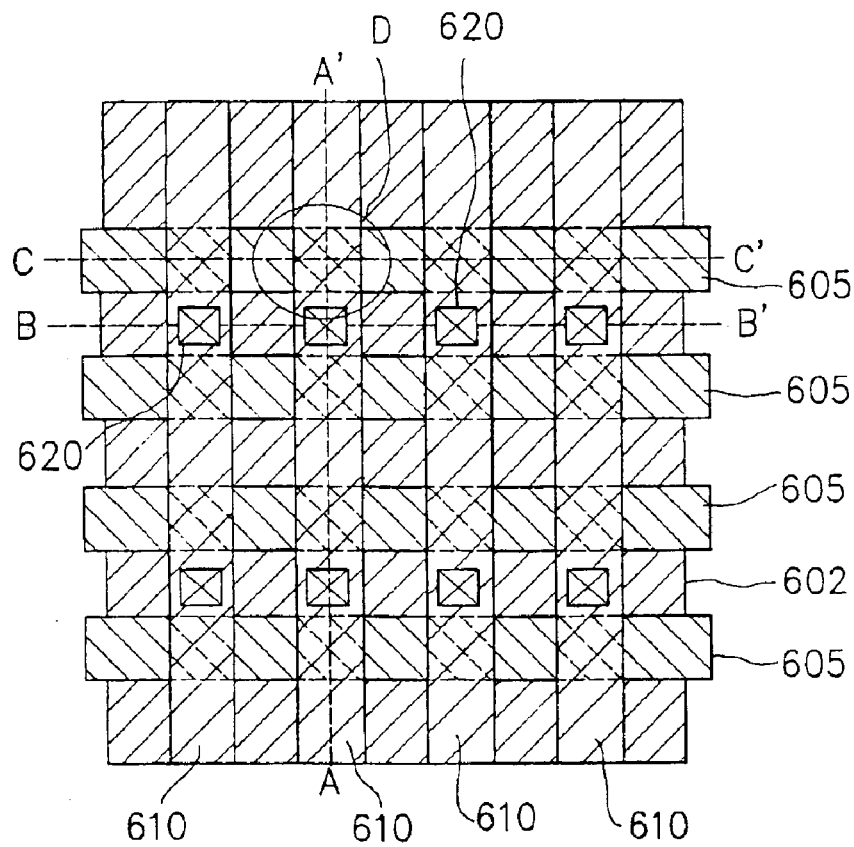
FIG. 27 is a schematic plan view showing the structure of an EEPROM according to the ninth embodiment.
Figure 28:
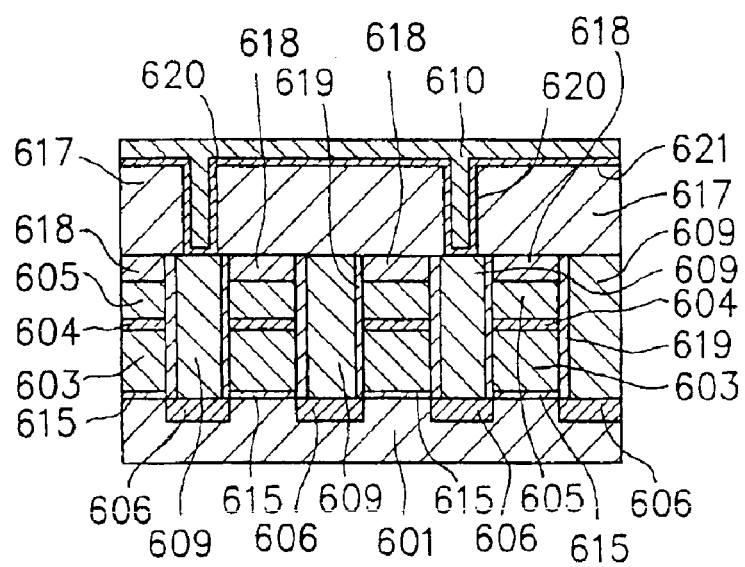
FIG. 28 is a schematic sectional view taken along a line A–A' in FIG. 27.
Figure 29:
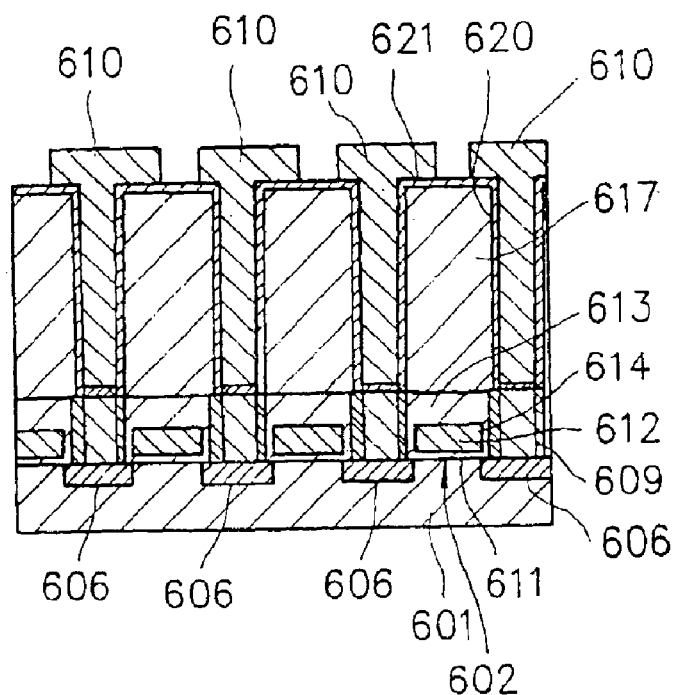
FIG. 29 is a schematic sectional view taken along a line B–B' in FIG. 27.
Figure 30:
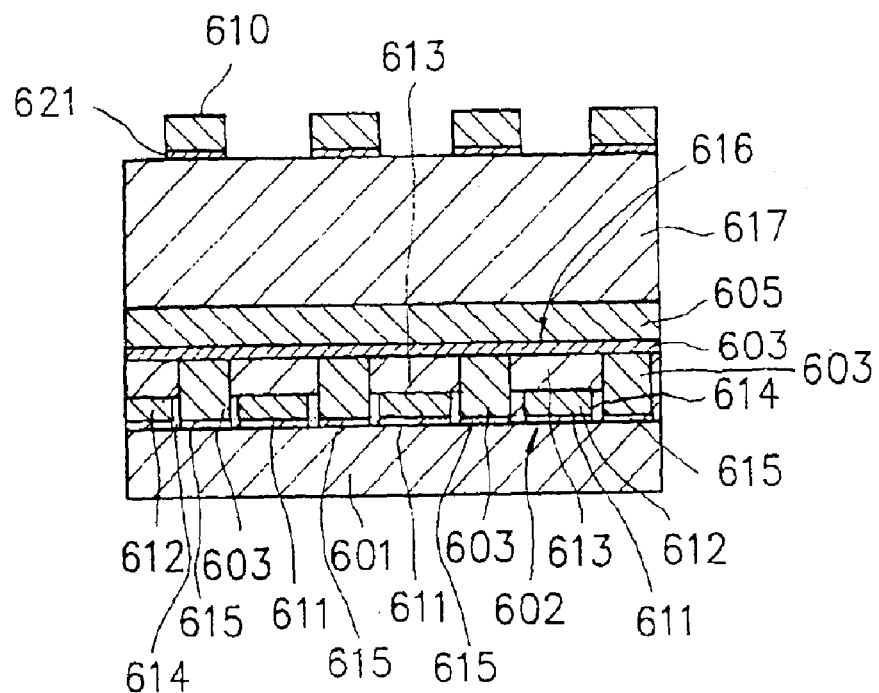
FIG. 30 is a schematic sectional view taken along a line C–C' in FIG. 27.

A semiconductor device according to the ninth embodiment and a manufacturing method therefor will be described below. In this case, an EEPROM as one of nonvolatile semiconductor memories will be exemplified as a semiconductor device. FIG. 27 is a schematic plan view showing the structure of an EEPROM according to the ninth embodiment. FIGS. 28, 29, and 30 are schematic sectional views taken along lines A–A', B–B', and C–C' in FIG. 27, respectively.

This EEPROM comprises floating gate electrodes 603 independently electrically floating in element formation regions surrounded by field shield element isolation structures 602 on a p-type silicon semiconductor substrate 601, strip-shaped control gate electrodes 605 formed to be almost perpendicular to the field shield element isolation structures 602 and oppose the one-row floating gate electrodes 603 through strip-shaped dielectric films 604, pairs of impurity diffusion layers 606 formed in the surface regions of the silicon semiconductor substrate 601 on both sides of the respective control gate electrodes 605 in the element formation regions, leading-out electrodes 609 filled between adjacent control gate electrodes 605 through cap insulating films 618 and side wall protective films 619 which cover the floating gate electrodes 603, the dielectric films 604, and the control gate electrodes 605, and connected to the impurity diffusion layers 606, and band-shaped bit lines 610 almost parallel to the field shield element isolation structures 602 and electrically connected to one (drain diffusion layer) of the impurity diffusion layers 606 through the leading-out electrode 609. In FIG. 27, a region enclosed by a circle D corresponds to a memory cell.

As shown in FIGS. 29 and 30, in the field shield element isolation structure 602, a polysilicon film 612 serving as a shield plate electrode and a cap insulating film 613 of the shield plate electrode are patterned into a strip shape such that they are coupled at almost the center. Thermal oxide films 614 are formed on the side surface portions of the polysilicon film 612, and the polysilicon film 612 serving as a shield plate electrode is surrounded by the thermal oxide film 611, the cap insulating film 613, and the thermal oxide films 614.

The floating gate electrodes 603 are formed of polysilicon films each patterned on a tunnel oxide film 615 formed in the element formation region, and electrically disconnected from each other. As shown in FIG. 28, the floating gate electrodes 603 are arranged at an almost equal interval over the impurity diffusion layers 606 on the element formation regions. In addition, as shown in FIG. 30, the floating gate electrodes 603 are filled between the field shield element isolation structure 602 and oppose the polysilicon films 612 with the thin thermal oxide films 614 intervened.

As shown in FIG. 30, the surfaces of the field shield element isolation structures 602 and the floating gate electrodes 603 are planarized. That is, the upper surfaces of the field shield element isolation structures 602 and the upper surfaces of the floating gate electrodes 603 are formed on almost the same plane (planarized surface 616).

The dielectric film 604 is formed of an ONO film which has a three-layer structure of an oxide film, a nitride film, and an oxide film. The control gate electrode 605 is formed of, e.g., an n-type polysilicon film. The dielectric films 604 and the control gate electrodes 605 are formed into almost the same strip shape on the planarized surface 616 including the floating gate electrodes 603 in the row direction. Each floating gate electrode 603 and the corresponding control gate electrode 605 are capacitively coupled through the dielectric film 604.

A cap insulating film 618 is formed on the control gate electrode 605. Side wall protective films 619 are formed on the side surfaces of the floating gate electrode 603, the dielectric film 604, and the control gate electrode 605. The floating gate electrode 603, the dielectric film 604, and the control gate electrode 605 are surrounded by the tunnel oxide film 615, the cap insulating film 618, and the side wall protective films 619.

As shown in FIG. 28, the leading-out electrode 609 is filled between the floating gate electrodes 603, the dielectric films 604, and the control gate electrodes 605 with the thermal oxide film 619 intervened in the element formation region. In addition, as shown in FIG. 29, the extraction electrode 609 is filled between the field shield element isolation structures 602 with the thermal oxide film 614 intervened. Each extraction electrode 609 is electrically connected to one impurity diffusion layer 606 in the lower layer.

An insulating interlayer 617 is formed on the entire surface of the silicon semiconductor substrate 601 including the field shield element isolation structures 602 and the upper surfaces of the control gate electrodes 605. Contact holes 620 are formed in the insulating interlayer 617 to expose a part of the surface of each leading-out electrode 609 connected to one impurity diffusion layer 606 serving as a drain diffusion layer.

An underlayer 621 having a two-layer structure of TiN/Ti is formed on the insulating interlayer 617 including the contact holes 620. The strip-shaped bit lines 610 consisting of an aluminum alloy are filled in the contact holes 620 and extend over the insulating interlayer 617 along the underlayer 621.

The write/erase operation of this EEPROM will be described below.

The capacitances of the tunnel oxide film 615, the dielectric film 604, and the field shield element isolation structure 602 are represented by $C_1$, $C_2$, and $C_3$ ($C_t=C_1+C_2+C_3$), respectively. The potentials of the floating gate electrode 603, the control gate electrode 605, and the polysilicon film 612 of the field shield element isolation structure 602 are represented by Vfg, Vcg, and Vfs, respectively. When charges in the floating gate electrode 603 are represented by Q, the following relation holds:

$$Ct \cdot Vfg = C_2 \cdot Vcg + 2C_3 \cdot Vfs + Q \qquad (1)$$

The write operation will be described first. In a write mode, the floating gate electrode 603 is discharged to lower the threshold value. Normally, the polysilicon film 612 of the field shield element isolation structure 602 is used as a shield plate electrode fixed at 0 (V). In the write mode, however, the polysilicon film 612 is used as a write electrode. More specifically, Vcg may be fixed at 0 (V), and Vfs may be set at a high negative potential. At this time, the following relation holds on the basis of equation (1):

$$(C_1+C_2+C_3) \cdot Vfg = 2C_3 \cdot Vfs + Q$$

therefore $$Vfg - Vfs = -(C_1 + C_2) \cdot Vfg / C_3 \qquad (2)$$
$$= -5Vfg + (Ct/C_3) \cdot (Q/Ct)$$

To generate a Fowler-Nordheim tunnel current, a voltage of at least 10 (MV/cm) must be applied to the thermal oxide film 614 of the field shield element isolation structure 602. When the thermal oxide film 614 is about 20 (nm) thick, $$Vfg-Vfs \geq -20 \text{ (V)}$$

Therefore, by setting Vfs at a negative potential of −20 (V) or less, charges are removed from the floating gate electrode 603.

The erase operation will be described next. In an erase mode, the floating gate electrode 603 is charged to raise the threshold value. In a normal erase mode, as the first erase method, Vcg is set at a high positive potential (about 13 (V)), and Vfs is fixed at 0 (V). On the basis of equation (1), the following relation holds:

$$Ct \cdot Vfg = 2C_3 \cdot Vfs + Q \quad (3)$$

Charges corresponding to $Q \approx -3.64$ Ct are stored in the floating gate electrode 603.

As the second erase method, by setting Vcg at a high potential (about 13 V), and Vfs at a high negative potential (−20 (V)), charges are stored in the floating gate electrode 603 through the thermal oxide film 614.

A method of manufacturing the EEPROM having the above structure will be described below. FIGS. 31A, 32A, 33A, 34A, 35A, and 36A are plan views showing steps in manufacturing the EEPROM. FIGS. 31B, 32B, 33B, 34B, 35B, and 36B are sectional views taken along lines A–A' in these plan views, respectively, and FIGS. 31C, 32C, 33C, 34C, 35C, and 36C are sectional views taken along lines B–B' in these plan views, respectively. The same reference numerals as in FIGS. 27 to 30 denote the same members throughout these drawings, and a detailed description thereof will be omitted.

Figure 31A:
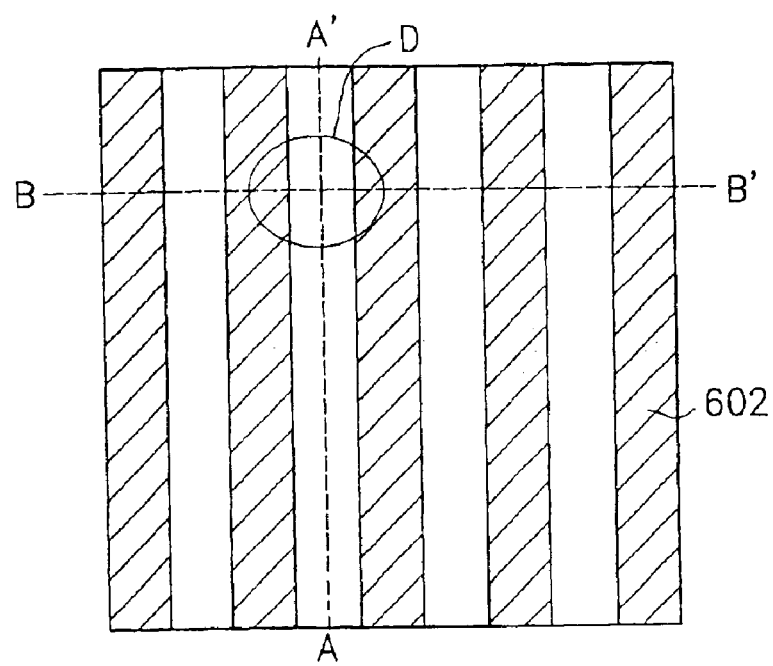
FIGS. 31A to 31C are schematic plan and sectional views showing a step in manufacturing the EEPROM according to the ninth embodiment.
Figure 31B:
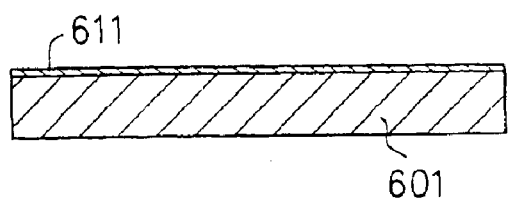
Figure 31C:
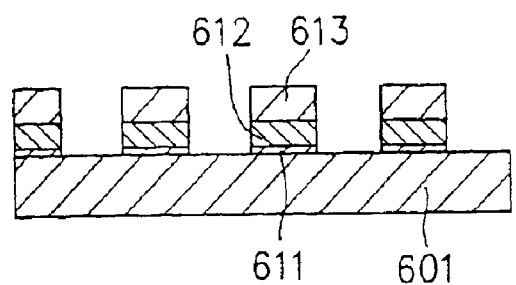

As shown in FIGS. 31A to 31C, the surface of the p-type silicon semiconductor substrate 601 is thermally oxidized to form the thermal oxide film 611. The polysilicon film 612 and the cap insulating film 613 are sequentially deposited on the thermal oxide film 611 by CVD. The cap insulating film 613, the polysilicon film 612, and the thermal oxide film 611 are subjected to photolithography and then to dry etching to leave the cap insulating films 613, the polysilicon films 612, and the thermal oxide film 611 into a strip shape such that they are coupled at almost the center.

Figure 32A:
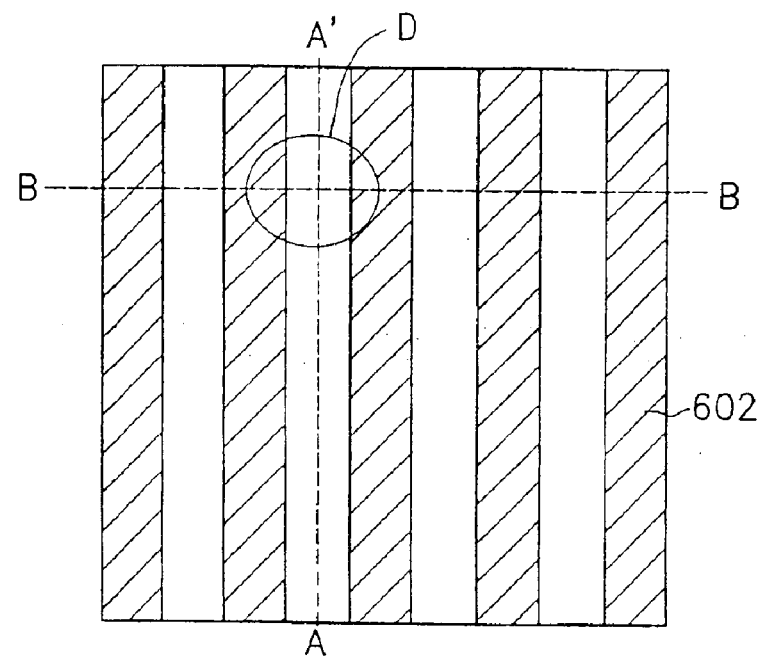
FIGS. 32A to 32C are schematic plan and sectional views showing a step subsequent to the step in manufacturing the EEPROM according to the ninth embodiment in FIGS. 31A to 31C.
Figure 32B:
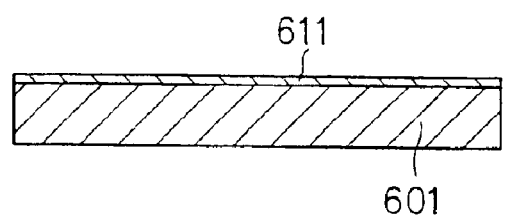
Figure 32C:
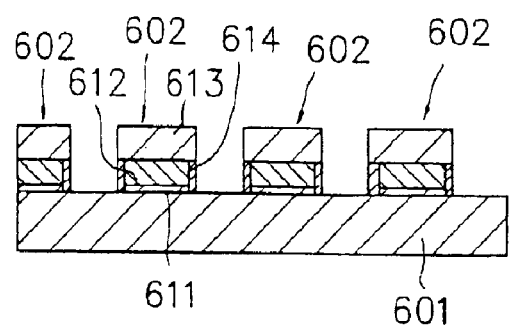

As shown in FIGS. 32A to 32C, the side surfaces of the polysilicon film 612 are thermally oxidized to form the thermal oxide films 614, thereby completing the field shield element isolation structure 602 surrounded by the thermal oxide film 611, the cap insulating film 613, and the thermal oxide films 614 to demarcate the element active region. Instead of forming the thermal oxide film 614, a silicon oxide film may be deposited on the entire surface of the thermal oxide film 611 to cover the polysilicon film 612 and the cap insulating film 613. By anisotropically etching the entire surfaces of the silicon oxide film and the thermal oxide film 611, the silicon oxide film may be left on the side surfaces of the polysilicon film 612 and the cap insulating film 613.

Figure 33A:
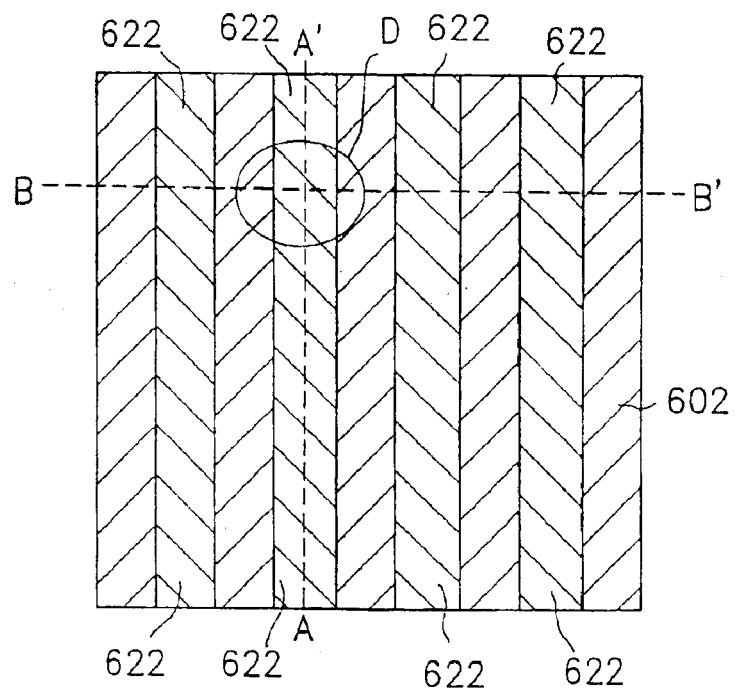
FIGS. 33A to 33C are schematic plan and sectional views showing a step subsequent to the step in manufacturing the EEPROM according to the ninth embodiment in FIGS. 32A to 32C.
Figure 33B:
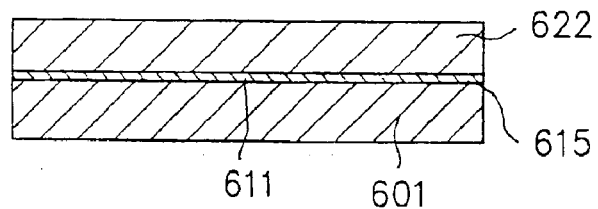
Figure 33C:
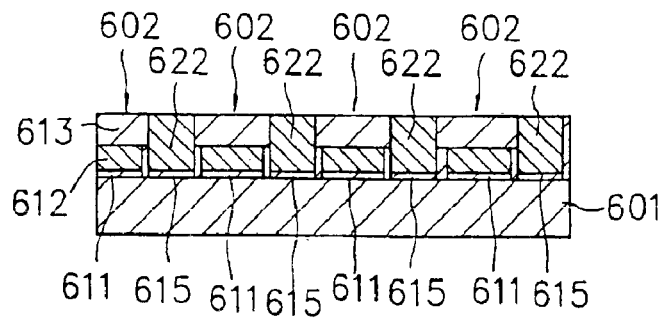

As shown in FIGS. 33A to 33C, the surfaces of the silicon semiconductor substrate 601 between the field shield element isolation structures 602 are thermally oxidized to form the tunnel oxide films 615. A polysilicon film 622 is deposited on the entire surface including the field shield element isolation structures 602 to fill between the field shield element isolation structures 602. The polysilicon film 622 is surface-polished by, e.g., chemical mechanical polishing (CMP) using the cap insulating films 613 of the field shield element isolation structures 602 as stoppers. At this time, the polysilicon film 622 is patterned to fill between the adjacent field shield element isolation structures 602 and to be separated by the field shield element isolation structures 602. The polysilicon film 622 becomes the floating gate electrodes 603 later.

Figure 34A:
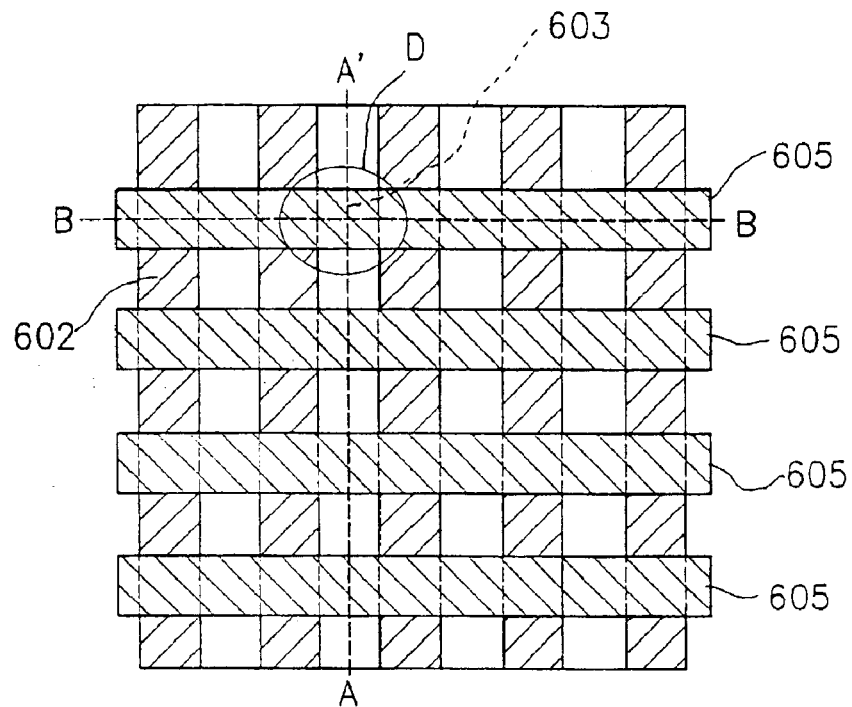
FIGS. 34A to 34C are schematic plan and sectional views showing a step subsequent to the step in manufacturing the EEPROM according to the ninth embodiment in FIGS. 33A to 33C.
Figure 34B:
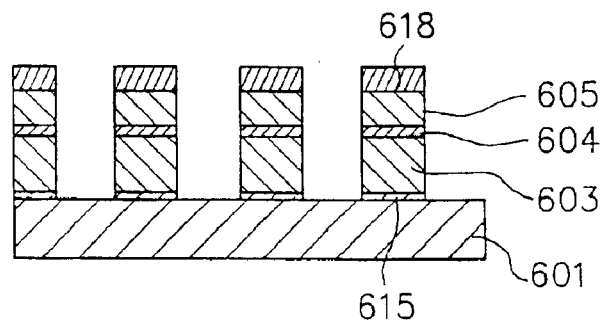
Figure 34C:
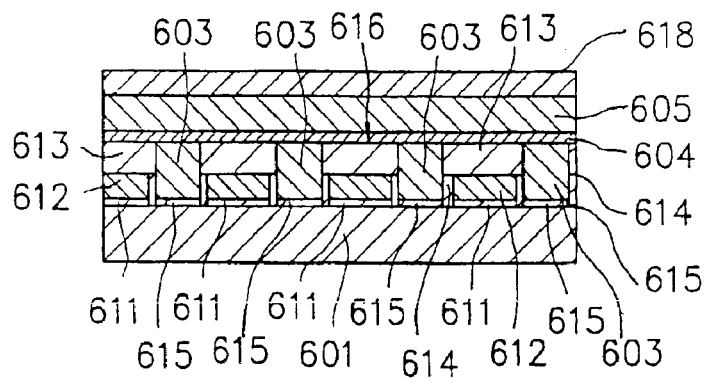

As shown in FIGS. 34A to 34C, an ONO film having a three-layer structure of an oxide film, a nitride film, and an oxide film, a polysilicon film, and a silicon oxide film are sequentially deposited on the field shield element isolation structures 602, the cap insulating films 613, and the polysilicon films 622, i.e., on the planarized surface 616. Before formation of the silicon oxide film, a refractory metal may be deposited on the polysilicon film by sputtering to form a silicide layer.

The silicon oxide film, the polysilicon film, the ONO film, the polysilicon film 622, and the tunnel oxide film 615, are subjected to photolithography and then to dry etching. The silicon oxide film, the polysilicon film, and the ONO film are patterned into a strip shape to be almost perpendicular to the field shield element isolation structures 602, thereby forming the dielectric films 604, the control gate electrodes 605, and the cap insulating films 618 of the control gate electrodes 605. At the same time, the polysilicon films 622 and the tunnel oxide films 615 between the adjacent control gate electrodes 605 are removed to form the floating gate electrodes 603 which are independently capacitively coupled to the control gate electrodes 605 through the dielectric films 604 in the element formation regions. When the silicide layer is formed, the control gate electrode 605 is formed as a polycide film.

Figure 35A:
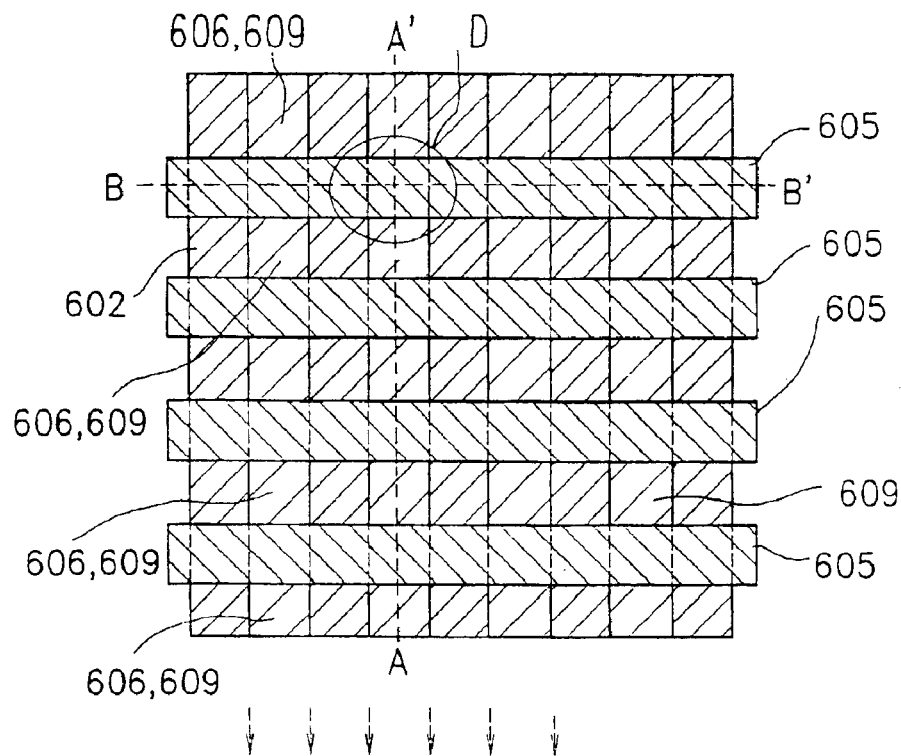
FIGS. 35A to 35C are schematic plan and sectional views showing a step subsequent to the step in manufacturing the EEPROM according to the ninth embodiment in FIGS. 34A to 34C.
Figure 35B:
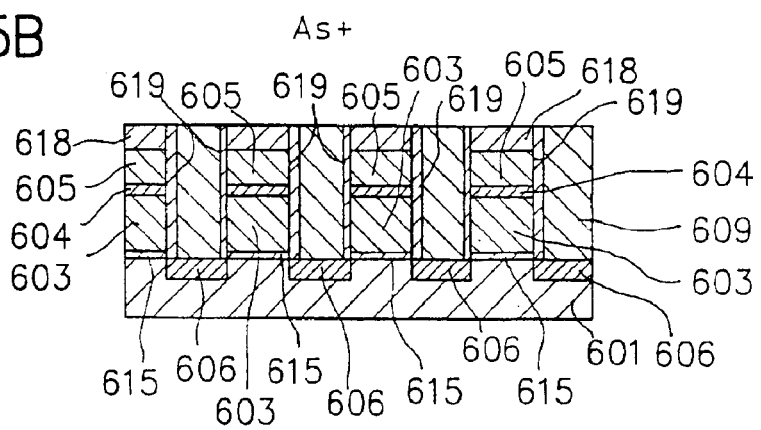
Figure 35C:
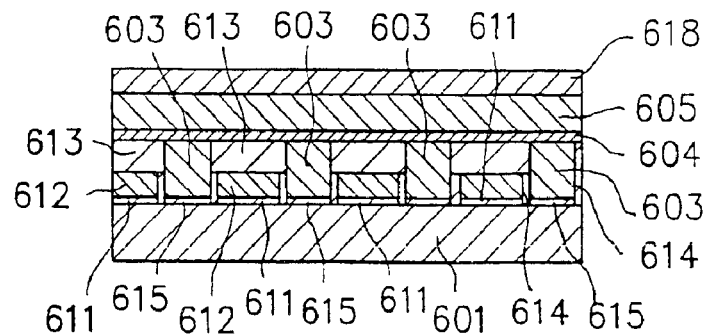

As shown in FIGS. 35A to 35C, a silicon oxide film is deposited on the entire surface of the silicon semiconductor substrate 601 including the cap insulating films 618. The entire surface of the silicon oxide film is anisotropically etched to leave the silicon oxide film on the side surfaces of the tunnel oxide films 615, the floating gate electrodes 603, the dielectric films 604, the control gate electrodes 605, and the cap insulating films 618, thereby forming the side wall protective films 619.

After an undoped polysilicon film is deposited on the entire surface by CVD, the polysilicon film is surface-polished by CMP to expose the surfaces of the control gate electrodes 605. At this time, the independent leading-out electrodes 609 which are filled between the adjacent side wall protective films 619 and the cap insulating films 618 on the silicon semiconductor substrate 601 in the element formation regions are formed.

Arsenic (As) is ion-implanted into the silicon semiconductor substrate 601 through the extraction electrodes 609 at an acceleration energy of 75 keV and a dose of $10^{12}$ cm$^{-2}$. The silicon semiconductor substrate 601 is annealed at 900° C. to diffuse the arsenic in the surface regions of the silicon semiconductor substrate 601, thereby forming the impurity diffusion layers 606 serving as the source/drain diffusion layers.

Figure 36A:
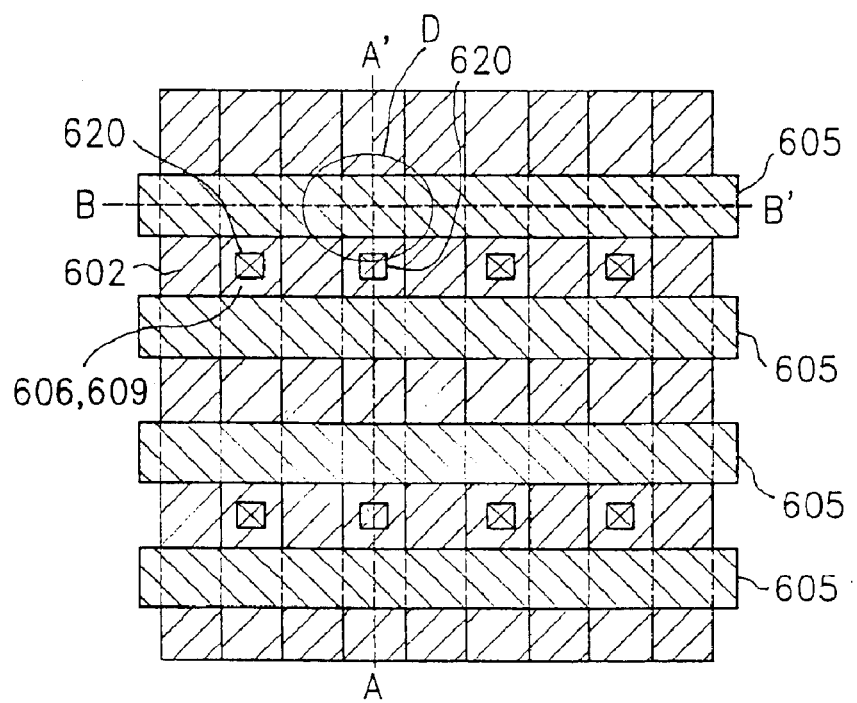
FIGS. 36A to 36C are schematic plan and sectional views showing a step subsequent to the step in manufacturing the EEPROM according to the ninth embodiment in FIGS. 35A to 35C.
Figure 36B:
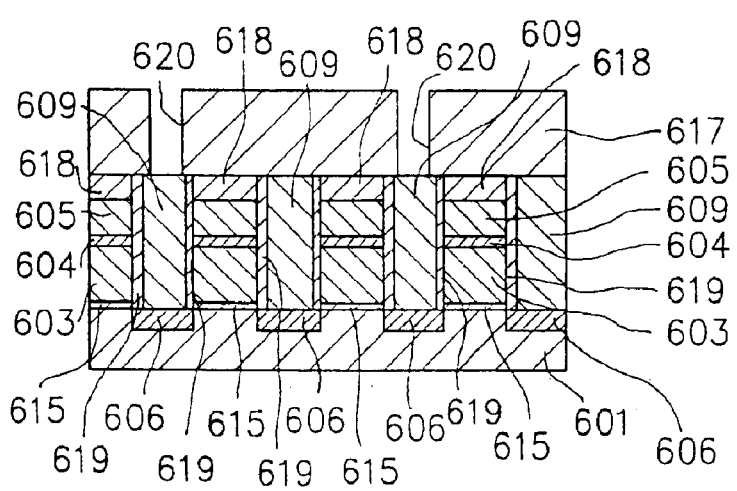
Figure 36C:
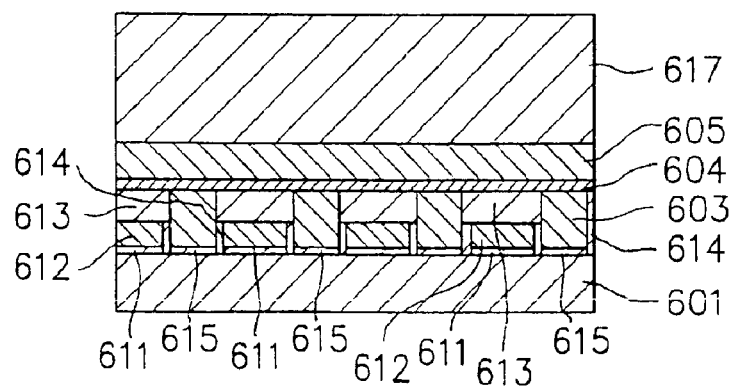

As shown in FIGS. 36A to 36C, the insulating interlayer 617 is deposited on the entire surface by CVD. The contact holes 620 are formed to expose part of the surfaces of the extraction electrodes 609 connected to the impurity diffusion layers 606 serving as drain diffusion layers.

The underlayer 621 having a two-layer structure of TiN/Ti is formed on the surface of the insulating interlayer 617 including the inner walls of the contact holes 620 by sputtering. Subsequently, an aluminum alloy film is formed by sputtering and subjected to photolithography and then to dry-etching. With this process, the bit lines 610 which are filled in the contact holes 620 and extend along the insulating interlayer 617 on the underlayer 621 are formed.

Thereafter, various upper wiring layers and via holes are formed, thus completing the EEPROM.

As described above, in the semiconductor device according the ninth embodiment and the manufacturing method therefor, the floating gate electrode 603 filled between the adjacent field shield element isolation structures 602 opposes the polysilicon film 612 buried in the field shield element isolation structure 602 and serving as a shield plate electrode through the thermal oxide film 614 as the side wall protective film of the polysilicon film 612. In addition, the control gate electrode 605 is formed on floating gate electrode 603 with the dielectric film 604 intervened. When the polysilicon film 612 is to serve as a shield plate electrode, the potential of the polysilicon film 612 is set at 0 V, and the silicon semiconductor substrate 601 at a portion corresponding to the field shield element isolation structure 602 is fixed at 0 (V), so that element isolation is attained. However, a voltage of 0 V or less can be applied to the polysilicon film 612. When a predetermined negative voltage is applied to the polysilicon film 612 to make a tunnel current flow between the polysilicon film 612 and the floating gate electrode 603 through the thermal oxide film 614, the polysilicon film 612 can be used not only as a shield plate electrode but also as a write/erase electrode.

In addition, since the deposited polysilicon film 622 is surface-polished using the thermal oxide films 611 of the field shield element isolation structures 602 as stoppers, e.g., the floating gate electrodes 603 which are properly separated by the thermal oxide films 611 of the field shield element isolation structures 602 are formed in a self-aligned manner.

-10th Embodiment-

The 10th embodiment will be described first. In the 10th embodiment, an example in which the present invention is applied to a MOS transistor will be described. In the 10th embodiment, the structure of the MOS transistor and a manufacturing method therefor will be described together. FIGS. 37A to 37J are schematic sectional views showing steps in manufacturing the MOS transistor.

An element isolation structure is formed in an element isolation region on a p-type silicon semiconductor substrate by a so-called field shield element isolation method, thereby demarcating an element formation region.

Figure 37A:
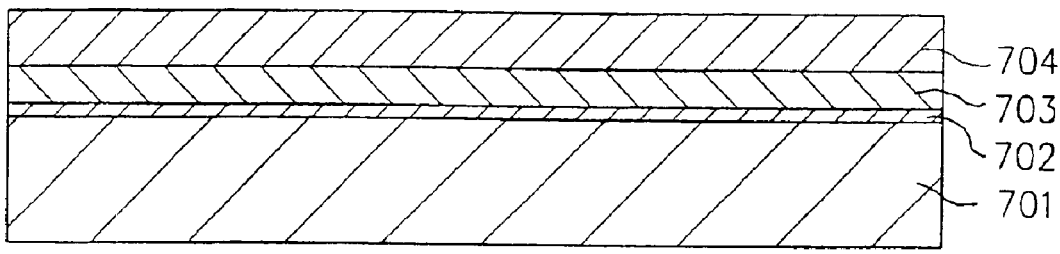

More specifically, as shown in FIG. 37A, a silicon oxide film 702, a polysilicon film 703, and a silicon oxide film 704 are formed on a p-type silicon semiconductor substrate 701 to thicknesses of, e.g., about 50 nm, 200 nm, and 200 nm, respectively. A silicon nitride film having a thickness of about 200 nm may be formed on the entire surface of the silicon oxide film 704 by CVD.

Figure 37B:
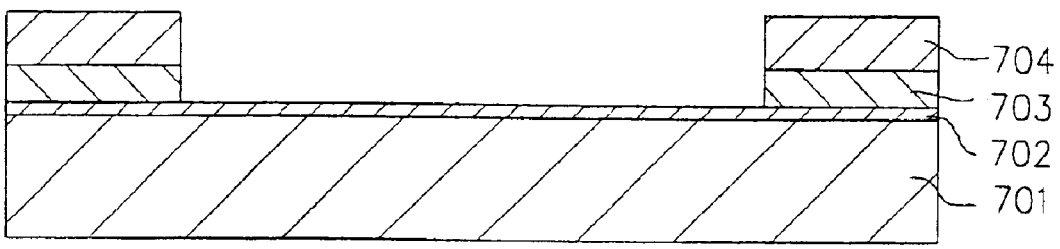

As shown in FIG. 37B, the polysilicon film 703 and the silicon oxide film 704 (and the silicon nitride film) are patterned by photolithography and dry etching to selectively remove these films, thereby demarcating an element formation region 721.

Figure 37C:
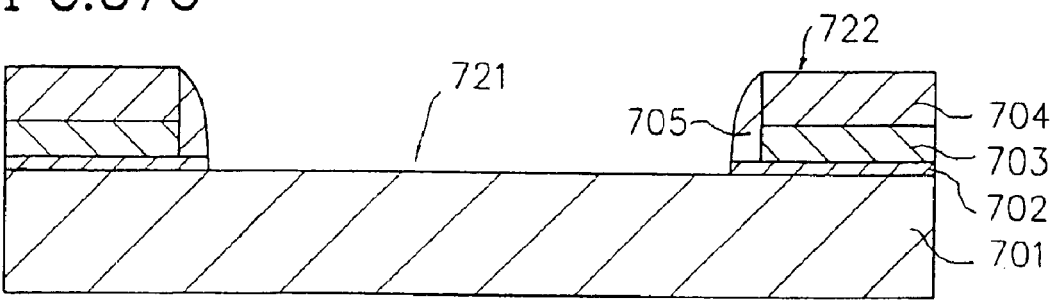

As shown in FIG. 37C, a silicon oxide film is formed on the entire surface to cover the silicon oxide film 702, and the left polysilicon film 703 and silicon oxide film 704 (and silicon nitride film). Thereafter, the entire surface of a silicon oxide film 723 is anisotropically dry-etched by, e.g., RIE to leave the silicon oxide only on the side walls of the silicon oxide film 702, the polysilicon film 703, and the silicon oxide film 704 (and the silicon nitride film), thereby forming side wall protective films 705. With these processes, field shield element isolation structures 722 each having a shield plate electrode consisting of a polysilicon film surrounded by the silicon oxide film are formed in field regions.

Figure 37D:
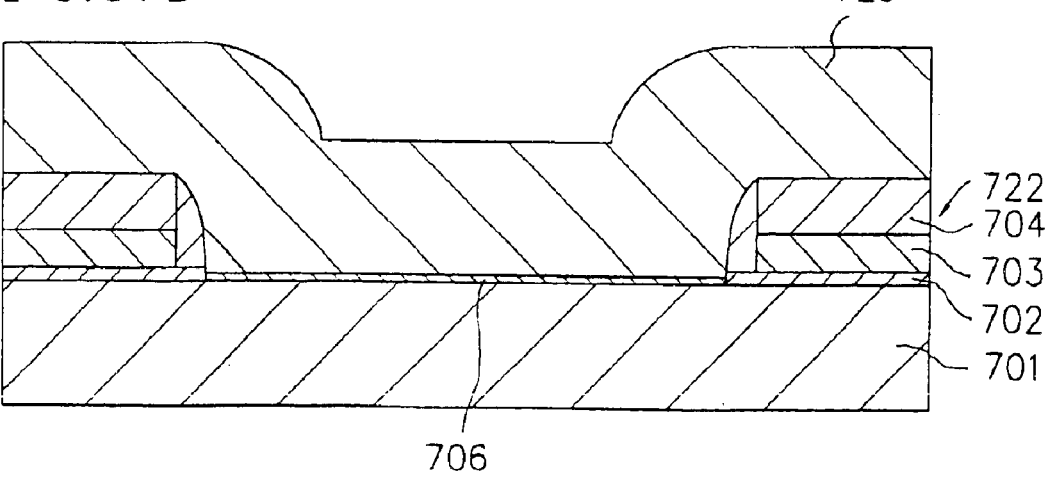

As shown in FIG. 37D, the surface of the silicon semiconductor substrate 701 on each of the element formation regions 721 separated from each other by the field shield element isolation structures 722 and demarcated relative to the field shield element isolation structures 722 is thermally oxidized to form a gate oxide film 706 having a thickness of about 15 nm. A polysilicon film 723 is formed on the entire surface including the field shield element isolation structures 722 by CVD. The polysilicon film 723 must be deposited to a thickness larger than the that of the field shield element isolation structure 722 such that the field shield element isolation structures 722 are buried in the polysilicon film 723.

Figure 37E:
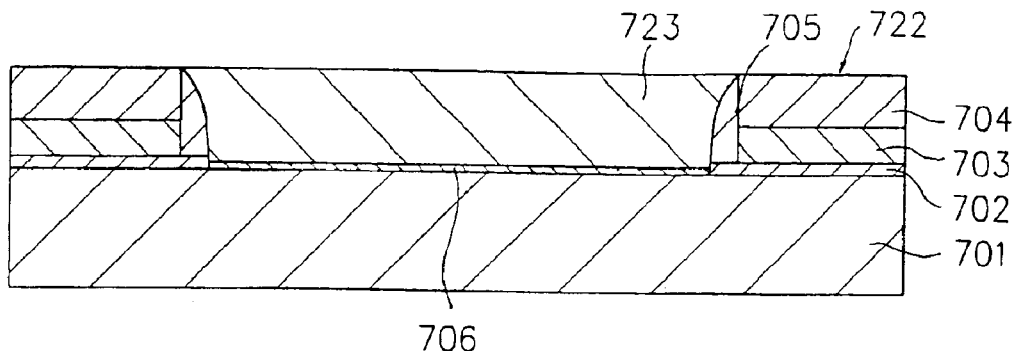

As shown in FIG. 37E, the polysilicon film 723 is subjected to surface polishing, e.g., chemical mechanical polishing (CMP) to planarize the surface. In this case, as illustrated, planarization is performed by polishing the polysilicon film 723 using the surfaces of the field shield element isolation structures 722 as stoppers until the surfaces are exposed. CMP is a polishing method using a slurry of a predetermined chemical fluid and abrasive. As long as the initial thickness of the film to be polished is larger than the step, CMP allows highly precise planarization by canceling even a step on the millimeter order to suppress, e.g., the surface step to about 0.05 $\mu$m.

Figure 37F:
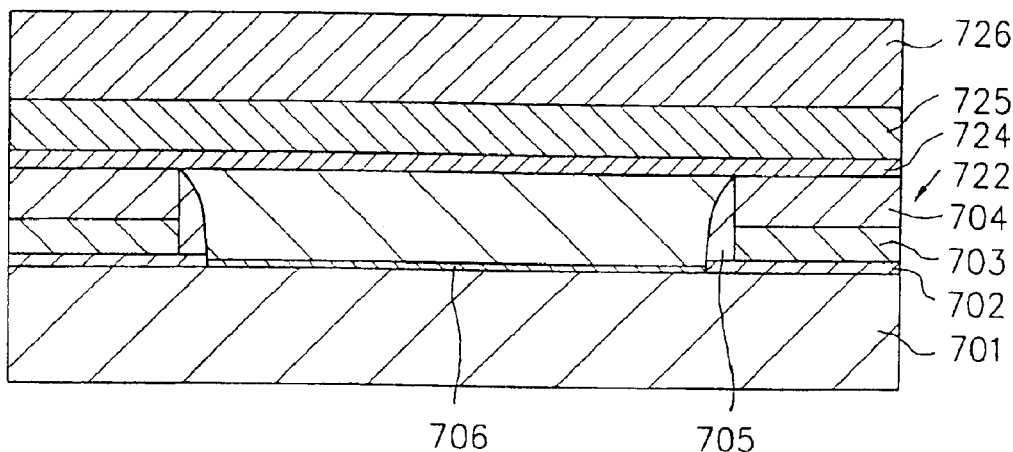
Figure 37G:
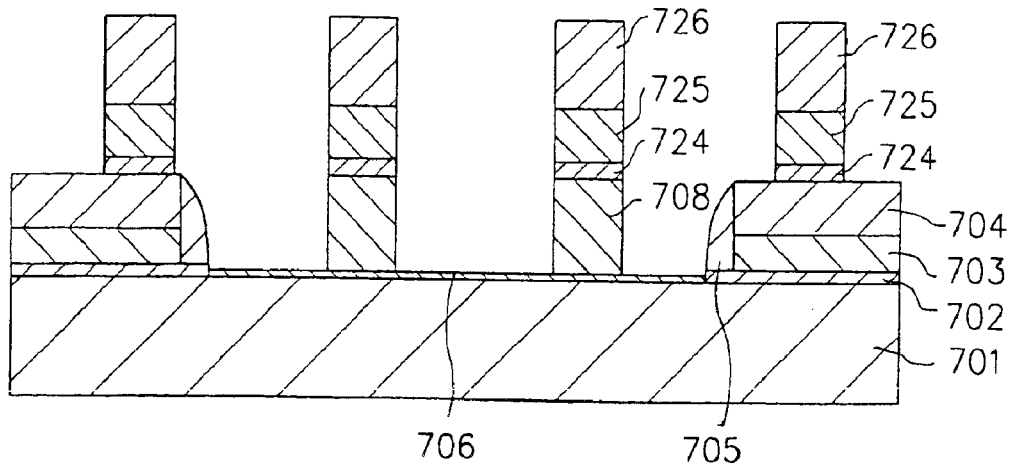

As shown in FIG. 37F, a titanium nitride film (TiN film) 724 serving as an underlayer is formed on the surfaces of the planarized polysilicon film 723 and the field shield element isolation structures 722 to a thickness of about 20 nm by sputtering. A silicide film of a refractory metal, e.g., a tungsten silicide film (WSi film) 725 is formed on the TiN film 724 to a thickness of about 150 nm by sputtering. In addition, a silicon oxide film 726 is formed on the WSi film 725 to a thickness of about 300 nm by CVD. Since the surfaces of the field shield element isolation structures 722 (silicon oxide films or silicon nitride films) have poor adhesion properties to the WSi film 725, the WSi film 725 cannot be directly deposited on the field shield element isolation structures 722. In the 10th embodiment, the TiN film 724 is formed between the surfaces of the field shield element isolation structure 722 and the WSi film 725. With this arrangement, the WSi film 725 can be formed with good adhesion properties As shown in FIG. 37G, the polysilicon film 723, the TiN film 724, the WSi film 725, and the silicon oxide film 726 are patterned by photolithography and dry etching to form gate electrodes (gate wiring layers) 708 each having a predetermined shape on the element formation region 721 and field shield element isolation structures 722 such that the upper surfaces of the gate electrodes 708 are on almost the same plane, i.e., the upper surfaces are almost flush with each other.

As shown in FIG. 37H, a silicon oxide film is deposited on the entire surface by CVD to cover the gate electrodes (gate wiring layers) 708 on the element formation region 721 and field shield element isolation structures 722. Next, the entire surface of the silicon oxide film is anisotropically dry-etched by, e.g., RIE to leave the silicon oxide film only on the side walls of the gate electrodes 708, thereby forming side wall protective films 709.

An n-type impurity such as phosphorus (P) or arsenic (As) is ion-implanted into the element formation region 721 using the silicon oxide film 726 and the side wall protective films 709 as masks to form a pair of impurity diffusion layers serving as the source and drain. Insulating interlayers, various metal wiring layers, and the like are formed, thereby completing the MOS transistor.

After the side wall protective films 709 are formed, pad polysilicon films serving as the source and drain may be formed, as in the second embodiment. In this case, even by micropatterning the gate electrodes (gate wiring layers) 708 to the exposure limit in photolithography, the pad polysilicon films can be properly formed.

Figure 38A:
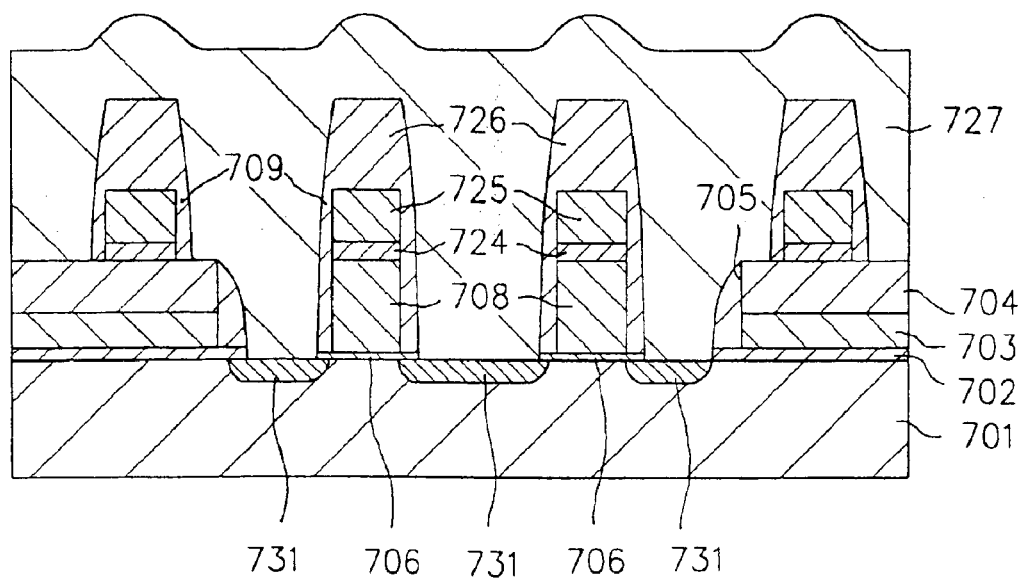
FIGS. 38A and 38B are schematic sectional views showing steps in manufacturing the MOS transistor according to the 10th embodiment.

More specifically, after the gate oxide film 706 between the gate electrodes 708 in the element formation region 721 is removed in formation of the side wall protective films 709, a polysilicon film 727 doped with phosphorus (P) is deposited on the entire surface including the field shield element isolation structures 722 by CVD, as shown in FIG. 38A. At this time, the phosphorus (P) in the polysilicon film 727 is diffused into the element formation region 721 of the p-type silicon semiconductor substrate 701 on both sides of the gate electrodes 708., so that each diffusion layer 731 serving as the source/drain of the MOS transistor is formed.

Figure 38B:
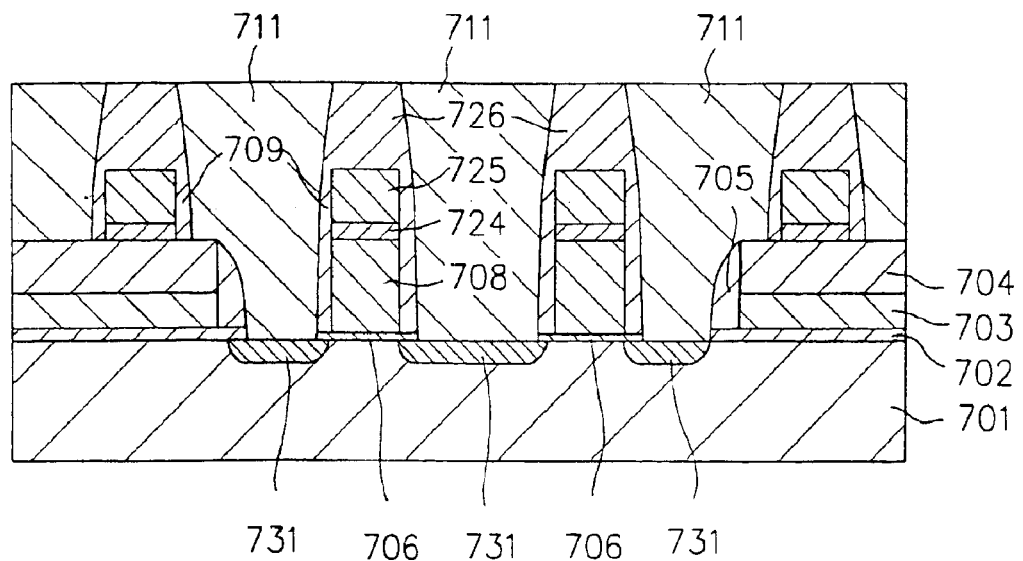

As shown in FIG. 38B, using the silicon oxide films 726 serving as cap insulating films of the field shield element isolation structures 722 as stoppers, the polysilicon film 727 is surface-polished by, e.g., chemical mechanical polishing (CMP) until the silicon oxide films 726 are exposed, thereby planarizing the surface.

Photolithography and dry etching are performed to separate the planarized polysilicon film 727 over the field shield element isolation structures 722 in correspondence with the diffusion layers 731. The separation width of the polysilicon film 727 may be larger than the exposure limit in photolithography. At this time, the polysilicon film 727 is separated by the silicon oxide film 704 in units of diffusion layers 731 so that pad polysilicon films 711 are formed. Each pad polysilicon film 711 is electrically connected to only one diffusion layer 731.

Although not illustrated, insulating interlayers, contact holes, and metal wiring layers are formed subsequently, thereby completing the MOS transistor.

As described above, in the manufacturing process of the semiconductor device according to the tenth embodiment, the WSi film 725 is formed with intermediary of the TiN film 724 on the surfaces of the planarized field shield element isolation structure 722 and the polysilicon film 723. The WSi film 725 can be formed with good adhesion properties. In addition, impurity diffusion is suppressed by the TiN film 724.

The gate electrodes (gate wiring layers) 708 are formed on the element formation region 721 and the field shield element isolation structures 722, to have the TiN film 724 and the WSi film 725 left thereon with their upper surfaces being almost flush with each other. The polysilicon film is then formed and subjected to CMP polishing process to form the pad polysilicon film 711 electrically connected to the diffusion layers 731 in the element formation region 721 in self-alignment manner with respect to the gate electrodes (gate wiring layers) 708. Therefore the width of the gate electrodes (gate wiring layers) 708 can be reduced to exposure limit of, e.g. photolithography independently of the designed size of the pad polysilicon film 711, thus allowing micropatterning and high integration of the gate electrodes (gate wiring layers) 708.

What is claimed is:

1. A semiconductor device, comprising:
   a first step structure portion formed at a predetermined level from a surface of a reference layer;
   second step structure portions respectively formed on said first step structure portion and said reference layer and functioning as non-LOCOS insulating device isolation blocks for demarcating an element active region on said reference layer; and
   a first conductive film patterned on said element active region across at least said second step structure portion on said reference layer,
   wherein an upper surface of said first conductive film is planarized such that said upper surface of said first conductive film and an upper surface of said second step structure portion formed on said first step structure portion are formed at substantially the same level.

2. A device according to claim 1, wherein said upper surface of said first conductive film and said upper surfaces of said second step structure portions are planarized by chemical mechanical polishing.

3. A device according to claim 1, wherein said reference layer is a semiconductor substrate.

4. A device according to claim 1, wherein said first step structure portion is a first insulating film formed on a scribing line region of a semiconductor substrate.

5. A device according to claim 1, wherein said non-LOCOS insulating device isolation block is a field shield element isolation structure having a shield plate electrode buried in an insulating layer.

6. A device according to claim 1, wherein said first conductive film is formed of a polysilicon film, and a silicide layer of a refractory metal is formed on said first conductive film.

7. A device according to claim 1, wherein said first conductive film is a gate electrode.

8. A device according to claim 1, wherein said non-LOCOS insulating device isolation block is a trench type element isolation structure.

9. A device according to claim 1, wherein said reference layer is an insulating interlayer stacked on a semiconductor substrate, first wiring layers are formed in said first and second step structure portions, and said first conductive film functions as a second wiring layer.

10. A device according to claim 9, further comprising another insulating interlayer having a contact hole and formed under said insulating interlayer, and a memory capacitor patterned on said another insulating interlayer, in which a storage node electrode, a dielectric film, and a cell plate electrode having planarized surfaces are sequentially stacked.

11. A device according to claim 1, wherein said reference layer is a semiconductor substrate in which a groove portion is formed, a portion of said semiconductor substrate surrounding the groove portion serves as said first step structure portion, and an element region is formed in the groove portion.

12. A device according to claim 11, wherein said first step structure portion is an insulating film formed on a scribing line region of said semiconductor substrate.

13. A device according to claim 11, wherein said first conductive film is formed of a polysilicon film, and a silicide layer of a refractory metal is formed on said first conductive film.

14. A device according to claim 11, wherein said first conductive film is a gate electrode.

15. A device according to claim 11, wherein said second step structure portion is a non-LOCOS insulating device isolation block for demarcating said element active region on an element region.

16. A device according to claim 15, wherein said non-LOCOS insulating device isolation block is a field shield element isolation structure having a shield plate electrode buried in an insulating layer.

* * * * *